(12) United States Patent
Kim et al.

(10) Patent No.: US 8,759,224 B2
(45) Date of Patent: Jun. 24, 2014

(54) METHOD OF FORMING A PATTERN STRUCTURE FOR A SEMICONDUCTOR DEVICE

(75) Inventors: Jong-Hyuk Kim, Osan-si (KR);
Keon-Soo Kim, Hwaseong-si (KR);
Kwang-Shik Shin, Hwaseong-si (KR);
Hyun-Chul Back, Suwon-si (KR);
Seong-Soon Cho, Suwon-si (KR);
Young-Bae Yoon, Yongin-si (KR);
Jung-Hwan Park, Gyeongju-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 484 days.

(21) Appl. No.: 13/212,349

(22) Filed: Aug. 18, 2011

(65) Prior Publication Data
US 2012/0045901 A1 Feb. 23, 2012

(30) Foreign Application Priority Data

Aug. 19, 2010 (KR) ........................ 10-2010-0080201

(51) Int. Cl.
*H01L 21/311* (2006.01)
(52) U.S. Cl.
USPC .................................. 438/703; 257/E21.257
(58) Field of Classification Search
CPC ............ H01L 21/0337; H01L 21/0338; H01L 21/3086; H01L 21/3088
USPC .................................. 438/703; 257/E21.257
See application file for complete search history.

(56) References Cited

U.S. PATENT DOCUMENTS

| | | | | |
|---|---|---|---|---|
| 7,718,540 | B2 * | 5/2010 | Tran et al. | 438/717 |
| 7,994,583 | B2 * | 8/2011 | Inaba | 257/369 |
| 7,998,874 | B2 * | 8/2011 | Lee et al. | 438/725 |
| 8,003,310 | B2 * | 8/2011 | Sandhu et al. | 430/323 |
| 8,043,915 | B2 * | 10/2011 | Tran | 438/267 |
| 8,048,812 | B2 * | 11/2011 | Tran et al. | 438/717 |
| 2006/0046201 | A1 * | 3/2006 | Sandhu et al. | 430/314 |
| 2006/0046422 | A1 * | 3/2006 | Tran et al. | 438/401 |
| 2007/0210449 | A1 * | 9/2007 | Caspary et al. | 257/734 |
| 2007/0215874 | A1 * | 9/2007 | Furukawa et al. | 257/48 |

FOREIGN PATENT DOCUMENTS

| | | |
|---|---|---|
| JP | 2004-319945 | 11/2004 |
| KR | 1020060113162 | 11/2006 |
| KR | 1020100006012 | 1/2010 |

* cited by examiner

*Primary Examiner* — Jarrett Stark
(74) *Attorney, Agent, or Firm* — F. Chau & Associates, LLC

(57) ABSTRACT

In a method of forming a pattern structure, a cut-off portion of the node-separated line of a semiconductor device is formed by a double patterning process by using a connection portion of the sacrificial mask pattern and the mask pattern to thereby improve alignment margin. The alignment margin between the mask pattern and the sacrificial mask pattern is increased to an amount of the length of the connection portion of the sacrificial mask pattern. The lines adjacent to the node-separated line include a protrusion portion protruding toward the cut-off portion of the separated line.

20 Claims, 47 Drawing Sheets

106    110

102a    112a 112b
         ⎵⎵⎵
          112

114c 114b 114a 114a 114b 102a

| 204b | 204a | 208 |
| SECOND REGION | FIRST REGION | SECOND REGION |

METHOD OF FORMING A PATTERN STRUCTURE FOR A SEMICONDUCTOR DEVICE

CROSS-REFERENCE TO RELATED APPLICATION

This application claims priority to and the benefit of Korean Patent Application No. 10-2010-0080201 filed on Aug. 19, 2010, in the Korean Intellectual Property Office, the entire content of which is incorporated by reference herein.

BACKGROUND

1. Field

The present disclosure relates to a method of forming a pattern structure for a semiconductor device, and more particularly, to a method of forming a line-shaped pattern structure having a node separation area for a semiconductor device.

2. Discussion of the Related Art

As the degree of integration of semiconductor devices increases, conductive structures and wiring structures for the semiconductor device tend to be downsized and become denser and denser. To address such semiconductor device trends, intensive research has been conducted to develop fine pattern structures for the semiconductor devices. In this regard, a double patterning technology has been suggested for forming repeated lines having line widths less than a marginal resolution of the conventional photolithography process. For example, such double patterning technology can include double exposures where two separate exposures of the same photoresist layers use two different photomasks. According to the double patterning technology, a uniform and simple line-shaped pattern having a uniform line width and gap distance may be repeatedly formed on a substrate with relatively high quality.

However, it can be difficult to form a non-uniform or a complicated line-shaped pattern using double-patterning technology. For example, when the line-shaped pattern is cut off or broken such that the line-shaped pattern becomes discontinuous in a longitudinal direction, much like a node separation area in a cell region, an additional mask pattern is needed for forming the cut-off portion of the line-shaped pattern. Since the width and gap distance of the line-shaped pattern is very small and fine the size of the cut-off portion of the pattern also becomes very small. As such, the mask pattern becomes very hard to be accurately aligned with the cut-off portion of the line-shaped pattern. When the mask pattern is not accurately aligned with the cut-off portion, an unexpected portion of the line-shaped pattern is cut off such that the cut-off portion is positioned at an undesired position of the pattern. For example, the node separation of the line may not be arranged at a correct alignment position in a cell region of the substrate.

Accordingly, a need exists for a patterning process for forming a line-shaped pattern in which the cut-off portion can be accurately positioned.

SUMMARY

Exemplary embodiments of the present inventive concept provide a method of forming a pattern structure for a semiconductor device having a node-separated line with an improved alignment margin.

According to an exemplary embodiment, there is provided a method of forming a pattern structure for a semiconductor device. A sacrificial mask pattern is formed on a target layer that is formed on a substrate. The sacrificial mask pattern may include a first line-shaped pattern extending in a first direction, a second pattern having a sacrificial pattern body spaced apart from and parallel with the first pattern and at least a connection portion connected to the first pattern in a second direction and a third pattern spaced apart from and parallel with the first and second patterns. A spacer line may be formed on sidewalls of the first to third patterns, thereby providing spacer spaces that extend in the first direction between the spacer lines and through which target layer is partially exposed. A mask pattern may be formed to cover at least a portion of the connection portion of the second pattern. The sacrificial mask pattern may be removed from the target layer, such that the spacer lines and the mask pattern remain on the target layer. The target layer may be partially etched using the spacer line and the mask pattern as an etching mask, thereby forming a first line-shaped opening that continuously extends in the first direction and a second line-shaped opening that is separated discontinuous in the second direction. First and second lines may be formed on the substrate by filling the first and second openings. The first line may extend discontinuously in the first direction and having at least a cut-off portion and the second line may extend continuously in the first direction adjacent to the first line and having at least a protrusion portion directed toward the cut-off portion.

In an exemplary embodiment, the sacrificial pattern body may extend discontinuously in the first direction to have a pair of end portions and the connection portion may be formed into a pair of horizontal bars connecting the end portions with the first pattern, respectively, such that the first and the second patterns may be connected to each other as a shape of Greek letter 'π.'

In an exemplary embodiment, the spacer spaces may include a first spacer space between the first and the second patterns, a second spacer space between the second and the third patterns and a third spacer space between the first and the third patterns, and the first spacer space may be separated by the connection portion of the second pattern to thereby form a separated space defined by the first pattern and the pair of the horizontal bars and connected to the second spacer space.

In an exemplary embodiment, the mask pattern may be formed into a line extending in the first direction such that the connection portion and the mask pattern cross each other. The line-shaped mask pattern has a width of 2F (F being a minimal marginal resolution of photolithography process) and covers the spacer of the first spacer space in such a manner that the mask pattern is located at a position ranged from a first position to a second position. In such a case, the mask pattern may be aligned with the first pattern to fully cover the first pattern at the first position and be aligned with the second pattern to fully cover the second pattern at the second position.

In an exemplary embodiment, the sacrificial mask pattern, the spacer lines and the spacer spaces may have a width of F and the mask pattern may be formed with an alignment margin of 1.5F.

In an exemplary embodiment, the first line may be formed into a pair of separated lines corresponding to the separated first spacer space and the sacrificial pattern body, respectively, and the second line may be formed into a pair of continuous lines at left and right sides of the first line, respectively.

In an exemplary embodiment, the second line may be formed on the substrate such that one of the pair of the continuous lines may include a first line body extending in the first direction and a pair of first protrusion portions protruding from the first line body toward the cut-off portion of the first line according to the pair of the horizontal bars and a rest of the pair of the continuous lines may include a second line body extending in the first direction and a second protrusion portion protruding from the second line body toward the cut-off portion of the first line according to the separated space when the mask pattern may be located between the first and the second positions.

In an exemplary embodiment, one of the pair of the continuous lines may extend in the first direction without the protrusion portion and a rest of the pair of the continuous lines may be formed to have a line body extending in the first direction and a protrusion portion protruding from the line body toward the cut-off portion of the first line corresponding to the separated space, and one of the separated lines may be bent over toward the cut-off portion of a rest of the pair of the separated lines to thereby form a bending portion extending in the second direction and parallel with the protrusion portion in case that the mask pattern may be located at the first position.

In an exemplary embodiment, one of the pair of the continuous lines may extend in the first direction without the protrusion portion and a rest of the pair of the continuous lines may be formed to have a line body extending in the first direction and a pair of protrusion portions protruding from the line body toward the cut-off portion of the first line corresponding to the pair of the horizontal bars.

In an exemplary embodiment, the sacrificial pattern body may be formed into a line continuously extending in the first direction and the connection portion may be formed into a single horizontal bar connected to the first pattern along the second direction, such that the first and the second patterns may be shaped into a capital letter 'H.'

In an exemplary embodiment, the spacer spaces may include a first spacer space between the first and the second patterns, a second spacer space between the second and the third patterns and a third spacer space between the first and the third patterns, and the mask pattern may be formed into a line having a width of 1F and extending in the first direction in such a manner that the mask pattern partially may cover the spacer in the first spacer and crosses the connection portion of the second pattern.

In an exemplary embodiment, the sacrificial mask pattern, the spacer lines and the spacer spaces may have a width of F and the mask pattern may be formed with an alignment margin of 1.0F.

In an exemplary embodiment, the first line may be formed into a single separated line corresponding to the first spacer space that is separated by the connection portion and the second line may be formed into a pair of continuous lines at left and right sides of the first line, each of the continuous lines including a line body extending in the first direction and a protrusion portion protruding from the line body toward the cut-off portion of the first line corresponding to the connection portion.

In an exemplary embodiment, the second pattern may further include a supplementary pattern that is symmetrical to the first pattern with respect to the sacrificial pattern body and a supplementary horizontal bar that is symmetrical to the horizontal bar with respect to the sacrificial pattern body and is connected with the sacrificial pattern body and the supplementary pattern, such that the first and the second patterns may be shaped into a double capital letter 'H' in which two capital letters 'H' are contact with each other.

In an exemplary embodiment, the spacer spaces may include a first spacer space between the first and the sacrificial pattern body, a supplementary spacer space between the sacrificial pattern body and the supplementary pattern, a second spacer space between the second and the third patterns and a third spacer space between the first and the third patterns, and the mask pattern may be formed into a line having a width of 4F in such a manner that the mask pattern may cover the sacrificial pattern body and crosses at least one of the horizontal bar and the supplementary horizontal bar.

In an exemplary embodiment, the first line may be formed into a triple lines each of which corresponds to the first spacer space separated by the horizontal bar, the supplementary space separated by the supplementary horizontal bar and the sacrificial pattern body separated by the mask pattern, respectively, and the second line may be formed into a pair of continuously lines at left and right sides of the first line, the continuous line including a line body extending in the first direction and a protrusion portion that is selectively protruding from the line body corresponding to one of the horizontal bar and the supplementary horizontal bar in accordance with the position of the mask pattern and extends toward the cut-off portion of the first.

According to an exemplary embodiment, there is provided another method of forming a pattern structure for a semiconductor device. A sacrificial mask pattern may be formed on a target layer that is formed on a substrate. The sacrificial mask pattern may include at least a first line-shaped pattern discontinuously extending in a first direction to have a discontinuous portion therein and a plurality of second line-shaped patterns in parallel with the first pattern and continuously extending in the first direction. A spacer line may be formed on sidewalls of the first and second patterns, thereby providing spacer spaces that extend in the first direction between the spacer lines and through which target layer may be partially exposed, and a connection spacer interfacing with the spacer spaces around the first pattern. A mask pattern may be formed to cover at least a portion of the connection space. The sacrificial mask pattern may be removed from the target layer, such that the spacer lines and the mask pattern remain on the target layer. The target layer may be partially etched off using the spacer line and the mask pattern as an etching mask, thereby forming a first line-shaped opening that continuously extends in the first direction and a second line-shaped opening that is separated discontinuous in the second direction. First and second lines may be formed by filling the first and second openings. The first line may extend discontinuously in the first direction and having at least a cut-off portion and the second line may extend continuously in the first direction adjacent to the first line and having at least a protrusion portion directed toward the cut-off portion.

In an exemplary embodiment, the spacer spaces may include a first spacer space that is provided between the first and second patterns and interfacing with the connection space and a plurality second spacer spaces between the second patterns, and the mask pattern may be formed into a line having a width of 1F in such a manner that the mask pattern crosses the connection space along the first direction with an alignment margin of 1.0F.

According to some exemplary embodiments, there is provided still another method of forming a pattern structure for a semiconductor device. A preliminary mask pattern may be formed on a target layer that is formed on a substrate. A sacrificial mask pattern may be formed on the target layer and the preliminary mask pattern. The sacrificial mask pattern may include a pair of sacrificial pattern bodies spaced apart from each other and shaped into a line extending in a first direction and a connection portion connecting the sacrificial pattern body therebetween in a second direction and crossing the preliminary mask pattern. Spacer lines may be formed on sidewalls of the first to third patterns and a mask pattern may be formed under the first pattern simultaneously with the spacer lines by a self-aligned process, thereby providing spacer spaces that extend in the first direction between the spacer lines and through which target layer is partially exposed. The sacrificial mask pattern may be removed from the target layer and the mask pattern, such that the target layer and the mask pattern are partially exposed through the spacer spaces between the spacer lines. The target layer may be partially etched off using the spacer lines and the mask pattern as an etching mask, thereby forming a first line-shaped opening that extends in the first direction and a second line-shaped opening that extends in the second direction. First and second lines may be formed on the substrate by filling the first and second openings. The first line may extend in the first direction and having at least a cut-off portion and the second line may extend in the first direction adjacent to the first line and having at least a protrusion portion directed toward the cut-off portion.

According to exemplary embodiments of the present inventive concept, the cut-off portion C at the first region corresponding to the node-separation area of a semiconductor device may be formed by a double patterning process. Particularly, the cut-off portion C of the pattern structure may be formed by the connection portion of the sacrificial mask pattern and the mask pattern with an improved alignment margin. Thus, when a node-separation process may be performed to the fine lines of the pattern structure, the misalignment between the mask pattern and the sacrificial mask pattern may be sufficiently reduced due to the increased alignment margin. Therefore, the fine pattern structure may be correctly node-separated at the node separation area of the semiconductor device in spite of the fine width and gap of the pattern structure.

According to an exemplary embodiment of the present inventive concept a method of forming the pattern structure for a semiconductor device line having a cut-off portion is provided. The method includes defining a first line and a second line to be formed on a substrate, the first line having a cut-off portion, forming first and the second sacrificial mask patterns as respective molds for the first line and the second line, the first and second sacrificial mask patterns being connected by a bridge connection portion, and forming a mask pattern and positioning the mask pattern across the bridge connection portion such that the cut-off portion corresponds with the position and shape of the mask pattern.

BRIEF DESCRIPTION OF THE DRAWINGS

Exemplary embodiments of the present inventive concept will be more clearly understood from the following detailed description taken in conjunction with the accompanying drawings.

DETAILED DESCRIPTION OF THE EMBODIMENTS

Figure 1:
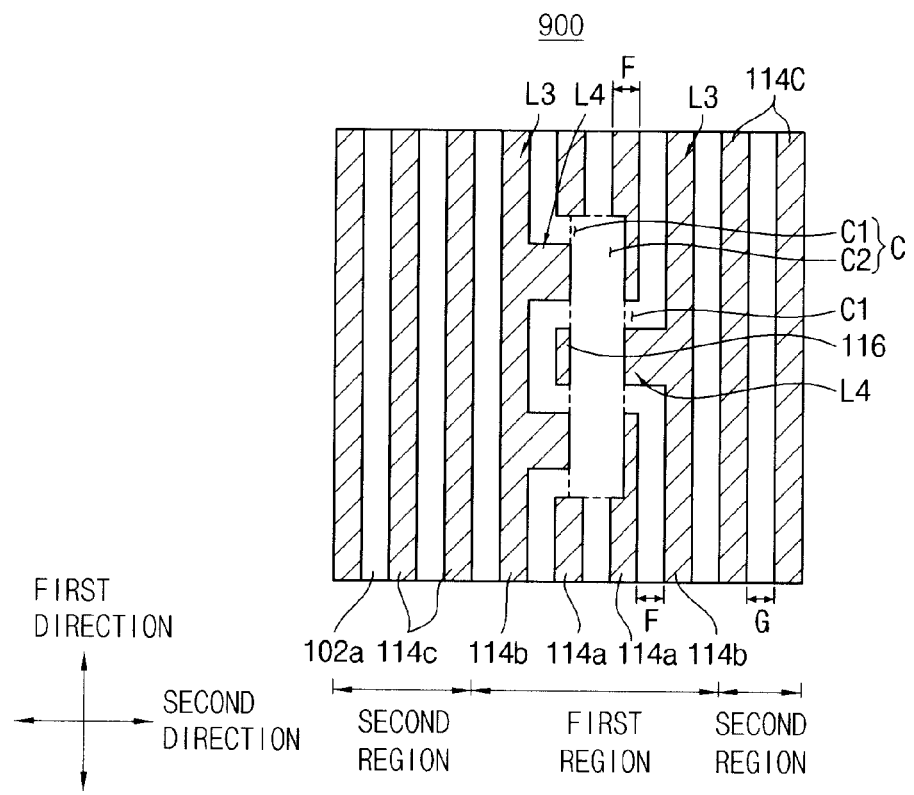
FIG. 1 is a cross-sectional view illustrating a pattern structure for a semiconductor device in accordance with an exemplary embodiment of the present inventive concept.

Various exemplary embodiments will be described more fully hereinafter with reference to the accompanying drawings. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Exemplary embodiments are described herein with reference to cross-sectional illustrations that are schematic illustrations of idealized exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Embodiment I

FIG. 1 is a cross-sectional view illustrating a pattern structure for a semiconductor device in accordance with an exemplary embodiment of the present inventive concept.

Referring to FIG. 1, the line-shaped pattern structure 900 in accordance with an exemplary embodiment of the present inventive concept may be arranged on a substrate having first and second regions. For example, the pattern structure 900 may include first, second and third lines 114a, 114b, 114c arranged on a substrate 100 (see FIGS. 3A to 3F that depict substrate 100). The first lines 114a may include a cut-off portion C and the second lines 114b may be adjacent to the first lines 114a and have no cut-off portion. The first and second lines 144a, 114b may be arranged in the first region of the substrate 100. In the present exemplary embodiment, the first region may include a portion of a cell region of a semiconductor device and the cut-off portion C may include a node-separation area of the semiconductor device. The node-separation area can provide, for example, spacing between nodes coupled to transistor gate, source, or drain elements in the cell region. In the node-separation area, at least a wiring of the semiconductor devices may be cut off or broken along an extension direction thereof. The third line 114c may be arranged in parallel with the first and second lines 114a, 114b in the second region and have no cut-off portion. In the present exemplary embodiment, the second region may include a residual of the substrate 100 except for the first region, and thus the second region may include a portion of the cell region except for the node-separation area and a peripheral circuit region. A plurality of the third lines 114c may be spaced apart by a uniform gap distance and may extend continuously in the first direction.

In an exemplary embodiment, the first line 114a may extend along a first direction in the first region of the substrate 100 and may be partially removed from the substrate 100, to thereby have at least a cut-off portion C at the first line 114a. Thus, the first line 114a may be broken at the cut-off portion C along the first direction. For example, a pair of the first lines 114a may be arranged in the first region of the substrate 100. One of the first lines 114a may include a full cut-off portion C1 at which the first line may be broken across its width and discontinuous along an extension direction, that is, along the first direction. The other line of the pair of the first lines 114a may include the full cut-off portion C1 and a partially removed portion C2 adjoining the full cut-off portion C1. Thus, the line width of the first line 114a at the partially removal portion C2 may be relatively small as compared with other first, second and third lines on the substrate 100.

The second lines 114b may be arranged adjacent to the first line 114a and have no cut-off portion, and thus the second lines 114b may extend continuously along the extension (first) direction adjacent the first lines 114a. For example, a pair of the second lines 114b may be positioned at both side portions of the first lines 114a, respectively. That is, a left line of the second lines 114b may be positioned at a left side of the first lines 114a and a right line of the second lines 114b may be positioned at a right side of the first lines 114a. The second lines 114b may include a line body L3 and at least a protrusion portion L4 that may protrude from the line body L3 in a second direction. Hereinafter, the first and second directions as the shown in FIG. 1 shall be the same directions in other figures described below depicting other exemplary embodiments of the pattern structures and their modifications.

The line body L3 of the second line 114b may extend along the first direction in the first region of the substrate 100 and thus may be in parallel with the first line 114a. The protrusion portion L4 of the second line 144b may protrude from the line body L3 toward the cut-off portion C of the first line 114a. The protrusion portion L4 may not make contact with any other neighboring pattern structure such as the first line 114a and another neighboring protrusion portion. In addition, the position of the protrusion portion L4 of the left line of the second lines 114b may be different from that of the right line of the second lines 114b, and thus the left line and the right line of the second lines 114b may have different shapes in accordance with the positions of the protrusion portions L4.

In addition, the number of the protrusion portions L4 may be the same or different at the left and right lines of the second lines 114b. In the present exemplary embodiment, a single protrusion portion L4 may be provided at the right line of the second lines 114b and a pair of the protrusion portions L4 may be provided at the left line of the second lines 114b.

A plurality of the third lines 114c may be uniformly arranged in the second region of the substrate 100 at both side portions of the second lines 114b. The third line 114c may have no cut-off portion and a uniform line width and thus may be continuous in the first direction. In addition, a plurality of the third lines 114c may be spaced apart from each other by the same gap distance "g", and thus a uniform gap distance may be provided between the neighboring third lines 114c. Further, the third line 114c may also have no protrusion portions.

In the present exemplary embodiment, the first to third lines 114a, 114b, 114c have the same line width and the gap distance between the first to third lines 114a, 114b, 114c may be the same as the line width thereof except around the partially removal portion C2 of the first line 114a. For example, the first to third lines 114a, 114b, 114c may have a width of F denoting a minimal marginal resolution of a photolithography process and the first to third lines 114a, 114b, 114c may be spaced apart from each other by the gap distance of F. That is, the third line 114c, the line body L3 of the second line 114b and the first line 114a may have the same width of F and may be spaced apart from one another by the same gap distance of F.

In an exemplary embodiment, the pattern structure 900 may further include a dummy pattern 116 arranged around the cut-off portion C of the first line 114a. The dummy pattern 116 may be isolated alone from the first, second and third lines 114a, 114b, 114c.

A target pattern 102a may be positioned in gap spaces between the first, the second and the third lines 114a, 114b, 114c and the dummy pattern 116. The target pattern 102a may be passively positioned in the gap spaces as a result of the formation of the first to third lines 114a, 114b, 114c. For example, the target pattern 102a may comprise an insulation material or a semiconductor material.

The first to third lines 114a, 114b, 114c and the dummy pattern 116 may comprise a conductive material, and thus the pattern structure 900 may include a signal line pattern structure such as a bit line structure and a word line structure of semiconductor devices.

Otherwise, the first to third lines 114a, 114b, 114c may comprise an insulation material, and thus the pattern structure 900 may include a device isolation pattern to allow, for example, for separation of active regions of transistors implemented in the semiconductor devices.

Hereinafter, a processing method for forming the line-shaped pattern structure 900 shown in FIG. 1 will now be described in more detail with reference to FIGS. 2A to 2F and 3A to 3F.

FIGS. 2A to 2F are plan views illustrating processing steps for a method of forming the pattern structure shown in FIG. 1. FIGS. 3A to 3F are cross-sectional views illustrating processing steps for a method of forming the pattern structure shown in FIG. 1. FIGS. 3A to 3F are cross-sectional views cut along a line I-I' of FIG. 2A.

Figure 2A:
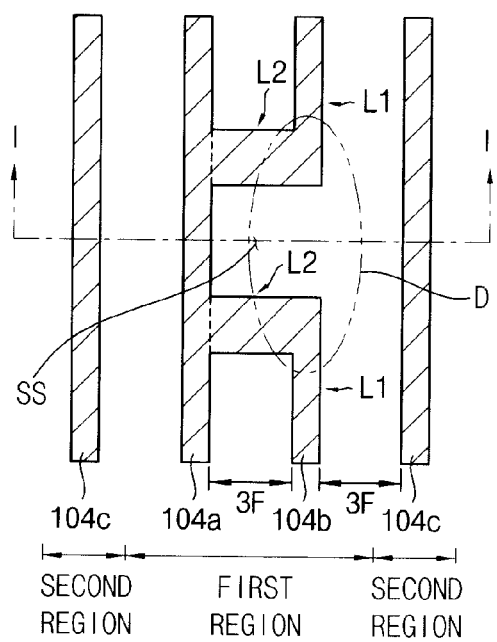
FIGS. 2A, 2B, 2C, 2D, 2E and 2F are plan views illustrating processing steps for a method of forming the pattern structure shown in FIG. 1.
Figure 3A:
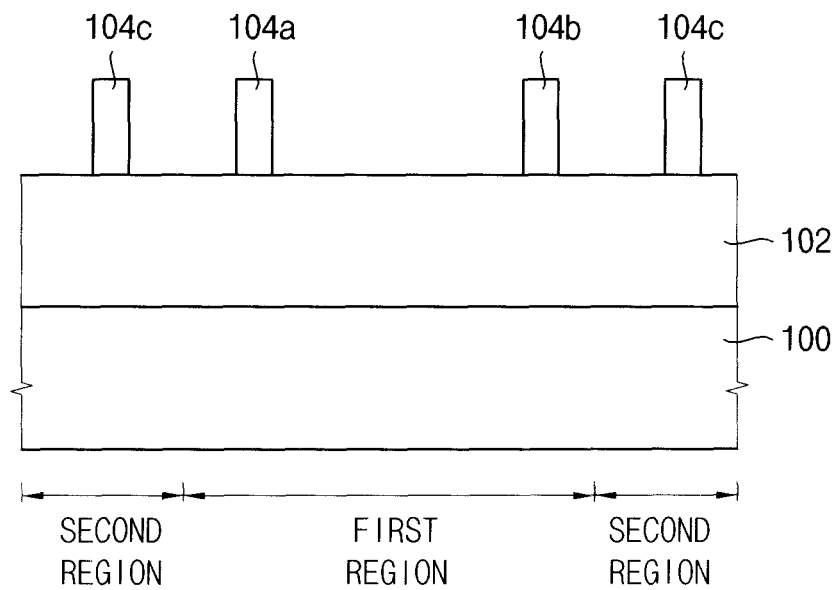
FIGS. 3A, 3B, 3C, 3D, 3E and 3F are cross-sectional views illustrating processing steps for a method of forming the pattern structure shown in FIG. 1.

Referring to FIGS. 2A and 3A, the substrate 100 may be provided and the first and the second regions may be defined on the substrate 100. The first lines 114a having the cut-off portion C and a pair of the second lines 114b may be formed in the first region by the following processing steps, and simultaneously the third lines 114c having no cut-off portion C may be formed in the second region by the following processing steps. The second region may include a region of the substrate 100 except for the first region. For example, the first region may include a portion of a cell region of a semiconductor device at which a node-separation area may be positioned and the second region may include the other portions of the cell region and a peripheral circuit region of the substrate 100 of the semiconductor device.

A target layer 102 that is to be patterned into the target pattern 102a may be formed on the substrate 100. For example, the target layer 102 may include an additional insulation layer comprising a silicon oxide and a silicon nitride. Otherwise, the target layer may include the substrate 100 without an additional layer. For example, when the substrate 100 may be used as the target layer 102 without any additional layer, the substrate 100 may be etched off by an etching process using the pattern structure 900 as an etching mask, to thereby form a trench for a device isolation layer pattern for a semiconductor device.

Then, a sacrificial mask layer (not illustrated) may be formed on the target layer 102. The sacrificial mask layer may include a single layer or a stacked multilayer having at least two component layers. For example, the sacrificial mask layer may include an anti-reflection layer and a photoresist layer that may be formed by a spin coating process. The sacrificial mask layer may be patterned into first to third sacrificial mask patterns 104a, 104b, 104c.

The first and the second sacrificial mask patterns 104a, 104b may be formed in the first region of the substrate 100 and may function as a mold for the first line 114a having the cut-off portion C and the second line 114b. The third sacrificial mask pattern 104c may be formed in the second region of the substrate 100 and may function as a mold for the third lines 114c continuously extending in the first direction.

Although not shown in the figures, a plurality of the third sacrificial mask patterns 104c may be formed in the second region of the substrate 100 in such a manner that line-shaped mask patterns 104c and gap spaces between neighboring line-shaped mask patterns 104c may be alternately arranged on the target layer 102. That is, the third sacrificial mask patterns 104c may be formed into the line-shaped patterns having a uniform width and the line-shaped patterns may be spaced apart by the same gap distance. For example, the third sacrificial mask pattern 104c may be formed to have the width of F and the gap distance of 3F. In such a case, the third line 114c may also be formed to have the line width of F. In addition, the first and the second sacrificial mask patterns 104a, 104b may also be spaced apart from the same gap distance of 3F and may have the same line width of F. The second sacrificial mask pattern 104b and the third sacrificial mask pattern 104c may also be spaced apart from each other by the same gap distance of 3F. That is, the first to third sacrificial mask patterns 104a to 104c may have the same line width of F and may be spaced apart by the same gap distance of 3F. Thus, the gap spaces between the sacrificial mask patterns 104a to 104c may have a uniform size.

In the present exemplary embodiment, the assembly of the first and the second sacrificial mask patterns 104a, 104b may determine the number and shape of the first lines 114a having the cut off portion C and the shape of the second lines 114b at both sides of the first lines 114a. Thus, a whole shape of the assembly of the first and the second sacrificial mask patterns 104a, 104b may be varied according to the number and shape of the first and the second lines 114a, 114b.

Since the pattern structure 900 may include a pair of the first lines 114a having the cut off portion C and a pair of the second lines 114b at both sides of the first lines 114a, the first and the second sacrificial mask patterns 104a, 104b may be formed on the target layer 102 as a shape of a Greek letter 'π.'

For example, the first and the third sacrificial mask patterns 104a, 104c may be formed into continuous lines that may extend continuously in the first direction. In contrast, the second sacrificial mask pattern 104b may be formed into a discontinuous line that may extend discontinuously in the first direction. Thus, a discontinuous portion D may be prepared at the second sacrificial mask pattern 104b. In the present exemplary embodiment, the second sacrificial mask pattern 104b may include a sacrificial pattern body L1 that may extend in parallel with the first sacrificial pattern 104a along the first direction and a connection portion L2 that may be connected to an end portion of the sacrificial pattern body L1 and the first sacrificial mask pattern 104a. The connection portion L2 may be formed into a pair of horizontal bars that are connected with the first sacrificial mask pattern 104a and the end portions of the sacrificial pattern body L1 along the second direction. Thus, the first sacrificial mask pattern 104a, the connection portion L2 and the sacrificial pattern body L1 may be connected as a shape of the Greek letter 'π.' The second sacrificial mask pattern 104b may be formed at a right side of the first sacrificial mask pattern 104a.

Particularly, the sacrificial pattern body L1 of the second sacrificial mask pattern 104b may be spaced apart from the first sacrificial mask pattern 104a by a gap distance of 3F and may also be spaced apart from the third sacrificial mask pattern 104c by the same gap distance of 3F. In addition, the first sacrificial mask pattern 104a may be spaced apart from the third sacrificial mask pattern 104c by the same gap distance of 3F. That is, the first sacrificial mask pattern 104a, the sacrificial pattern body L1 of the second sacrificial mask pattern 104b and the third sacrificial mask pattern 104c may be spaced apart from one another by the same gap distance of 3F. Thus, uniform gap spaces may be provided between the first sacrificial mask pattern 104a, the sacrificial pattern body L1 of the second sacrificial mask pattern 104b.

Figure 2B:
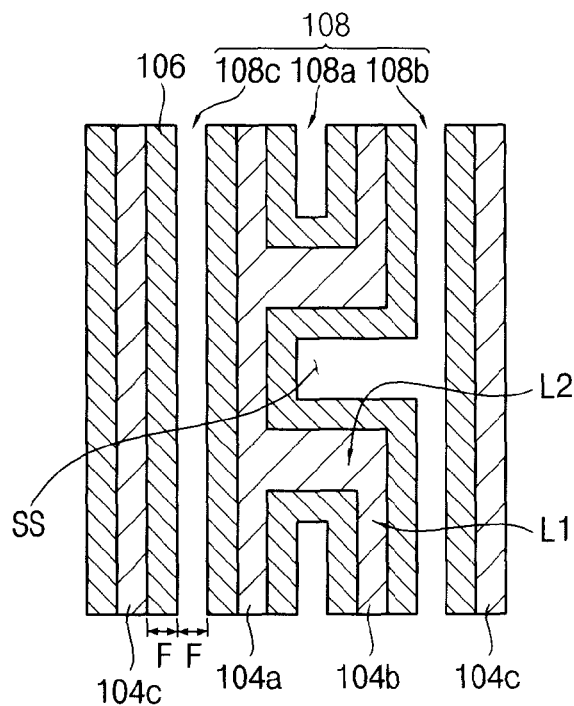
Figure 3B:
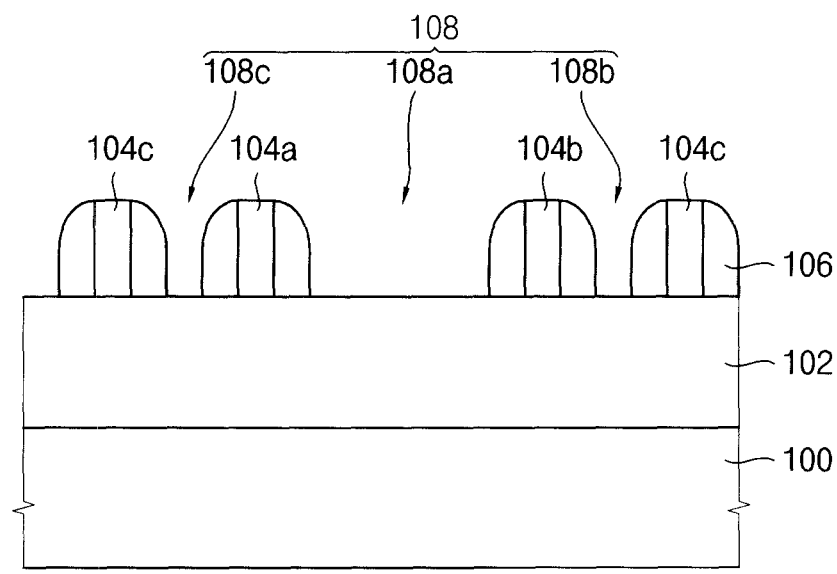

Referring to FIGS. 2B and 3B, a spacer layer (not illustrated) may be formed on the target layer 102 on which the first to third sacrificial mask patterns 104a, 104b, 104c may be arranged. The spacer layer may have material properties such as etching selectivity different from those of the first to third sacrificial mask patterns 104a to 104c. For example, the spacer layer may comprise a silicon oxide and may be formed by an atomic layer deposition (ALD) process. The spacer layer may have a substantially uniform thickness on the target layer 102.

Then, an etch back process may be performed on the spacer layer and thus spacer lines 106 may be formed on each sidewall of the first to third sacrificial mask patterns 104a to 104c. Thus, the gap spaces between the first to third sacrificial mask patterns 104a, 104b, 104c may be reduced to spacer spaces 108 between the spacer lines 106 in such a manner that a width of the spacer line 106 may be substantially the same as the gap distance between the spacer lines 106. In the present exemplary embodiment, the spacer line 106 may be formed to have a width of F and a pair of the spacer lines 106 may be spaced apart by a gap distance of F. That is, the spacer line 106 and the spacer space 108 may have the same width of F.

The first to third lines 114a, 114b, 114c may be formed on the substrate 100 in accordance with the spacer space 108 and the first to third sacrificial mask patterns 104a to 104c. The sacrificial mask patterns 104a, 104b, 104c and the spacer lines on both sidewalls of the sacrificial mask patterns 104a, 104b, 104c may be formed into a line shape extending in the first direction and thus the spacer space 108 may also be formed into a line space extending in the first direction. Hereinafter, the line-shaped spacer space of the first and the second sacrificial mask patterns 104a and 104b is referred to as first spacer space 108a and the line-shaped spacer space of the second and the third sacrificial mask patterns 104b, 104c is referred to as second spacer space 108b. The line-shaped spacer space between the first and the third sacrificial mask patterns 104a, 104c is referred to as third spacer space 108c.

In the present exemplary embodiment, the connection portion L2 of the second sacrificial mask pattern 104b may be connected to the first sacrificial mask pattern 104a across the first spacer space 108a, and thus the first spacer space 108a may be blocked by the connection portion L2 and discontinuous along the first direction. That is, the first spacer space 108a may be separated by the connection portion L2 and a separated space SS may be formed between a pair of the connection portions L2. The separated space SS may be connected to the discontinuous portion D of the second sacrificial mask pattern 104b. In contrast, the second line-shaped spacer space 108b may extend in the first direction and may be connected to the separated space SS. That is, the second spacer space 108b continuously extending in the first direction may also be expanded to the separated space SS in the second direction. The third spacer space 108c, which may include residuals of the spacer space 108 except for the first and second spacer spaces 108a, 108b, may be shaped into a line continuously extending in the first direction. Therefore, the third spacer space 108c may be provided between the spacers 106 of the first and the third sacrificial mask patterns 104a, 104c and between the neighboring third sacrificial mask patterns 104c.

Figure 2C:
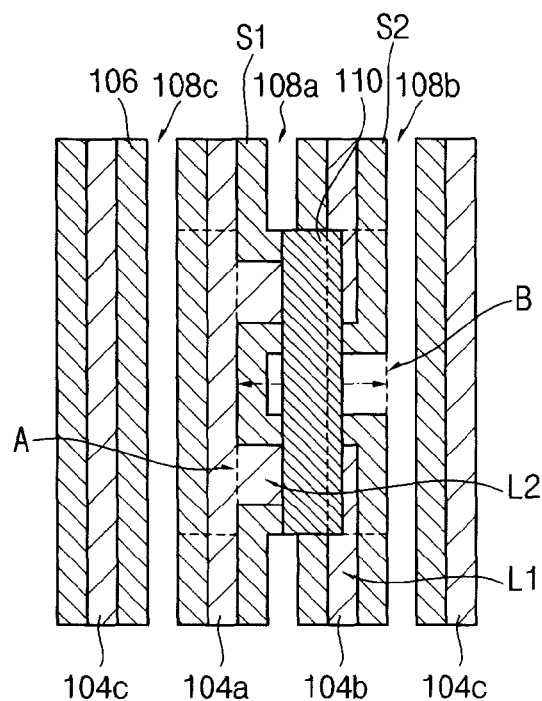
Figure 3C:
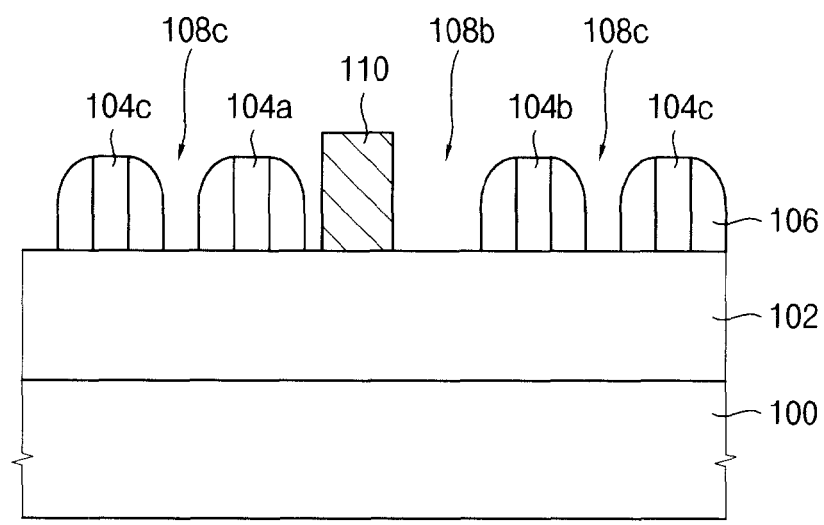

Referring to FIGS. 2C and 3C, a mask layer (not illustrated) may be formed on the target layer 102 along a surface profile of the spacer line 106 and the sacrificial mask patterns 104a, 104b, 104c. Thus, the spacer line 106 and the first to third sacrificial mask patterns 104a, 104b, 104c may be covered with the mask layer. For example, the mask layer may include a spin-on-hard (SOH) mask layer and a spin-on-photoresist layer that may be formed by a spin coating process. Since the mask layer may not necessarily be a hard mask layer comprising a silicon oxide or a silicon nitride, the mask layer may be formed by a simple process such as the spin coating process, rather than by a complicated process such as a deposition process.

A mask pattern 110 may be formed in the first region of the substrate 100 by a photolithography process against the mask layer. The cut-off portion C of the first and the second lines 114a, 114b may be formed in accordance with the position and shape of the mask pattern 110 in the following process.

For example, the mask pattern 110 may be formed into a line shape extending along the first direction in such a manner that the mask pattern 110 may cross the connection portion L2. The size and position of the mask pattern 110 may determine the size and position of the cut off portion (C) of the first and second lines 114a, 114b.

The connection portion L2 extending in the second direction may be separated by the mask pattern 110 extending in the first direction in a subsequent process, and thus the first sacrificial mask pattern 104a and the second sacrificial mask pattern 104b may be separated from each other. Since the first to the third lines 114a, 114b, 114c may be formed in accordance with the spacer space 108 and the sacrificial patterns 104a, 104b, 104c, the connection with the first and the second sacrificial patterns 104a, 104b by the connection portion L2 may cause bridge failures between the first and the second lines in a subsequent process. Thus, the mask pattern 110 may be positioned across the connection portion L2 of the second sacrificial pattern 104b and thus the cut-off portion C may be generated along the first line 114a in a subsequent process, to thereby prevent the bridge failures of the lines of the pattern structure 900.

Accordingly, the position and size of the cut-off portion may be varied according to those of the mask pattern 110.

Since the first spacer space 108a may be separated in the extension (first) direction by the separated space SS, the first line corresponding to the first spacer space 108a may be formed to have the cut-off portion C regardless of the mask pattern 110 in a subsequent process. In contrast, one or both of the first and the second sacrificial patterns 104a, 104b may be formed to have the cut-off portion C in accordance with the position and size of the mask pattern 110 in a subsequent process. Thus, the position and size of the mask pattern 110 may be varied according to the number of the cut-off lines in the pattern structure 900 in the first region, which may include node-separated lines of a node separation area of a semiconductor device.

In the present exemplary embodiment, a pair of the first lines 114a may be formed according to the first spacer space 108a and the second sacrificial pattern 104b and a pair of the second lines 114b may be formed according to the first sacrificial mask pattern 104a and the second spacer space 108b in a subsequent process. Particularly, the mask pattern 110 may be formed to have a width of about 2F that is a minimal pitch of the conventional photolithography process. Since the connection portion L2 may extend to a length of about 3F in the second direction, the 2F width of the mask pattern 110 may be sufficient for being across the connection portion L2 in the first direction.

In case that a pair of the lines corresponding to the first spacer space 108a and the second sacrificial mask pattern 104b needs to be separated as illustrated in FIG. 1, the 2F mask pattern 110 may be positioned between a first position A that may be a leftmost correct alignment position and a second position B that may be a rightmost correct alignment position without any deterioration of continuity of the first sacrificial mask pattern 104a. Since the width of the mask pattern 110 may be about 2F, the mask pattern 110 may be correctly aligned in such a manner that the first sacrificial mask pattern 104a and a first spacer line S1 defining the first spacer space 108a may be covered by the mask pattern 110 when located at the first position A, and the second sacrificial mask pattern 104b and a second spacer line S2 defining the second spacer space 108b may be covered by the mask pattern 110 when located at the second position B. The first position A of the mask pattern 110 may have a marginal distance of about 3F to the second position B and the second position B of the mask pattern 110 may also have a marginal distance of about 3F to the first position A. Therefore, the mask pattern 110 may have a process margin of about 1.5F with respect to a central line thereof. When the mask pattern 110 may be misaligned from the correct alignment positions of A and B within the process margin of 1.5F, the mask pattern 110 may be sufficiently across the connection portion L2 and the bridge failures caused by the connection portion L2 may be sufficiently prevented.

Accordingly, the mask pattern 110 may be formed on the target layer 102 with an improved alignment margin of about 1.5F. A conventional sacrificial mask pattern for forming a pair of separated lines in the first region does not have the connection portion L2 of the present exemplary embodiment of the inventive concept, and thus the mask pattern for node separation may be formed with a conventional misalignment of about 0.5F and with a width of about 4F. Therefore, the alignment margin may be increased about three times of the conventional margin when forming a line-shaped pattern structure for a node separation area in a semiconductor device.

Figure 2D:
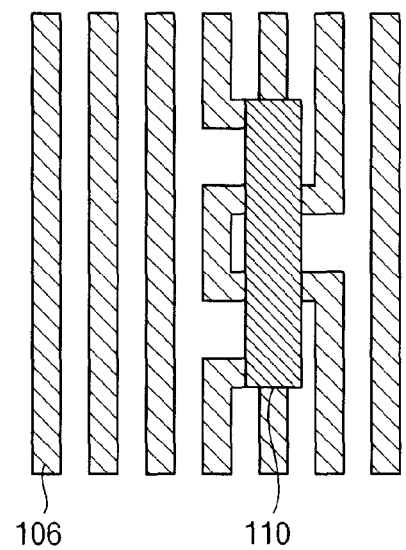
Figure 3D:
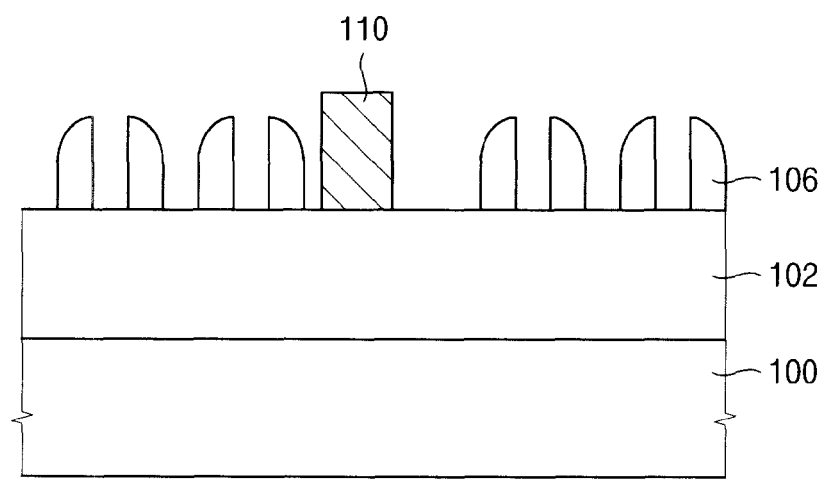

Referring to FIGS. 2D and 3D, the first, the second and the third sacrificial mask patterns 104a, 104b, 104c may be removed from the target layer 102 while the portions of the sacrificial mask patterns 104a, 104b, 104c that may be covered with the mask pattern 110 may still remain on the target layer 102.

Thus, the target layer 102 may be etched off by an etching process using the spacer lines 106 and the mask pattern 110 as an etching mask. In the present exemplary embodiment, the pattern structure 900 may be formed between the spacer lines 106 according to the line shape of the first, second and third sacrificial mask patterns 104a, 104b, 104c and the first, the second and the third spacer spaces 108a, 108b, 108c that may not be covered with the mask pattern 110. For example, a damascene process, wherein different metals are inlayed into one another, may be conducted for forming the pattern structure 900.

Figure 2E:
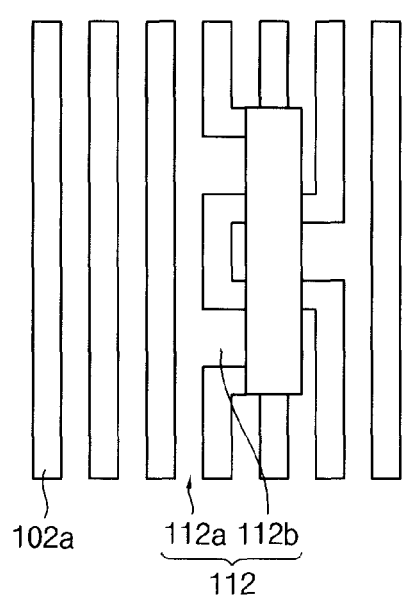
Figure 3E:
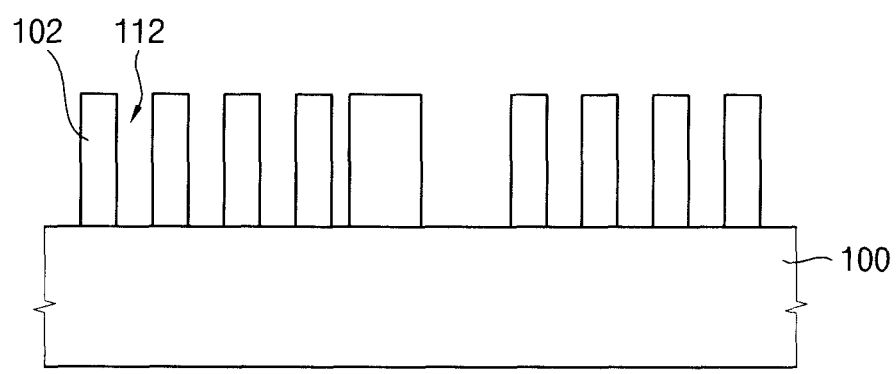

Referring to FIGS. 2E and 3E, the target layer 102 may be partially removed by an etching process using the spacer line 106 and the mask pattern 110 as an etching mask, thereby forming the target pattern 102a having a line-shaped opening 112 or a trench. For example, the line-shaped opening 112 may be formed into a vertical line-shaped opening 112a continuously extending in the first direction and a horizontal line-shaped opening 112b discontinuously extending in the second direction in accordance with the connection portion L2 of the second sacrificial pattern 104b.

Figure 2F:
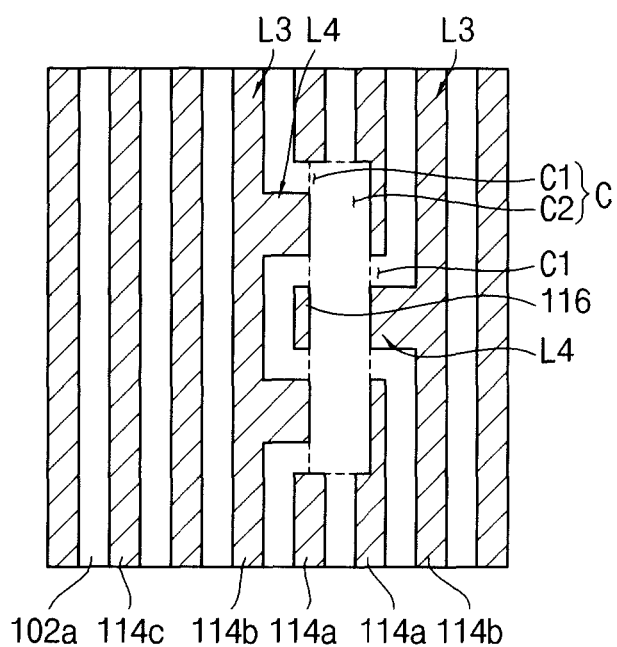
Figure 3F:
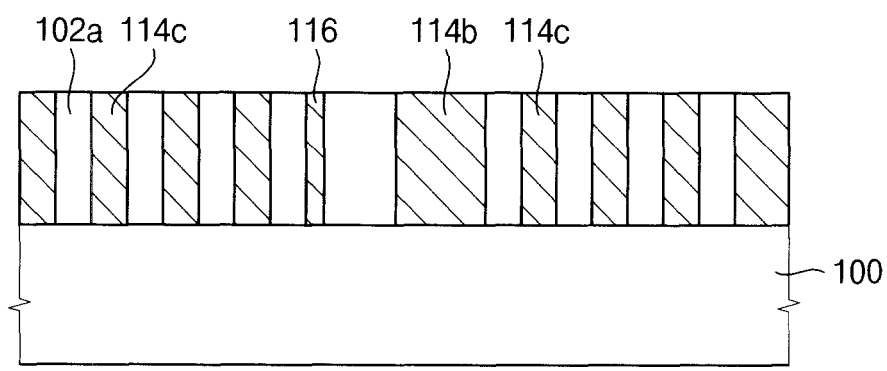

Referring to FIGS. 2F and 3F, a material layer (not illustrated) may be formed on the substrate 100 having the target pattern 102a to a sufficient thickness to fill up the opening 112. Then, the material layer may be planarized by a planarization process such as a chemical mechanical polishing (CMP) process and an etch-back process until an upper surface of the target pattern 102a is exposed. Accordingly, the material layer may remain merely in the line-shaped opening 112 of the target pattern 102a, thereby forming the pattern structure 900 including the first to third lines 114a, 114b, 114c.

The material layer may include a conductive layer. For example, the material layer may comprise a metal such as copper (Cu) that may be difficult to be etched off by a conventional photolithography process. Thus, the lines 114a, 114b, 114c of the pattern structure 900 may include copper lines extending in the first direction.

Otherwise, the material layer may include an insulation layer. For example, an insulation material may be filled into the line-shaped trench 112 of the target pattern 102a, and thus the pattern structure 900 may include a device isolation pattern on the substrate 100. In another exemplary embodiment, the target pattern 102a may function as a hard mask pattern for etching an underlying layer in place of the formation of the material layer.

Accordingly, the pattern structure 900 may include a plurality of lines 114 that may extend in the first direction and some of which may be separated in the node-separation area of the semiconductor device. The lines may include a pair of the first lines 114a having the cut-off portion C, a pair of the second lines 114b positioned at both sides of the first lines 114a and having the protrusion portion L4 and a plurality of the third lines 114c positioned at outside portions of the second lines 114b. The second and the third lines 114b, 114c may continuously extend in the first direction.

In the present exemplary embodiment, the first lines 114a may be arranged in the first region of the substrate 100 and may include a pair of separated lines that may be separated at the cut-off portion C along the first direction. Thus, the first lines 114a may function as node separation lines in semiconductor devices. The second line 114b may include the line body L3 and at least one protrusion portion L4 that protrudes from the line body L3. The line body L3 may continuously extend along the first direction in parallel with the first line 114a without any cut-off portions C. The protrusion portion L4 may protrude from the line body L3 toward the cut-off portion C and may be directed to the cut-off portion C of the first line 114a. The protrusion portion L4 may be formed in accordance with the connection portion L2 of the second sacrificial mask pattern 104b. The size and shape of the protrusion portion L4 may be varied by the position of the mask pattern 110. The third lines 114c may be spaced apart by the same gap distance and thus the line-shape pattern 114c and the gap space between the neighboring the lines 114c may be alternately arranged in the second direction. Particularly, while the first to third lines 114a, 114b, 114c may be formed to have the width of F (minimal marginal resolution of photolithography process) and the gap distance of F, the alignment margin for separating the lines at the node separation area may be remarkably improved to about 1.5F to thereby sufficiently prevent the bridge failures of the node-separated lines in spite of the fine pattern lines.

Further, the isolated dummy pattern 116 may be formed at the separated space SS. The dummy pattern 116 may be selectively formed in accordance with the cross of the mask pattern 110 and the separated space SS.

According to the present exemplary embodiment of a method of forming the pattern structure, the pattern structure 900 may be formed into a fine line shape having the cut-off portion C at the first region corresponding to the node-separation area of a semiconductor device by a double patterning process. Particularly, the cut-off portion C of the pattern structure 900 may be formed by the connection portion L2 of the sacrificial mask pattern 104 and the mask pattern 110 with the alignment margin of 1.5F. Thus, when a node-separation process may be performed to the fine lines of the pattern structure, the mask pattern may be less misaligned with the underlying sacrificial mask pattern due to the increased alignment margin of 1.5F. Therefore, the fine pattern structure 900 may be correctly node-separated at the node separation area of the semiconductor device in spite of the fine width and gap of the pattern structure.

As described in detail, the mask pattern 110 may be positioned across the connection portion L2 of the second sacrificial mask pattern 104b within the alignment margin of about 1.5F leftwards or rightwards. Therefore, the mask pattern 110 may have various positions within the alignment margin of 1.5F and the lines 114 of the pattern structure 900 may have various shapes according to the position of the mask pattern 110.

Hereinafter, various modifications of the pattern structure 900 and method of forming the same are described with reference to FIGS. 4A to 10D.

Figure 4A:
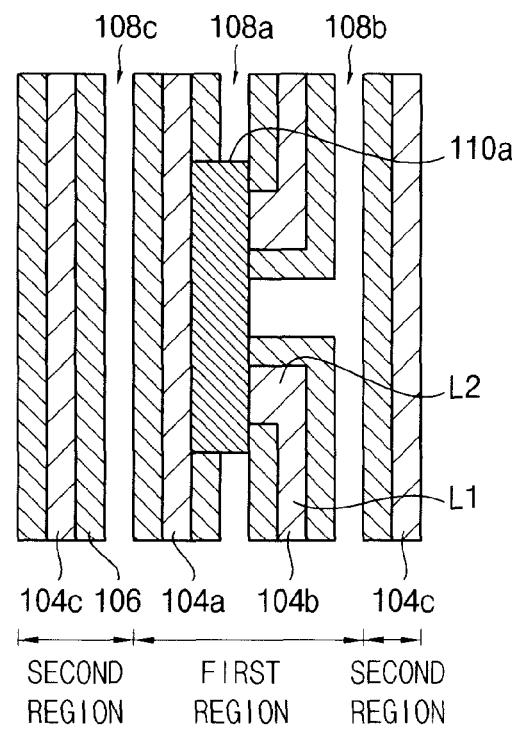
FIGS. 4A, 4B and 4C are plan views illustrating processing steps for a method of forming a first modification of the pattern structure when the mask pattern is positioned leftmost of the connection portion of the sacrificial mask pattern.
Figure 4B:
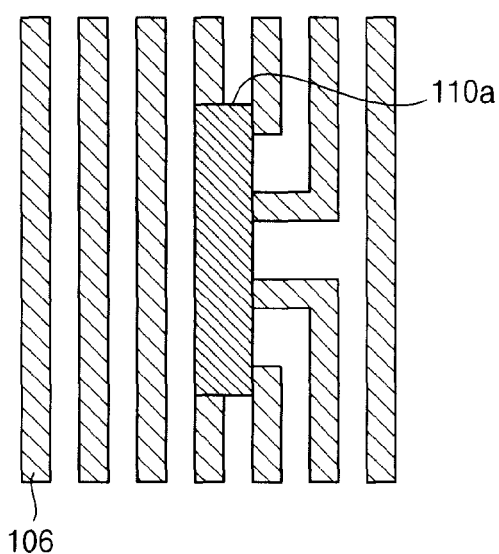
Figure 4C:
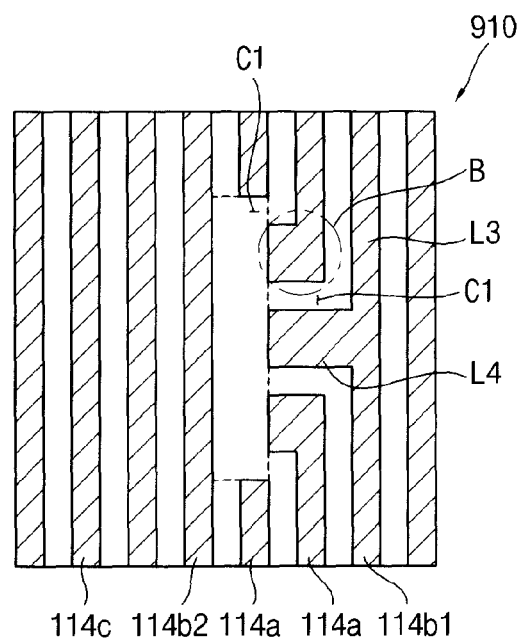

FIGS. 4A to 4C are plan views illustrating processing steps for a method of forming a first modification of the pattern structure when the mask pattern is positioned leftmost of the connection portion of the sacrificial mask pattern.

Referring to FIG. 4A, the same process as described in detail with reference to FIGS. 2A and 2B may be performed on the substrate 100 and the mask layer (not illustrated) may be formed on the target layer 102 and the spacer line 106. The mask layer may be patterned by a photolithography process in such a manner that a left sidewall of the mask pattern may be correctly aligned with a right sidewall of the first sacrificial mask pattern 104a. Thus, a leftmost mask pattern 110a may be formed in the first region of the substrate 100.

Referring to FIG. 4B, the first to the third sacrificial mask pattern 104a, 104b, 104c may be removed from the substrate 100 by the same process as described in detail with reference to FIG. 2C. Thereafter, the same process as described with reference to FIGS. 2D to 2F may be performed on the substrate 100 including the leftmost mask pattern 110a, thereby forming a first modification of the pattern structure 910 shown in FIG. 4C.

Referring to FIG. 4C, the first modification of pattern structure 910 may include first, second and third lines 114a, 114b, 114c. The first line 114a may include a separated line having the cut-off portion C and a pair of the second lines 114b may be positioned at both sides of the pair of the first lines 114a, respectively. A plurality of the third lines 114c may be arranged outside the second lines 114b.

In the present exemplary embodiment, a pair of the first lines 114a may be arranged in the first region of the substrate 100 and both of the first patterns 114a may include the full cut-off portion C1 without the partially removed portion as the cut-off portion C. That is, one of the first lines 114a may include the full cut-off C1 and the other of first lines 114a may include a bending portion B that may be bent over toward the full cut-off portion C1 of the adjacent first line 114a. The bending portion may extend in the second direction and may be in parallel with the protrusion portion L4 of the second line 114b.

In addition, the right second line 114b1, positioned at the right side of the pair of the first lines 114a, may include a line body L3 and a protrusion portion L4. The line body L3 may extend along the first direction in parallel with the first line 114a. The protrusion portion L4 may protrude from the line body L3 in the second direction around the full cut-off portion C1 and may be directed to the first line 114a, particularly toward the full cut-off portion C1 of the first line 114a. In contrast, the left second line 114b2, positioned at the left side of the pair of the first lines 114a, may be shaped into a line extending along the first direction in parallel with the first line 114a. The third lines may be spaced apart by the same gap distance of F and thus the line-shape pattern 114c may be uniformly arranged in the second direction.

Figure 5A:
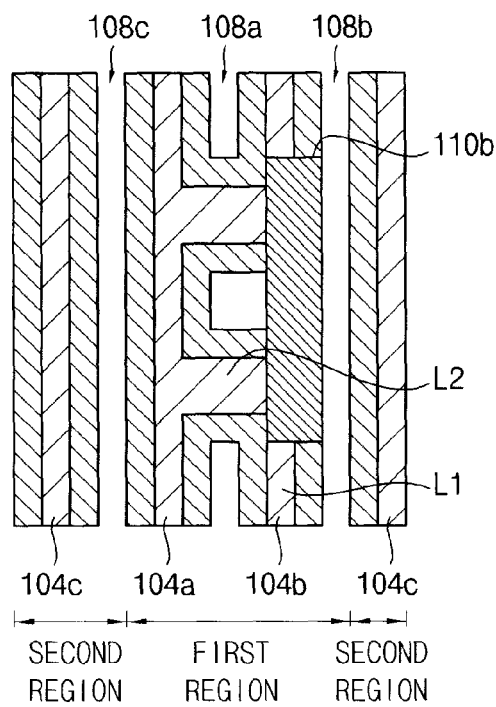
FIGS. 5A, 5B and 5C are plan views illustrating processing steps for a method of forming a second modification of the pattern structure when the mask pattern is positioned rightmost of the connection portion of the sacrificial mask pattern.
Figure 5B:
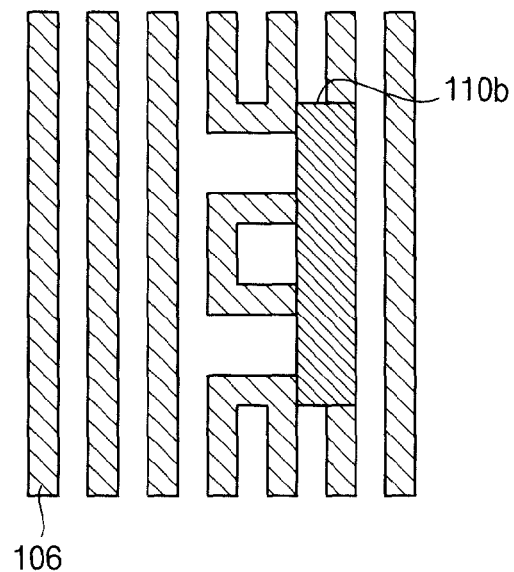
Figure 5C:
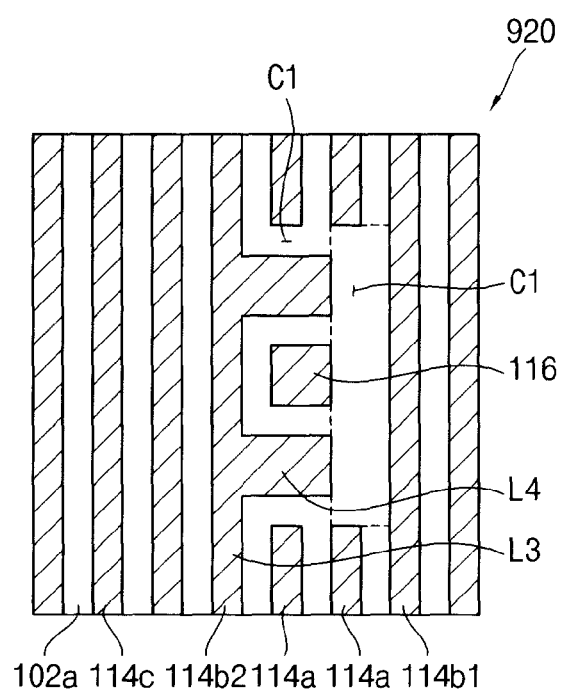

FIGS. 5A to 5C are plan views illustrating processing steps for a method of forming a second modification of the pattern structure when the mask pattern is positioned rightmost of the connection portion of the sacrificial mask pattern.

Referring to FIG. 5A, the same process as described in detail with reference to FIGS. 2A and 2B may be performed on the substrate 100 and the mask layer (not illustrated) may be formed on the target layer 102 and the spacer line 106. The mask layer may be patterned by a photolithography process in such a manner that a left sidewall of the mask pattern may be correctly aligned with a right sidewall of the sacrificial pattern body L1 of the second sacrificial mask pattern 104b. Thus, a rightmost mask pattern 110b may be formed in the first region of the substrate 100.

Referring to FIG. 5B, the first to the third sacrificial mask pattern 104a, 104b, 104c may be removed from the substrate 100 by the same process as described in detail with reference to FIG. 2C. Thereafter, the same process as described with reference to FIGS. 2D to 2F may be performed on the substrate 100 including the rightmost mask pattern 110b, thereby forming the second modification of the pattern structure 920 shown in FIG. 5C.

Referring to FIG. 5C, the second modification of pattern structure 920 may include first, second and third lines 114a, 114b, 114c. The first line 114a may include the cut-off portion C and a pair of the second lines 114b may be positioned at both sides of the pair of the first lines 114a, respectively. A plurality of the third lines 114c may be arranged outside the second lines 114b.

Particularly, a pair of the first lines 114a may be arranged in the first region of the substrate 100 and both of the first patterns 114a may include the full cut-off portion C1 without the partially removed portion as the cut-off portion C. No bent portion may be prepared with the first line 114a.

In addition, the left second line 114b2, positioned at the left side of the pair of the first lines 114a, may include the line body L3 and the protrusion portion L4. The line body L3 may extend along the first direction in parallel with the first line 114a. The protrusion portion L4 may protrude from the line body L3 in the second direction around the full cut-off portion C1 and may be directed to the first line 114a, particularly toward the full cut-off portion C1 of the first line 114a. In contrast, the right second line 114b1, positioned at the right side of the pair of the first lines 114a, may be shaped into a line extending along the first direction in parallel with the first line 114a. The third lines may be spaced apart by the same gap distance of F and thus the line-shape pattern 114c may be uniformly arranged in the second direction.

Particularly, a pair of the protrusion portions L4 may be arranged toward the cut-off portion C and the dummy pattern 116 may be arranged between the pair of the protrusions L4 across the cut-off portion C of the first line 114a.

Therefore, although the mask pattern may be positioned at the leftmost or rightmost of the connection portion of the sacrificial mask pattern, the pattern structure may include the cut-off portion of the lines at the first region without process failures such as the bridge failures, thereby forming the node-separated lines having fine width and gap distance. The whole shape of the pattern structure may be varied according to the position of the mask pattern, as would be known to one of the ordinary skill in the art. Also, it can be appreciated that if multiple lines have multiple cut-off portions, multiple mask patterns can be correspondingly implemented.

Figure 6A:
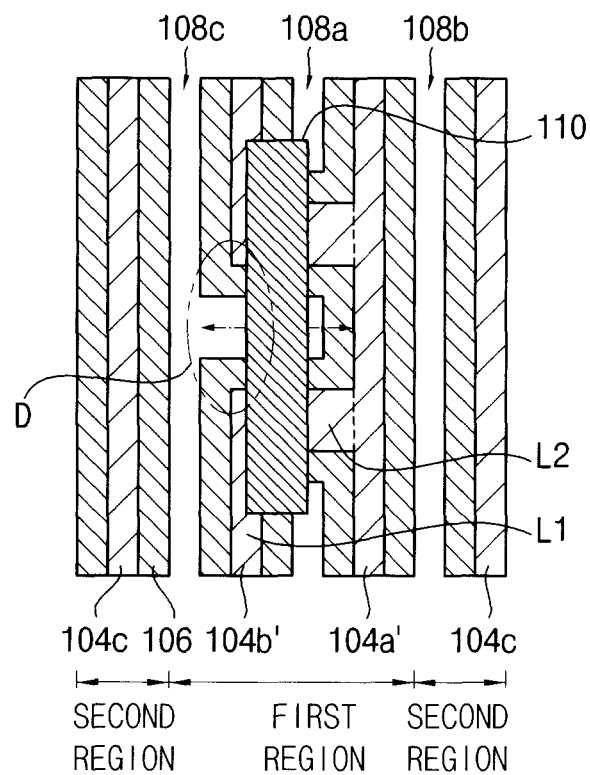
FIGS. 6A, 6B and 6C are plan views illustrating processing steps for a method of forming a third modification of the pattern structure when the mask pattern is positioned at a left portion of the connection portion.
Figure 6B:
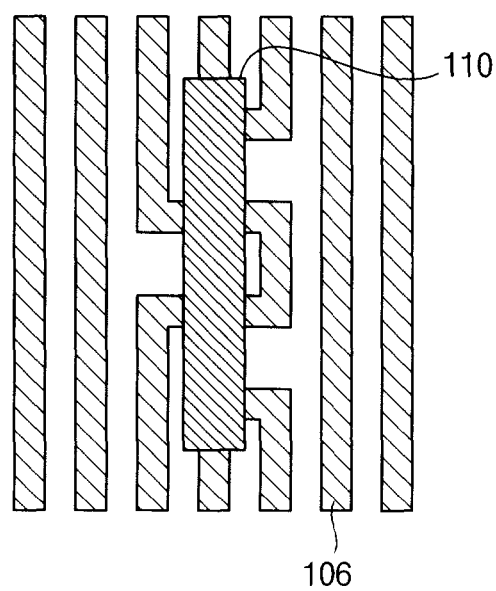
Figure 6C:
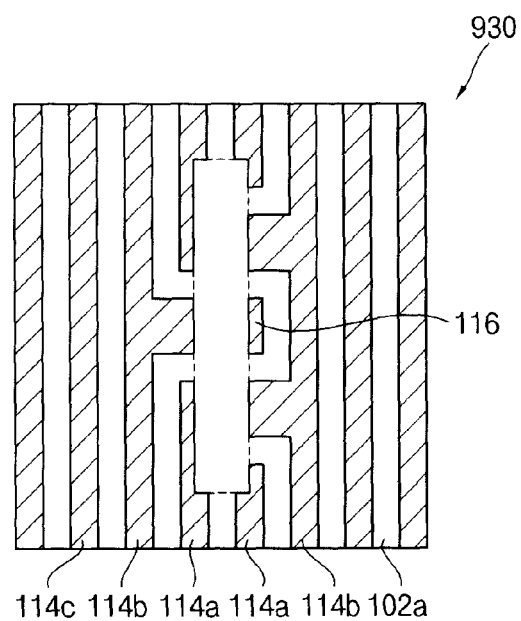

FIGS. 6A to 6C are plan views illustrating processing steps for a method of forming a third modification of the pattern structure when the mask pattern is positioned at a left portion of the connection portion.

The processing steps described hereinafter with reference to FIGS. 6A to 6C may be substantially the same steps as described in detail with reference to FIGS. 2A to 2F, except that the positions of the first and the second sacrificial mask patterns may be exchanged with each other. Thus, the third modification of the pattern structure may be vertically symmetrical with respect to the pattern structure shown in FIG. 1. In FIGS. 6A to 6C, the same reference numerals denote the same elements in FIGS. 2A to 2F and the detailed descriptions of the same reference elements will be omitted.

Referring to FIG. 6A, the target layer 102 may be formed on the substrate 100 and a first, a second and the third sacrificial mask pattern 104a', 104b', 104c may be formed on the target layer 102.

The first sacrificial mask pattern 104a' may be formed at a right portion of the first region and be shaped into a continuous line without any discontinuous portions. In contrast, the second sacrificial mask pattern 104b' may be formed at a left portion of the first region and be shaped into a discontinuous line in which the line-shaped sacrificial pattern may be discontinuous in the first direction and thus the discontinuous portion D may be prepared. For example, the second sacrificial mask pattern 104b' may include a sacrificial pattern body L1 that may extend along the first direction in parallel with the first sacrificial mask pattern 104a' and a connection portion L2 connected to the sacrificial pattern body L1 along the second direction.

The sacrificial pattern body L1 may be separated in the first direction by the discontinuous portion D and the discontinuous portion D may be formed in view of the cut-off portion C of the first line 114a. The connection portion L2 may be connected to an end portion of the sacrificial pattern body L1 around the discontinuous portion and may extend to the neighboring first sacrificial mask pattern 104a'. Thus, the first sacrificial mask pattern 104a' and the second sacrificial mask pattern 104b' may be connected to each other by the connection portion L2 like a shape of Greek letter 'π.'

A plurality of the third sacrificial mask patterns 104c may be spaced apart by the same gap distance in the second region of the substrate 100 and thus the line-shaped sacrificial pattern 104c and the gap space between the neighboring the sacrificial patterns 104c may be alternately arranged in the second direction.

Particularly, the sacrificial pattern body L1 of the second sacrificial mask pattern 104b' may be spaced apart from the first sacrificial mask pattern 104a' adjacent to the sacrificial pattern body L1 by a gap distance of 3F and may also be spaced apart from the third sacrificial mask pattern 104c adjacent to the sacrificial pattern body L1 by the same gap distance of 3F. In addition, the first sacrificial mask pattern 104a' may also be spaced apart from the third sacrificial mask pattern 104c by the same gap distance of 3F. That is, the gap space between the sacrificial pattern body L1, the second sacrificial pattern 104b' and the third sacrificial pattern 104c may have the gap distance of 3F.

Then, the spacer lines 106 may be formed on each sidewall of the first sacrificial mask pattern 104a', the sacrificial pattern body L1 and the connection portion L2 of the second sacrificial mask pattern 104b' and the third sacrificial mask pattern 104c. The spacer line 106 may be formed to have a width of F, and thus the gap spaces having the gap distance of 3F may be reduced into the spacer spaces 108 having the gap distance of F.

The mask pattern 110 may be formed on the target layer 102, the spacer lines 106 and the sacrificial mask patterns 104a', 104b', 104c. For example, the mask pattern 110 may have a width of about 2F and may partially cover the first spacer space 108a. By the same reasons as described with reference to FIG. 2B, the mask pattern 110 may be formed across the connection portion L2 in the first region at the alignment margin of about 1.5F.

Referring to FIG. 6B, the first, the second and the third sacrificial mask patterns 104a', 104b', 104c may be removed from the substrate 100 by the same process as described in detail with reference to FIG. 2C. Thereafter, the same process as described with reference to FIGS. 2D to 2F may be performed to a resultant structure of the substrate 100, thereby forming the third modification of the pattern structure 930 shown in FIG. 6C.

As illustrated in FIG. 6C, the third modification of the pattern structure 930 may be vertically symmetrical with respect to the pattern structure 900 shown in FIG. 1.

FIGS. 7A to 7D are plan views illustrating processing steps for a method of forming a fourth modification of the pattern structure when no connection portion is provided with the sacrificial mask pattern. In the present exemplary embodiment, the first line includes a single node-separated line having the cut-off portion and the position of the node-separated line is designated as an arrow in FIGS. 7A to 7D.

Figure 7A:
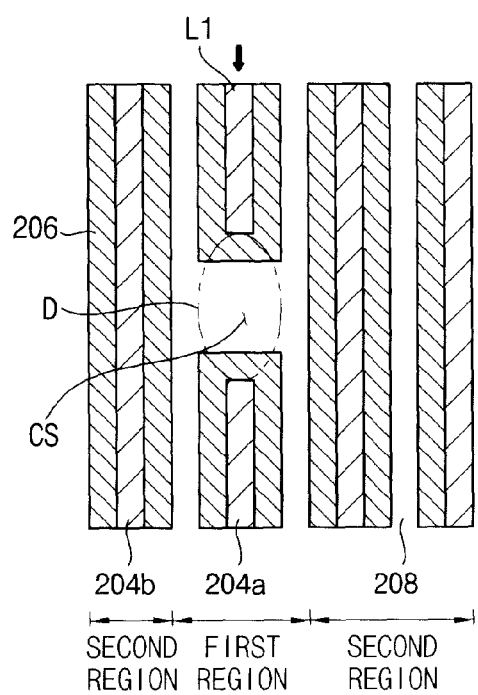
FIGS. 7A, 7B, 7C and 7D are plan views illustrating processing steps for a method of forming a fourth modification of the pattern structure when no connection portion is provided with the sacrificial mask pattern.

Referring to FIG. 7A, a substrate may be prepared and a first region and a second region may be defined on the substrate. A first line 214a in FIG. 7D having a cut-off portion C and a pair of second lines 214b in FIG. 7D adjacent to the first line 214a may be arranged in the first region of the substrate and a plurality of third lines 214c in FIG. 7D may be arranged in a line-and-space structure in the second region of the substrate.

A target layer (not illustrated) may be formed on the substrate and a sacrificial mask layer (not illustrated) may be formed on the target layer. The sacrificial mask layer may be patterned into a first sacrificial mask pattern 204a and a second sacrificial mask pattern 204b.

The first sacrificial mask pattern 204a may be formed in the first region of the substrate and may function as a mold for the first line 214a having the cut-off portion C. The second sacrificial mask pattern 204b may be formed in the second region of the substrate and may function as a mold for the third line 214c continuously extending in the first direction.

The first sacrificial mask pattern 204a may be formed into a discontinuous line along the first direction and thus may have a discontinuous portion D therein. The discontinuous portion D may be formed into the cut-off portion C of the first line 214a in a subsequent process. That is, the first sacrificial mask pattern 204a may include a sacrificial pattern body L1 without the connection portion as compared with the sacrificial mask pattern 104 shown in FIG. 2A.

A plurality of the second sacrificial mask patterns 204b may be shaped into lines extending in the first direction in parallel with the first sacrificial mask pattern 204a. The second sacrificial mask patterns 204b may be spaced apart by the same gap distance in the second region of the substrate and thus the line-shaped pattern and the gap space between the neighboring line-shaped patterns and may be alternately arranged on the substrate. That is, the second sacrificial mask patterns 204b may be arranged in a line-and-space structure on the substrate.

When the first to third lines 214a to 214c have a line width of F, the first and the second sacrificial mask patterns 204a, 204b may be spaced apart from each other by a gap distance of 3F and the neighboring second sacrificial mask patterns 204b may also be spaced apart from each another by the same gap distance of 3F.

Spacer lines 206 may be formed on sidewalls of the first and the second sacrificial mask patterns 204a, 204b. Thus, the gap spaces between the first and the second sacrificial mask patterns 204a, 204b may be reduced to spacer spaces 208 in such a manner that a width of the spacer line 206 may be substantially the same as the gap distance between the spacer lines 206. That is, both of the spacer line 206 and the spacer space 208 may be formed to have the same width of F. The first to third lines 214a to 214c may be formed on the substrate in accordance with the spacer space 108 and the first ands the second sacrificial mask patterns 204a, 204b.

Since the first sacrificial mask pattern 204a may be formed into a single discontinuous line having the discontinuous portion D and be in parallel with the line-shaped second sacrificial mask pattern 204b, the spacer space 208 between the first and second sacrificial mask patterns 204a, 204b may be interfacing with each other through the discontinuous portion D. Thus, the space corresponding to the discontinuous portion D is provided as a connection space CS for connecting the spacer spaces around the first sacrificial mask pattern 204a just like a capital letter 'H.'

Figure 7B:
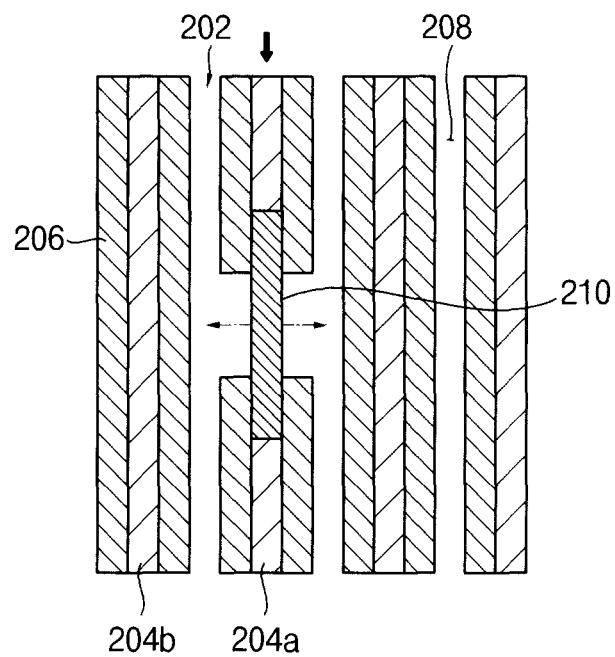

Referring to FIG. 7B, a mask layer (not illustrated) may be formed on a target layer 202 on which the spacer line 106 and the first and the second sacrificial mask patterns 204a, 204b may be arranged and thus the spacer line 206 and the first and the second sacrificial mask patterns 204a, 204b may be covered with the mask layer. For example, the mask layer may include a spin-on-hard (SOH) mask layer and a spin-on-photoresist layer that may be formed by a spin coating process.

A mask pattern 210 may be formed in the first region of the substrate by a photolithography process against the mask layer. In the present embodiment, the mask pattern 210 may be formed into a line shape extending along the first direction in such a manner that the mask pattern 210 may cross the connection space in the first direction. That is, the connection space CS may be partially covered with the mask pattern 210. Thus, both end portions of the mask pattern 210 may be aligned with an end portion of the first sacrificial mask pattern 204a.

Accordingly, the first sacrificial mask pattern 204a may be separated from each other by the discontinuous portion D and the H-shaped spacer space 208 between the first and the second sacrificial mask patterns 204a, 204b may be divided into two portions, which may be vertically symmetrical to each other with respect to the mask pattern 210, by the mask pattern 210.

In the present exemplary embodiment, the mask pattern 210 may have a width of F. Thus, when the mask pattern 210 may be correctly aligned with the first sacrificial mask pattern 204a, a left sidewall of the mask pattern 210 may be aligned with a left sidewall of the first sacrificial mask pattern 204a and a right sidewall of the mask pattern 210 may be aligned with a right sidewall of the first sacrificial mask pattern 204a.

However, since the spacer line 206 may have the width of F and the spacer space 208 may have the gap distance of F, some misalignment of the mask pattern 210 with respect to the first sacrificial mask pattern 204a leftwards or rightwards may have no effect on the formation of the first line having the cut-off portion C as long as the mask pattern 210 may cross the connection space CS. In the present exemplary embodiment, the mask pattern 210 may have an allowable alignment error range, or an alignment margin, of about 1.0F leftwards and rightwards from the correct alignment position.

Figure 7C:
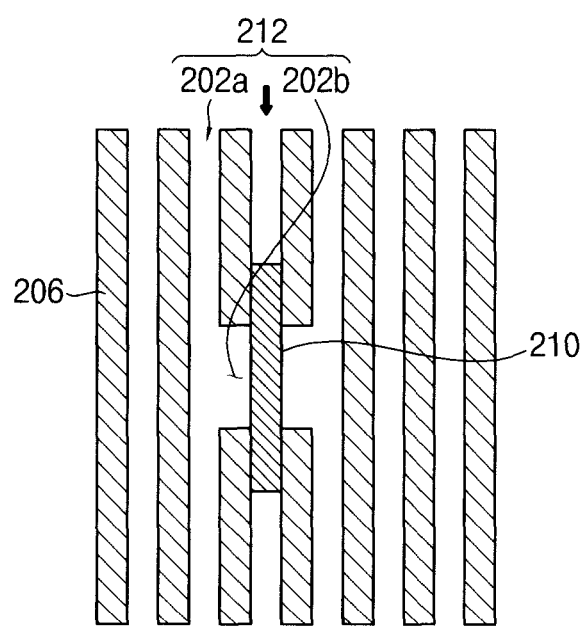

Referring to FIG. 7C, the first and the second sacrificial mask patterns 204a and 204b may be removed from the substrate by the same process as describe in detail with reference to FIG. 2C. In such a case, some of the first and the second sacrificial mask patterns 204a, 204b under the mask pattern 210 may still remain on the substrate due to the coverage of the mask pattern 210.

Thereafter, the same process as described with reference to FIGS. 2D to 2F may be performed on the substrate including the mask pattern 210, thereby forming the pattern structure shown in FIG. 7D. That is, the target layer may be formed into a target pattern 202a including the line-shaped opening or the trench 212. The opening 212 may include the vertical continuously line-shaped opening 212a continuously extending in the first direction and the horizontal discontinuously line-shaped opening 212b discontinuously extending in the second direction.

Figure 7D:
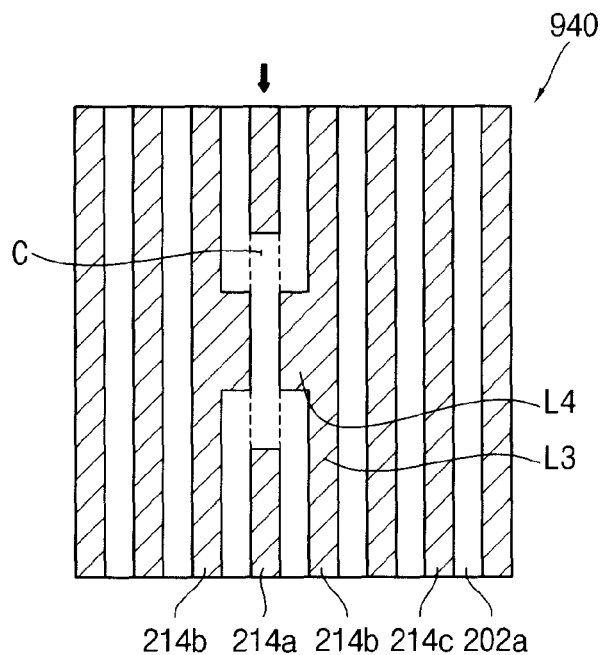

Referring to FIG. 7D, the fourth modification the pattern structure 940 may include the first, the second and the third lines 214a, 214b, 214c. The first line 214a may include a single separated line having the cut-off portion C and the second line 214b may include a pair of the continuous lines positioned at left and right sides of the first line 214a, respectively. A plurality of the third lines 214c may be arranged outside the second lines 214b and continuously extend in the first direction.

In the present exemplary embodiment, the first line 214a may be formed according to the shape of the first sacrificial mask pattern 204a and the second line 214b may be formed according to the spacer spaces and the connection space CS around the first line 214a. The second line 214b may include a line body L3 and a protrusion portion L4. The line body L3 may extend along the first direction in parallel with the first line 214a. The protrusion portion L4 may protrude from the line body L3 and may be directed to the first line 214a, particularly toward the cut-off portion C of the first line 214a. In case that the mask pattern 210 may be correctly aligned with the first sacrificial mask pattern 204a, the pair of the second lines 214b may be vertically symmetrical with respect to the first line 214a and thus a pair of the protrusion portions L4 facing each other may have the same protrusion length in the second direction. In contrast, in case that the mask pattern 210 may be misaligned with the first sacrificial mask pattern 204a within the alignment margin of 1.0F, the pair of the protrusion portions L4 may have different protrusion lengths. The third lines 214c may be shaped into a line extending in the first direction according to the shape of the removed second sacrificial mask pattern 204b. Thus, the third lines 214c may be spaced apart by the same gap distance in the second region of the substrate and thus the line-shaped pattern and the gap space between the neighboring line-shaped patterns and may be alternately arranged on the substrate. That is, the third lines 214c may be arranged in a line-and-space structure on the substrate.

According to the present exemplary embodiment, the pattern structure may be formed into a fine line shape having a single node-separated line by a double patterning process with an improved alignment margin of 1.0F. Particularly, the mask pattern for forming the single node-separated line may be formed by a photolithography process with the improved alignment margin of 1.0F. Thus, the first line of the pattern structure may be prevented from being separated at undesired positions and from not being separated at desired positions on the substrate, thereby preventing the process failures in the patterning process for forming the fine pattern structure.

FIGS. 8A to 8D are plan views illustrating processing steps for a method of forming a fifth modification of the pattern structure when no discontinuous portion is provided with the sacrificial mask pattern. In the present exemplary embodiment, the first line includes a single node-separated line having the cut-off portion and the position of the node-separated line is designated as an arrow in FIGS. 8A to 8D.

Figure 8A:
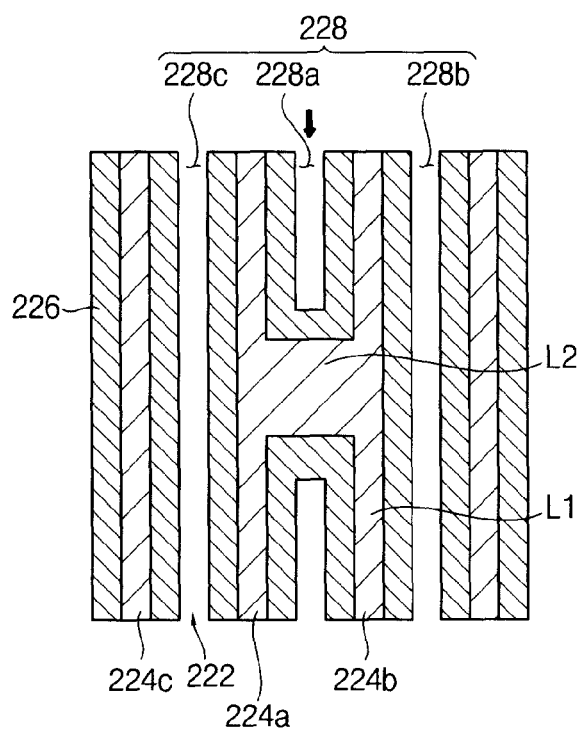
FIGS. 8A, 8B, 8C and 8D are plan views illustrating processing steps for a method of forming a fifth modification of the pattern structure when no discontinuous portion is provided with the sacrificial mask pattern.

Referring to FIG. 8A, a substrate may be prepared and a first region and a second region may be defined on the substrate. A target layer 222 may be formed on the substrate and a sacrificial mask layer (not illustrated) may be formed on the target layer 222. The sacrificial mask layer may be patterned into first to third sacrificial mask patterns 224a, 224b, 224c.

The first and second sacrificial mask patterns 224a, 224b may be formed in the first region of the substrate and may function as a mold for the second line 234b. The first line 234a may be formed according to a shape of the gap space between the first and second sacrificial mask patterns 224a, 224b. The third sacrificial pattern 224c may be formed in the second region of the substrate and may function as a mold for the third lines 234c.

The first sacrificial mask pattern 224a may be formed into a line continuously extending in the first direction. The second sacrificial mask pattern 224b may include a sacrificial pattern body L1 that may continuously extend in parallel with the first sacrificial pattern 224a in the first direction without any discontinuous portions and a single connection portion L2 that may be connected to the first sacrificial mask pattern 224a. The connection portion L2 may be formed into a single horizontal bars that is connected with the first sacrificial mask pattern 224a and the sacrificial pattern body L1. Thus, the first and the second sacrificial mask patterns 244a, 224b may be formed to a shape of the capital letter 'H.'

The third sacrificial mask patterns 224c may be formed into a plurality of lines that may be arranged at both sides of the H-shaped assembly of the first and the second sacrificial mask patterns 224a, 224b and continuously extend in the first direction. The third sacrificial mask patterns 224c may be have a uniform width and a uniform gap distance. For example, the first to third sacrificial mask patterns 224a, 224b, 224c may have the same width of F and the same gap distance of 3F.

Spacer lines 226 may be formed on sidewalls of the first to the third sacrificial mask patterns 224a, 224b, 224c. Thus, the gap spaces between the first to the third sacrificial mask patterns 224a, 224b, 224c may be reduced to spacer spaces 228 in such a manner that a width of the spacer line 226 may be substantially the same as the gap distance between the spacer lines 226. That is, both of the spacer line 226 and the spacer space 228 may be formed to have the same width of F. The first to third lines 234a, 234b, 234c may be formed on the substrate in accordance with the spacer spaces 228 and the first to the third sacrificial mask patterns 224a, 224b, 224c. In the present exemplary embodiment, the spacer spaces 228 may include a first spacer space 228a between the first and the second sacrificial mask patterns 224a, 224b, a second spacer space 228b between the second sacrificial mask pattern 224b and the third sacrificial mask pattern 224c and a third spacer space 228c between the first and the third sacrificial mask pattern 224a, 224c.

Figure 8B:
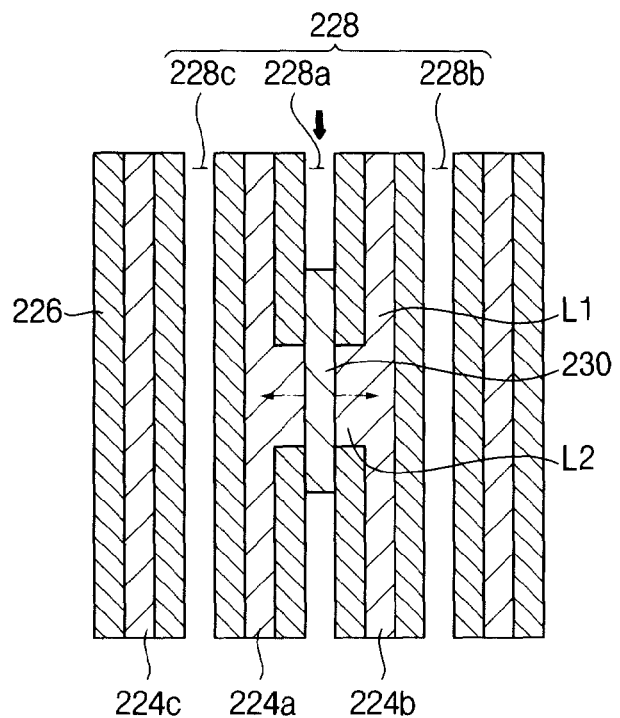

Referring to FIG. 8B, a mask layer (not illustrated) may be formed on the target layer 222 on which the spacer line 226 and the sacrificial mask patterns 224a, 224b, 224c may be arranged and thus the spacer line 226 and the sacrificial mask patterns 224a, 224c may be covered with the mask layer. For example, the mask layer may include a spin-on-hard (SOH) mask layer and a spin-on-photoresist layer that may be formed by a spin coating process.

A mask pattern 230 may be formed in the first region of the substrate 100 by a photolithography process against the mask layer. In the present embodiment, the mask pattern 230 may be formed into a line shape extending along the first direction in such a manner that the mask pattern 230 may cross the connection portion L2 of the second sacrificial mask pattern 224b and both end portions of the mask pattern 230 may be aligned with the first spacer space 228a.

Accordingly, the H-shaped assembly of the first and the second sacrificial mask patterns 224a, 224b may be separated from each other by the mask pattern 230 and thus the first sacrificial mask pattern 224a may be separated from the sacrificial pattern body L1 of the second sacrificial mask pattern 224b.

In the present exemplary embodiment, the mask pattern 230 may have a width of F. Thus, when the mask pattern 230 may be correctly aligned with the first spacer space 228a, the mask pattern 230 may cross a central portion of connection portion L2 of the second sacrificial mask pattern 224b and a half of the connection portion L2 may be connected to the first sacrificial mask pattern 224a and the sacrificial pattern body L1. Therefore, the lines corresponding to the first and second sacrificial mask patterns may be sufficiently separated to thereby prevent the bridge failures.

However, since the spacer line 226 may have the width of F and the sacrificial pattern body L1 and the first sacrificial mask pattern 224a may also have the width of F, some misalignment of the mask pattern 230 with respect to the first spacer space 228a leftwards or rightwards may have no effect on the formation of the first line 234a having the cut-off portion C and the formation of the of the no-bridged lines as the second line 234b as long as the mask pattern 230 may cross the connection portion L2. Thus, the mask pattern 230 may have an alignment margin of 1.0F leftwards and rightwards from the correct alignment position.

Figure 8C:
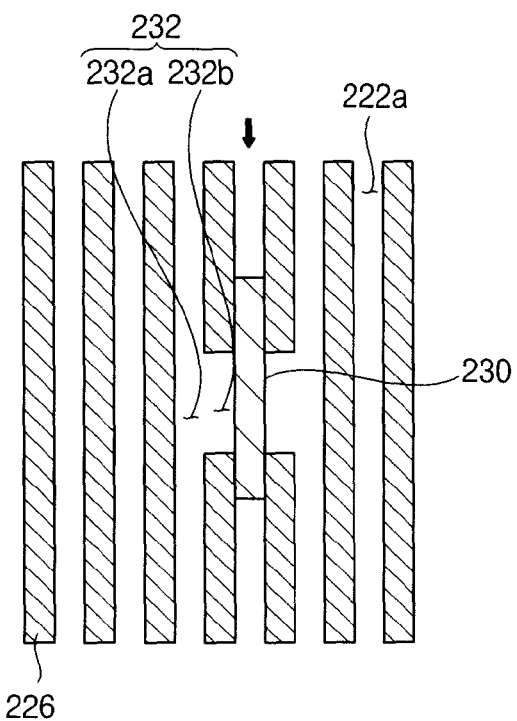

Referring to FIG. 8C, the first to the third sacrificial mask patterns 224a, 224b, 224c may be removed from the target layer by the same process as describe in detail with reference to FIG. 2C. In such a case, some of the second sacrificial mask patterns 224b under the mask pattern 230 may still remain on the substrate due to the coverage of the mask pattern 230.

Thereafter, the same process as described with reference to FIGS. 2D to 2F may be performed on the substrate including the mask pattern 230, thereby forming the pattern structure shown in FIG. 8D. The target layer may be formed into a target pattern 222a including a line shaped opening or a trench 232. The opening 232 may include the vertical continuously line-shaped opening 232a and the horizontal discontinuously line-shaped opening 232b.

Figure 8D:
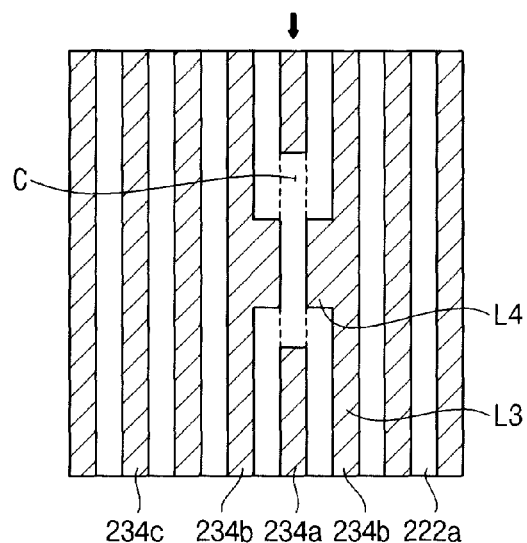

Referring to FIG. 8D, the fifth modification the pattern structure 950 may include the first, the second and the third lines 234a, 234b, 234c. The first line 234a may include a single separated line having the cut-off portion C and the second line 234b may include a pair of the continuous lines positioned at left and right sides of the first line 234a, respectively. A plurality of the third lines 234c may be arranged outside the second lines 234b and continuously extend in the first direction. The fifth modification of the pattern structure may have substantially the same shape as the fourth modification of the pattern structure shown in FIG. 7D.

FIGS. 9A to 9D are plan views illustrating processing steps for a method of forming a sixth modification of the pattern structure when no discontinuous portion is provided with the sacrificial mask pattern. In the present exemplary embodiment, the first line includes three node-separated lines having the cut-off portion and the positions of the node-separated lines are designated as arrows in FIGS. 9A to 9D.

Figure 9A:
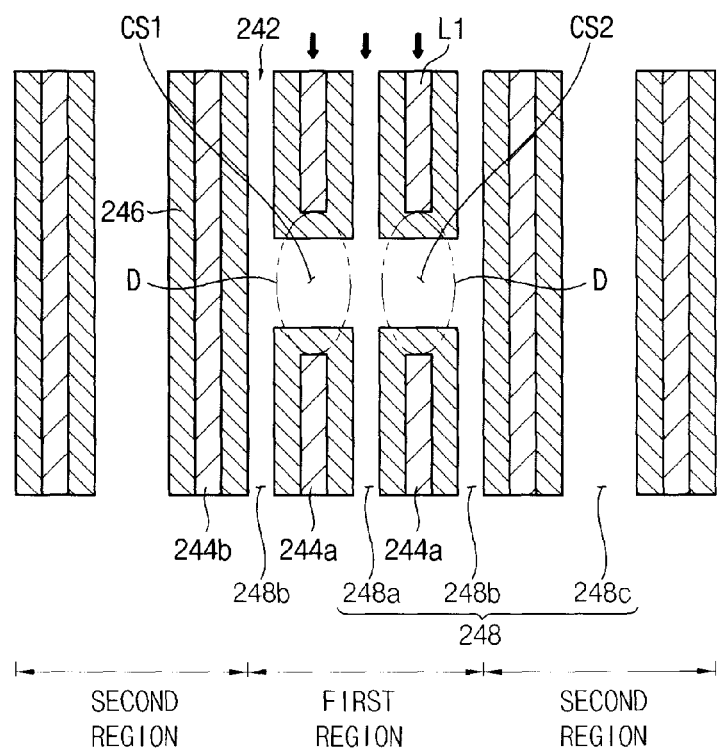
FIGS. 9A, 9B, 9C and 9D are plan views illustrating processing steps for a method of forming a sixth modification of the pattern structure when no discontinuous portion is provided with the sacrificial mask pattern.

Referring to FIG. 9A, a substrate may be prepared and a first region and a second region may be defined on the substrate 100. First line 254a in FIG. 9D having cut-off portions C and a pair of second lines 254b in FIG. 9D adjacent to the first lines 254a may be arranged in the first region of the substrate 100 and a plurality of third lines 254c in FIG. 9D may be arranged in a line-and-space structure in the second region of the substrate 100.

A target layer 242 may be formed on the substrate 100 and a sacrificial mask layer (not illustrated) may be formed on the target layer 242. The sacrificial mask layer may be patterned into a first sacrificial mask pattern 244a and a second sacrificial mask pattern 244b.

The first sacrificial mask pattern 244a may be formed in the first region of the substrate 100 and may function as a mold for the first lines 254a having the cut-off portion C. The second sacrificial mask pattern 244b may be formed in the second region of the substrate and may function as a mold for the third line 254c continuously extending in the first direction.

The first sacrificial mask pattern 244a may be formed into a pair of discontinuous lines along the first direction and thus may have a pair of discontinuous portions D therein. Particularly, the first sacrificial mask pattern 244a may be formed into left and right discontinuous lines extending in the first direction and thus the discontinuity portion D may be formed at each of the left and right discontinuous lines. Each of the first sacrificial mask pattern 244a may include a sacrificial pattern body L1 without the connection portion as compared with the sacrificial mask pattern 104 shown in FIG. 2A.

A plurality of the second sacrificial mask patterns 244b may be shaped into lines extending in the first direction in parallel with the first sacrificial mask pattern 244a. The second sacrificial mask patterns 244b may be spaced apart by the same gap distance in the second region of the substrate 100 and thus the line-shaped pattern and the gap space between the neighboring line-shaped patterns and may be alternately arranged on the substrate 100. That is, the second sacrificial mask patterns 244b may be arranged in a line-and-space structure on the substrate.

When the first to third lines 254a, 254b, 254c is formed to a line width of F, the first and the second sacrificial mask patterns 204a, 204b may be formed to be spaced apart from each other by a gap distance of 3F and the neighboring second sacrificial mask patterns 204b may also be formed to be spaced apart from each another by the same gap distance of 3F.

Spacer lines 246 may be formed on sidewalls of the first and the second sacrificial mask patterns 244a, 244b. Thus, the gap spaces between the first and the second sacrificial mask patterns 244a, 244b may be reduced to spacer spaces 248 in such a manner that a width of the spacer line 246 may be substantially the same as the gap distance between the spacer lines 246. That is, both of the spacer line 246 and the spacer space 248 may have the same width of F. The first to third lines 214a, 214b, 214c may be formed on the substrate in accordance with the spacer space 248 and the first and the second sacrificial mask patterns 244a, 244b.

Since the first sacrificial mask pattern 244a may be formed into a pair of discontinuous lines and be spaced apart from and in parallel with the line-shaped second sacrificial mask pattern 244b, the spacer space 248 may include a node separation spacer space 248a between the pair of the discontinuous lines of the first sacrificial mask pattern 244a, a pair of first spacer spaces between the first and the second sacrificial mask patterns 244a, 244b and a plurality of third spacer spaces 248c between the third sacrificial mask patterns 244c. Particularly, the node separation spacer space 248a and the first spacer space 248b may be interfacing with each other through the pair of the discontinuous portions D. Thus, the spaces corresponding to the discontinuous portions D is provided as first and second connection spaces CS1, CS2 for connecting the node separation spacer with the first spacer space 248b just like a folded capital letter 'H.'

Figure 9B:
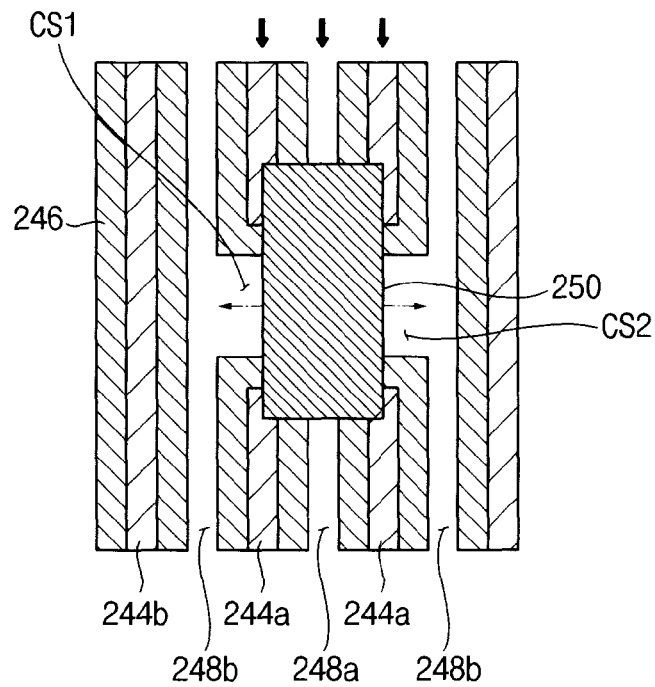

Referring to FIG. 9B, a mask layer (not illustrated) may be formed on a target layer 242 on which the spacer line 246 and the first and the second sacrificial mask patterns 244a, 244b may be arranged and thus the spacer line 246 and the first and the second sacrificial mask patterns 244a, 244b may be covered with the mask layer. For example, the mask layer may include a spin-on-hard (SOH) mask layer and a spin-on-photoresist layer that may be formed by a spin coating process.

A mask pattern 250 may be formed in the first region of the substrate by a photolithography process against the mask layer. In the present embodiment, the mask pattern 250 may be formed into a line shape extending along the first direction in such a manner that the mask pattern 250 may cover the node separation space 248a and cross at least one of the connection spaces CS1, CS2. That is, the connection space CS1, CS2 may be partially covered with the mask pattern 250 and both end portions of the mask pattern 250 may be aligned with end portions of the discontinuous lines of the first sacrificial mask pattern 244a.

Accordingly, the first sacrificial mask pattern 244a may be separated from each other by the discontinuous portion D and the double H-shaped spacer spaces 248a, 248b between the first and the second sacrificial mask patterns 244a, 244b may be divided into two portions, which may be vertically symmetrical to each other with respect to the mask pattern 210, by the mask pattern 250.

In the present exemplary embodiment, the mask pattern 250 may have a width of 4F. Thus, when the mask pattern 250 may be correctly aligned with the node separation spacer space 248a, a left sidewall of the mask pattern 250 may be aligned with a central portion of a left discontinuous line of the first sacrificial mask pattern 244a and a right sidewall of the mask pattern 250 may be aligned with a central portion of a right discontinuous line of the first sacrificial mask pattern 244a.

However, since the first sacrificial mask pattern 244a may be separated by the discontinuity portions D, some misalignment of the mask pattern 250 with respect to the node separation spacer space 248a leftwards or rightwards may have no effect on the formation of the first line 254a having the cut-off portion C as long as the mask pattern 250 may cover the node separation spacer space 248a and cross the connection spaces CS1, 2. In the present exemplary embodiment, the mask pattern 250 may have an allowable error range, or an alignment margin, of about 1.5F leftwards and rightwards from the correct alignment position.

Figure 9C:
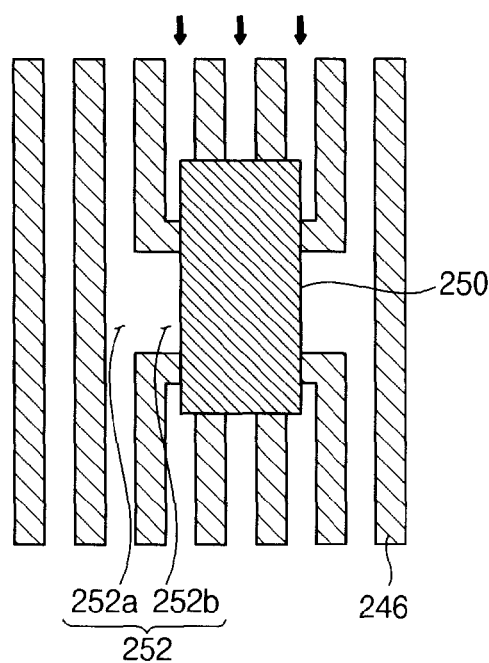

Referring to FIG. 9C, the first and the second sacrificial mask patterns 244a, 244b may be removed from the target layer 242 by the same process as describe in detail with reference to FIG. 2C. In such a case, some of the first and the second sacrificial mask patterns 244a, 244b under the mask pattern 250 may still remain on the substrate due to the coverage of the mask pattern 250.

Thereafter, the same process as described with reference to FIGS. 2D to 2F may be performed on the substrate including the mask pattern 250, thereby forming the pattern structure shown in FIG. 9D. That is, the target layer 242 may be formed into a target pattern 242a including a line-shaped opening or a trench 252. The opening 252 may include the vertical continuously line-shaped opening 252a continuously extending in the first direction and the horizontal discontinuously line-shaped opening 252b discontinuously extending in the second direction.

Figure 9D:
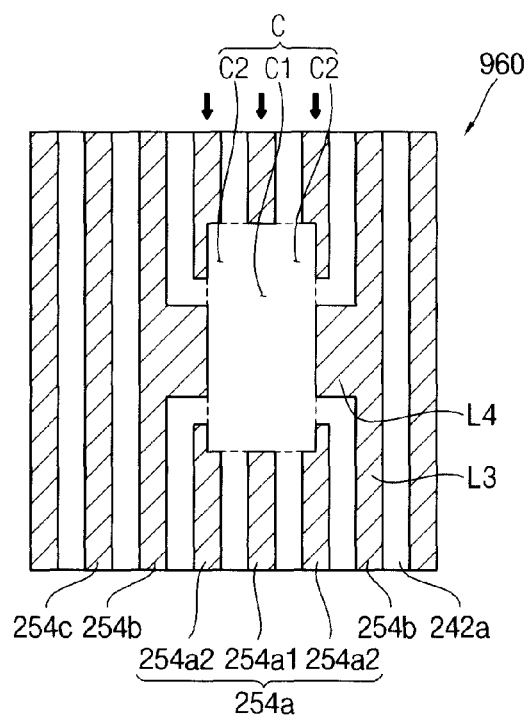

Referring to FIG. 9D, the sixth modification the pattern structure 960 may include the first, the second and the third lines 254a, 254b, 254c. The first line 254a may include three separated lines 254a1, 254a2 having the cut-off portion C and the second line 254b may include a pair of the continuous lines positioned at left and right sides of the first line 254a, respectively. A plurality of the third lines 254c may be arranged outside the second lines 254b and continuously extend in the first direction.

In the present exemplary embodiment, the first line 254a may include a central separated line 254a1 having a full cut-off portion C1 and a pair of lateral lines 254a2 having a partially removal portion C2. The central line 254a1 may be formed according to the node separation spacer space 248a and the lateral lines 254a2 may be formed according to the pair of the discontinuous lines of the first sacrificial mask pattern 244a. The second line 254b may include a line body L3 and a protrusion portion L4. The line body L3 may extend along the first direction in parallel with the first line 254a. The protrusion portion L4 may protrude from the line body L3 and may be directed to the first line 254a, particularly toward the cut-off portion C of the first line 254a. In case that the mask pattern 250 may be correctly aligned with the node separation spacer space 248a, the pair of the second lines 254b may be vertically symmetrical with respect to the central line 254a1 and thus a pair of the protrusion portions L4 facing each other may have the same protrusion length in the second direction. In contrast, in case that the mask pattern 250 may be misaligned with the node separation spacer space 248a within the alignment margin of 1.5F, the pair of the protrusion portions L4 may have different protrusion lengths. The third lines 254c may be shaped into a line extending in the first direction according to the shape of the removed second sacrificial mask pattern 254b and the shape of the third spacer spaces 248c between the second sacrificial mask patterns 244b. Thus, the third lines 254c may be arranged in a line-and-space structure on the substrate.

Accordingly, the sixth modification of the pattern structure 960 may be formed into a fine line shape having three node-separated lines by a double patterning process with an improved alignment margin of 1.5F. Particularly, the mask pattern for forming the three node-separated lines may be formed by a photolithography process with the improved alignment margin of 1.5F. Thus, the first line of the pattern structure may be prevented from being separated at undesired positions and from not being separated at desired positions on the substrate, thereby preventing the process failures in the patterning process for forming the fine pattern structure.

FIGS. 10A to 10D are plan views illustrating processing steps for a method of forming a seventh modification of the pattern structure when no discontinuous portion is provided with the sacrificial mask pattern. In the present exemplary embodiment, the first line includes three lines having the cut-off portion as the node-separated lines and the position of the node-separated lines are designated as arrows in FIGS. 10A to 10D.

Figure 10A:
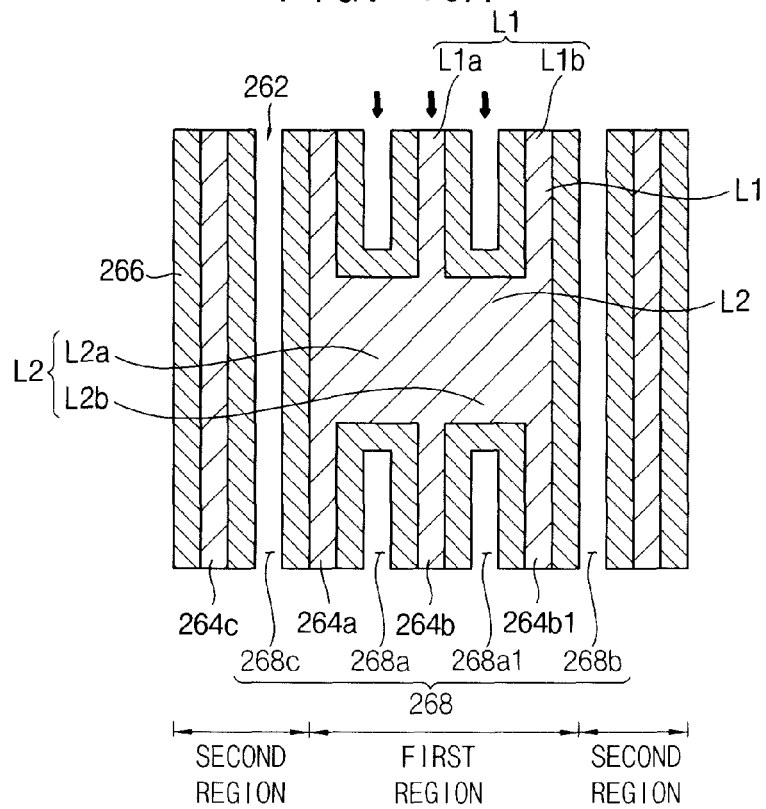
FIGS. 10A, 10B, 10C and 10D are plan views illustrating processing steps for a method of forming a seventh modification of the pattern structure when no discontinuous portion is provided with the sacrificial mask pattern.

Referring to FIG. 10A, the substrate 100 may be prepared and a first region and a second region may be defined on the substrate. A target layer 262 may be formed on the substrate 100 and a sacrificial mask layer (not illustrated) may be formed on the target layer 262. The sacrificial mask layer may be patterned into a first sacrificial mask pattern 264a, a second sacrificial mask pattern 264b including the supplementary sacrificial mask pattern 264b1 and a third sacrificial mask patterns 264c.

The first and second sacrificial mask patterns 264a, 264b may be formed in the first region of the substrate 100 and may function as a mold for the three node-separated lines 274a and the second line 274b. The third sacrificial pattern 264c may be formed in the second region of the substrate 100 and may function as a mold for the third lines 274c.

The first sacrificial mask pattern 264a may be formed into a line continuously extending in the first direction. The second sacrificial mask pattern 264b may be formed into a pair of pattern bodies L1a, L1b and a pair of first and second connection portions L2a, L2b. Thus, the second sacrificial mask pattern 264b may include a sacrificial pattern body L1a and a supplementary pattern body L1b may continuously extend in the first direction without any discontinuous portions and first and second connection portions L2a, L2b. The sacrificial pattern body L1a and the supplementary pattern body L1b may be in parallel with each other and the first sacrificial pattern 224a. The first connection portion L2a may connect the first sacrificial mask pattern 264a to the sacrificial pattern body L1a and the second connection portion L2b may connect the sacrificial pattern body L1a to the supplementary pattern body L1b. The first and second connection portions L2a, L2b may be formed into a single horizontal bar extending in the second direction and thus the first and the second sacrificial mask patterns 264a, 264b may be formed to a shape of the double capital letter 'H.'

The third sacrificial mask patterns 264c may be formed into a plurality of lines that may be arranged at both sides of the double H-shaped assembly of the first and the second sacrificial mask patterns 264a, 264b and continuously extend in the first direction. The third sacrificial mask patterns 264c may be have a uniform width and a uniform gap distance. For example, the first to third sacrificial mask patterns 264a to 264c may have the same width of F and the same gap distance of 3F.

Spacer lines 266 may be formed on sidewalls of the first to the third sacrificial mask patterns 264a to 264c. Thus, the gap spaces between the first to the third sacrificial mask patterns 264a to 264c may be reduced to spacer spaces 268 in such a manner that a width of the spacer line 266 may be substantially the same as the gap distance between the spacer lines 266. That is, both of the spacer line 266 and the spacer space 268 may be formed to have the same width of F. The first to third lines 274a, 274b, 274c may be formed on the substrate 100 in accordance with the spacer spaces 268 and the first to the third sacrificial mask patterns 264a to 264c.

In the present exemplary embodiment, the spacer spaces 268 may include a first spacer space 268a between the first and the second sacrificial mask patterns 264a, 264b including a supplementary spacer space 268a1, a second spacer space 268b between the second sacrificial mask pattern 264b and the third sacrificial mask pattern 264c and a third spacer space 268c between the first and the third sacrificial mask pattern 264a, 264c. The supplementary spacer space 268a1 may be prepared between the sacrificial pattern body L1a and the supplementary pattern body L1b.

Figure 10B:
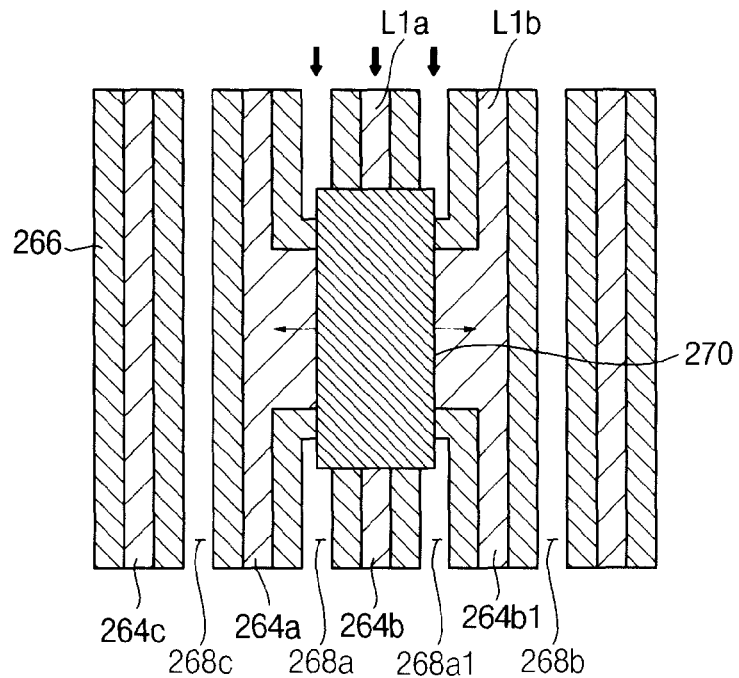

Referring to FIG. 10B, a mask layer (not illustrated) may be formed on the target layer 262 on which the spacer line 266 and the sacrificial mask patterns 264a, 264b, 264c may be arranged and thus the spacer line 266 and the sacrificial mask patterns 264a, 264c may be covered with the mask layer. For example, the mask layer may include a spin-on-hard (SOH) mask layer and a spin-on-photoresist layer that may be formed by a spin coating process.

A mask pattern 270 may be formed in the first region of the substrate 100 by a photolithography process against the mask layer. In the present embodiment, the mask pattern 270 may be formed into a line shape extending along the first direction in such a manner that the mask pattern 270 may cover the sacrificial pattern body L1a and simultaneously cross the first ands second connection portions L2a, L2b and both end portions of the mask pattern 270 may be aligned with the sacrificial pattern body L1a.

Accordingly, the double H-shaped assembly of the first and the second sacrificial mask patterns 264a, 264b may be separated from each other by the mask pattern 270 and thus the first sacrificial mask pattern 264a, the sacrificial pattern body L1a and the supplementary pattern body L1b of the second sacrificial mask pattern 264b may be separated from one another.

In the present exemplary embodiment, the mask pattern 270 may have a width of 4F. Thus, when the mask pattern 270 may be correctly aligned with the sacrificial pattern body L1a of the second sacrificial mask pattern 264b, a left sidewall of the mask pattern 270 may be aligned with a central portion of a left discontinuous line of the first spacer space 268a and a right sidewall of the mask pattern 270 may be aligned with a central portion of the supplementary spacer space 268a1.

However, since the first spacer space and the supplementary spacer space 268a, 268a1 may be separated by the first and second connection portions L2a, L2b, some misalignment of the mask pattern 270 with respect to the sacrificial pattern body L1a leftwards or rightwards may have no effect on the formation of the first line 274a having the cut-off portion C as long as the mask pattern 270 may cover the sacrificial pattern body L1a and cross the first connection portions L2a, L2b. In the present exemplary embodiment, the mask pattern 270 may have an allowable error range, or an alignment margin, of about 1.5F leftwards and rightwards from the correct alignment position.

Figure 10C:
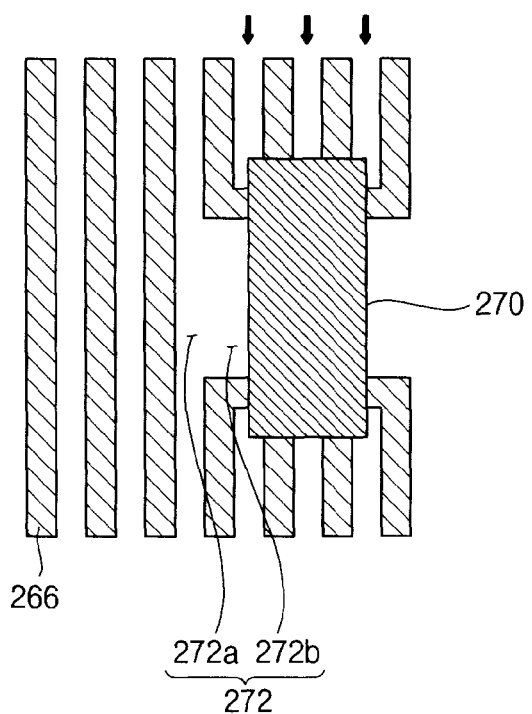

Referring to FIG. 10C, the first to the third sacrificial mask patterns 264a, 264b, 264c may be removed from the target layer 262 by the same process as describe in detail with reference to FIG. 2C. In such a case, some of the first and the second sacrificial mask patterns 264a, 264b under the mask pattern 270 may still remain on the substrate due to the coverage of the mask pattern 270.

Thereafter, the same process as described with reference to FIGS. 2D to 2F may be performed on the substrate including the mask pattern 270, thereby forming the pattern structure shown in FIG. 10D. That is, the target layer 262 may be formed into a target pattern 262a including a line-shaped opening or a trench 272. The opening 272 may include the vertical continuously line-shaped opening 272a continuously extending in the first direction and the horizontal discontinuously line-shaped opening 272b discontinuously extending in the second direction.

Figure 10D:
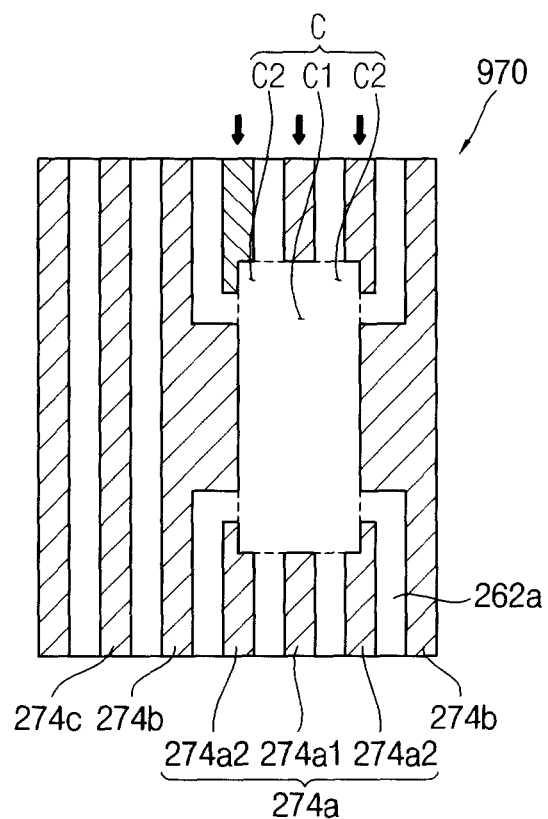

Referring to FIG. 10D, the sixth modification the pattern structure 970 may include the first, the second and the third lines 274a, 274b, 274c. The first line 274a may include three separated lines 274a1, 274a2 having the cut-off portion C and the second line 274b may include a pair of the continuous lines positioned at left and right sides of the first line 274a, respectively. A plurality of the third lines 274c may be arranged outside the second lines 274b and continuously extend in the first direction.

In the present exemplary embodiment, the first line 274a may include a central separated line 274a1 having a full cut-off portion C1 and a pair of lateral lines 274a2 having a partially removal portion C2. The central line 274a1 may be formed according to the sacrificial pattern body L1a and the lateral lines 274a2 may be formed according to the first spacer space 268a and the supplementary spacer space 268a1. The second line 274b may include a line body L3 and a protrusion portion L4. The line body L3 may extend along the first direction in parallel with the first line 274a. The protrusion portion L4 may protrude from the line body L3 and may be directed to the first line 274a, particularly toward the cut-off portion C of the first line 274a. In case that the mask pattern 270 may be correctly aligned with the sacrificial pattern body L1a, the pair of the second lines 274b may be vertically symmetrical with respect to the central line 274a1 and thus a pair of the protrusion portions L4 facing each other may have the same protrusion length in the second direction. In contrast, in case that the mask pattern 270 may be misaligned with the sacrificial pattern body L1a within the alignment margin of 1.5F, the pair of the protrusion portions L4 may have different protrusion lengths. The third lines 274c may be shaped into a line extending in the first direction according to the shape of the removed third sacrificial mask pattern 254c and the shape of the third spacer spaces 268c between the third sacrificial mask patterns 254c. Thus, the third lines 274c may be arranged in a line-and-space structure on the substrate.

Accordingly, the seventh modification of the pattern structure 970 may be formed into a fine line shape having three node-separated lines by a double patterning process with an improved alignment margin of 1.5F. Particularly, the mask pattern for forming the three node-separated lines may be formed by a photolithography process with the improved alignment margin of 1.5F. Thus, the first line of the pattern structure may be prevented from being separated at undesired positions and from not being separated at desired positions on the substrate, thereby preventing the process failures in the patterning process for forming the fine pattern structure.

Embodiment II

FIGS. 11A to 11F are plan views illustrating processing steps for a method of forming a pattern structure for a semiconductor device in accordance with a second exemplary embodiment of the present inventive concept. FIGS. 12A to 12F are cross-sectional views illustrating processing steps for a method of forming the pattern structure illustrated in FIG. 11F. The cross-sectional views in FIGS. 12A to 12F are cut along a line II-II' of the pattern structure in FIG. 11B.

The pattern structure 1000 of the second exemplary embodiment includes a pair of node-separated lines wherein a self-aligned process helps alignment margin.

Figure 11A:
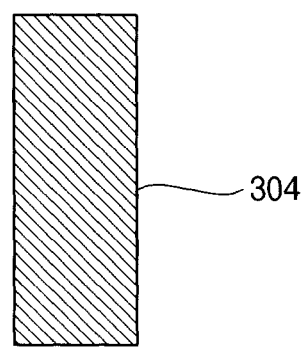
FIGS. 11A, 11B, 11C, 11D, 11E and 11F are plan views illustrating processing steps for a method of forming a pattern structure for a semiconductor device in accordance with a second exemplary embodiment of the present inventive concept.
Figure 11F:
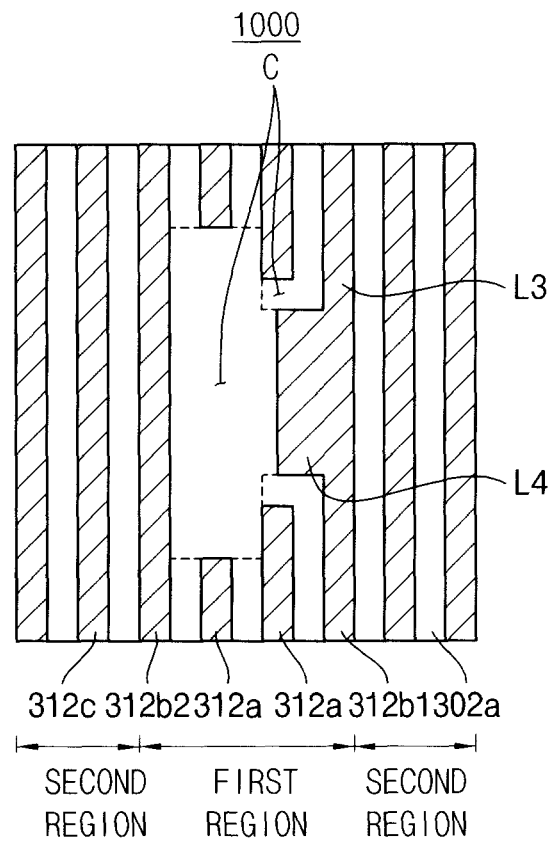
Figure 12A:
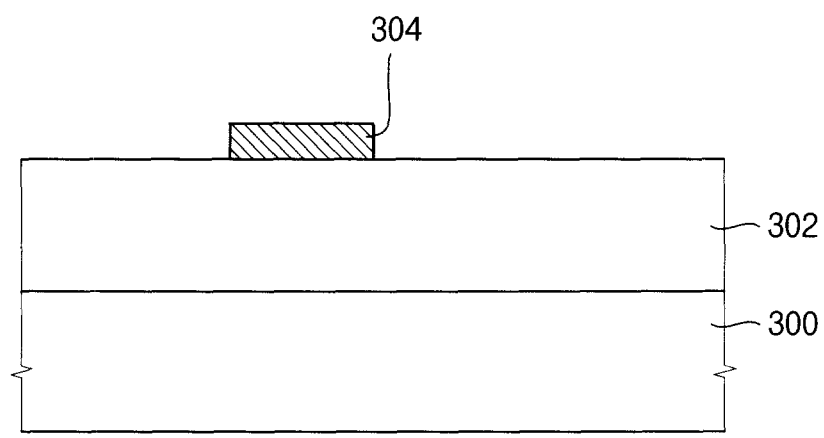
FIGS. 12A, 12B, 12C, 12D, 12E and 12F are cross-sectional views illustrating processing steps for a method of forming the pattern structure illustrated in FIG. 11E.

Referring to FIGS. 11A and 12A, a substrate 300 may be prepared and a first region and a second region may be defined on the substrate 300. First lines 312a in FIG. 11F each of which may have a cut-off portion C and a pair of second lines 312b in FIG. 11F adjacent to the first lines 312a may be arranged in the first region of the substrate 300 and a plurality of third lines 312c in FIG. 11F may be arranged in a line-and-space structure in the second region of the substrate 300 in accordance with the following processing steps.

A target layer 302 may be formed on the substrate 300. For example, the target layer 302 may include an insulation layer comprising one of silicon oxide and silicon nitride. Alternatively, no additional layer may be provided as the target layer and the substrate 300 may be provided as the target layer.

A hard mask layer (not illustrated) may be formed on the target layer 302 and may have an etching selectivity with respect to the target layer 302. Thus, the hard mask layer may comprise silicon nitride, silicon oxynitride or polysilicon. In the present exemplary embodiment, the hard mask layer may comprise silicon nitride.

The hard mask layer may be patterned into a preliminary hard mask pattern 304. The preliminary hard mask pattern 304 may be positioned at the first region of the substrate 300 in which the line is to be separated for node separation. In the present exemplary embodiment, the preliminary hard mask pattern 304 may be formed into a pad having a width of 4F and the first, the second and the third lines 312a, 312b, 312c may have a width of F, respectively.

Figure 11B:
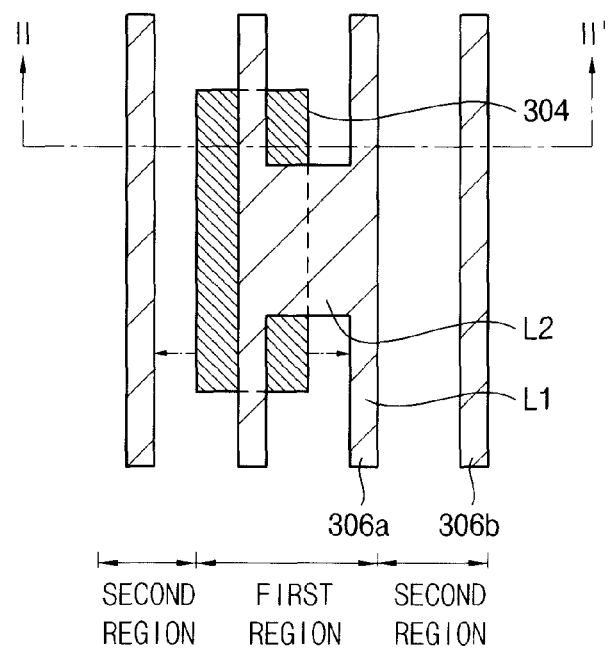
Figure 12B:
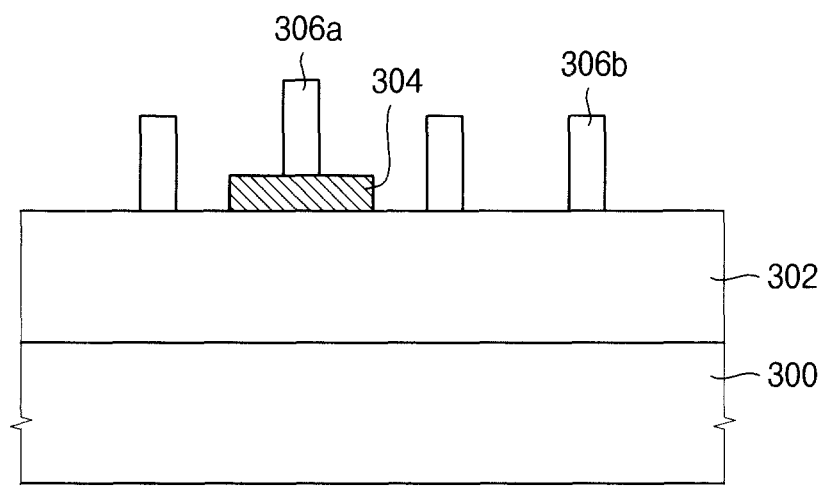

Referring to FIGS. 11B and 12B, a sacrificial mask layer (not illustrated) may be formed on the target layer 302 on which the preliminary hard mask pattern 304 may be arranged. In the present exemplary embodiment, the sacrificial mask layer may comprise one of spin-on-hard mask and photoresist material. The sacrificial mask layer may be patterned into a first sacrificial mask pattern 306a and a second sacrificial mask pattern 306b.

The first sacrificial mask pattern 306a may be formed in the first region of the substrate 300 and may function as a mold for the first lines 312a having the cut-off portion C and the second line 312b adjacent to the first lines 312a. The second sacrificial mask pattern 306b may be formed in the second region of the substrate 300 and may function as a mold for the third lines 312c that may continuously extend in the first direction.

The first sacrificial mask pattern 306a may include a sacrificial pattern body L1 that may be shaped into a pair of lines extending in the first direction and a connection portion L2 that may be shaped into a linear pad extending in a second direction substantially perpendicular to the first direction and connected to the sacrificial pattern body L1. The pair of the lines of the sacrificial pattern body L1 may be vertically symmetrical with each other and may extend in the first direction. The connection portion L2 may be interposed between the pair of the lines and may be connected to the both of the lines of the sacrificial pattern body L1 along the second direction. Thus, the first sacrificial mask pattern 306a may be shaped into the capital letter 'H' together with the line-shaped sacrificial pattern body L1 and the line-shaped connection portion L2. The sacrificial pattern body L1 of the first sacrificial mask pattern 306a may have a line width of F and the pair of the lines of the sacrificial pattern body L1 may be spaced apart by a gap distance of 3F.

In the present exemplary embodiment, the left side line of the sacrificial pattern body L1 may be aligned with a central line of the preliminary hard mask pattern 304, which is referred to as correct alignment of the first sacrificial mask pattern 306a with respect to the preliminary hard mask pattern 304. Particularly, the first sacrificial mask pattern 306a may have an alignment margin of 1.5F leftwards or rightwards from the position of the correct alignment, and thus the cut-off portion C of the pattern structure may be correctly formed at desired positions on the substrate 300 although the first sacrificial mask pattern 306a may be positioned off from the correct alignment position leftwards or rightwards as long as the off-position may be within the alignment margin of 1.5F.

The second sacrificial mask pattern 306b may be formed in the second region of the substrate 300 and may function as a mold for the third line. For example, a plurality of the second sacrificial mask patterns 306b may be shaped into lines extending in the first direction in parallel with the line of the sacrificial pattern body L1 and having a width of F. In addition, the second sacrificial mask patterns 306b may be spaced apart by a gap distance of 3F, thus the second sacrificial mask patterns 306b may be arranged in a line-and-space structure on the substrate 300.

Figure 11C:
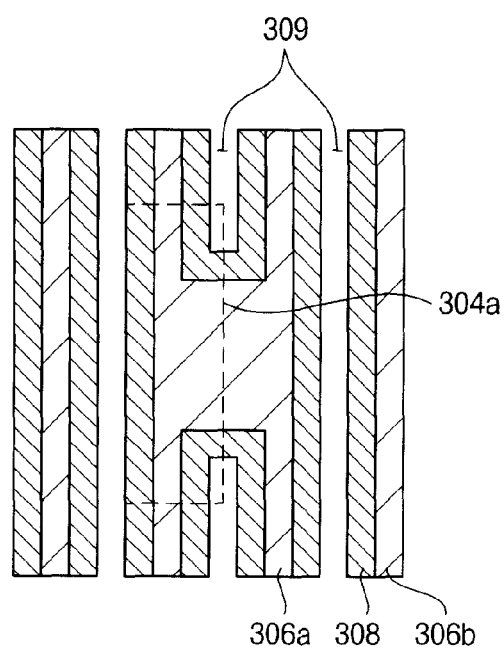
Figure 12C:
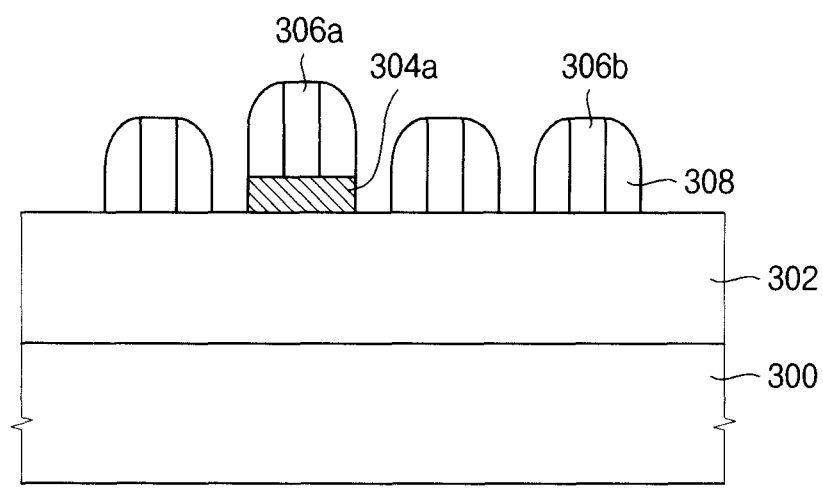

Referring to FIGS. 11C and 12C, a spacer layer (not illustrated) may be formed on the target layer 302 along a surface profile of the preliminary hard mask pattern 304 and the first and the second sacrificial mask patterns 306a, 306b. The spacer layer may have etching selectivity with respect to the first and the second sacrificial mask patterns 306a, 306b. For example, the spacer layer may comprise a silicon oxide and may be formed by an atomic layer deposition (ALD) process. The spacer layer may have a substantially uniform thickness on the target layer 302.

Then, an etch back process may be performed on the spacer layer and thus spacer lines 308 may be formed on each sidewall of the first and the second sacrificial mask patterns 306a, 306b. Thus, the gap spaces between the first and the second sacrificial mask patterns 306a, 306b may be reduced to spacer spaces 309 in such a manner that a width of the spacer line 308 may be substantially the same as the gap distance between the spacer lines 308. That is, the size of the spacer space 309 may be determined as F. Then, the preliminary hard mask pattern 304 exposed through the space spaces 309 may be removed by an etching process using the spacer lines 308 as an etching mask, thereby forming a hard mask pattern 304a underlying the first and the second sacrificial mask patterns 306a, 306b and the spacer lines 308.

Therefore, the hard mask pattern 304a may be self-aligned with the first sacrificial mask pattern 306a, thereby compensating for the misalignment of the first sacrificial mask pattern 306a with respect to the preliminary hard mask pattern 304. For example, although a left line of the first sacrificial mask pattern 306a may not be positioned on the central portion of the preliminary hard mask pattern 304, the target layer corresponding to the pair of the lines of the first sacrificial mask pattern 306a may be separated as long as the connection portion L2 may cross the preliminary hard mask pattern 304a. Therefore, since the sacrificial pattern body L2 may have the width of F and the preliminary hard mask pattern 304 may have the width of 4F, the left line of the first sacrificial mask pattern 306a have a process margin of 1.5F leftwards or rightwards. That is, the sacrificial mask pattern 306a may be aligned with the preliminary hard mask pattern 304 with an alignment margin of 1.5F.

Figure 11D:
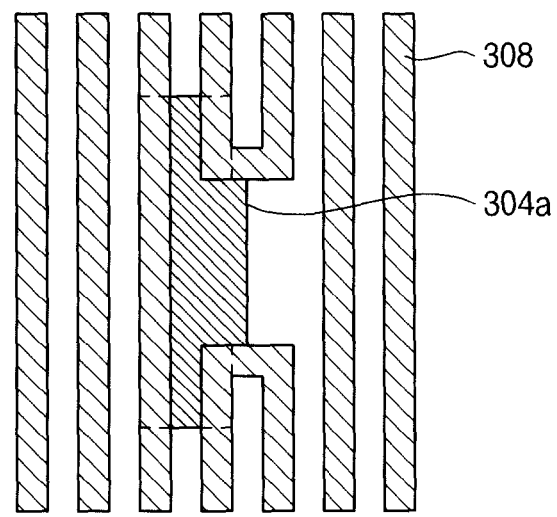
Figure 12D:
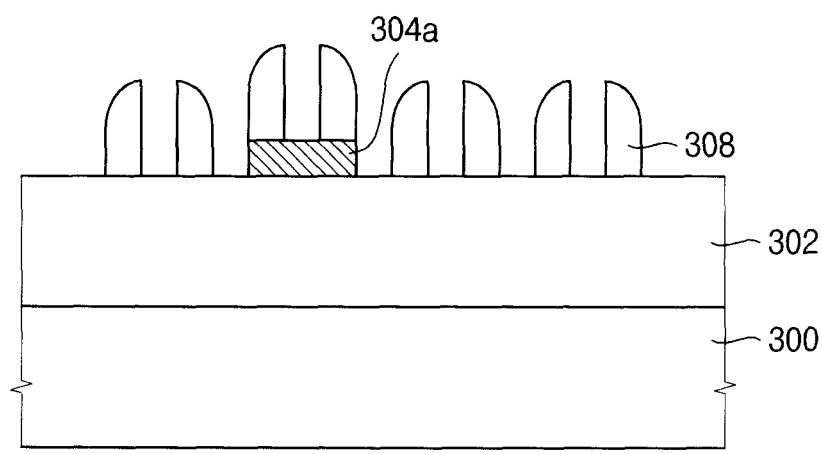

Referring to FIGS. 11D and 12D, the first and the second sacrificial mask patterns 306a, 306b may be removed from the substrate 300. Accordingly, the spacer lines 308 and the hard mask pattern 304a partially underlying the spacer lines 308 may remain on the substrate 300 having the target layer 302.

Thus, the target layer 302 may be exposed through the spacer lines 308 under which the hard mask pattern 304a may be formed. Then, the exposed portion of the target layer 302 may be etched off in a subsequent process. In the present exemplary embodiment, the pattern structure 1000 may be formed on the substrate 300 by a damascene process and thus the pattern structure may be positioned at the area of the substrate corresponding to the exposed portion of the target layer 302.

Figure 11E:
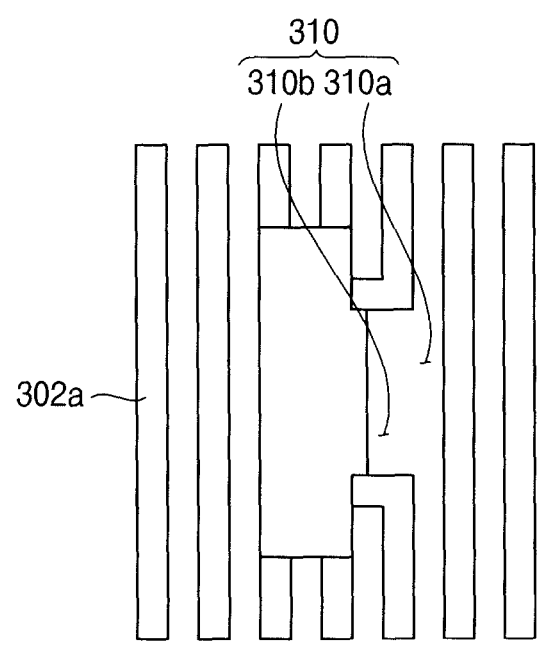
Figure 12E:
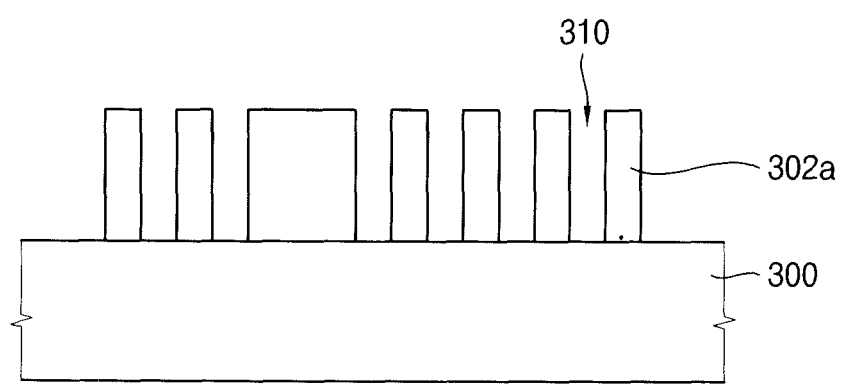

Referring to FIGS. 11E and 12E, the target layer 302 may be removed from the substrate 300 by an etching process using the spacer lines 308 and the hard mask pattern 304a as an etching mask, thereby forming a target pattern 302a having a line-shaped opening or a trench 310 extending in the first direction. For example, the line-shaped opening 310 may include a plurality of vertical line-shaped openings 310a extending in the first direction and at least one horizontal line-shaped opening 310b. Thereafter, the spacer lines 308 and the hard mask pattern 304a may be removed from the substrate 300.

Figure 12F:
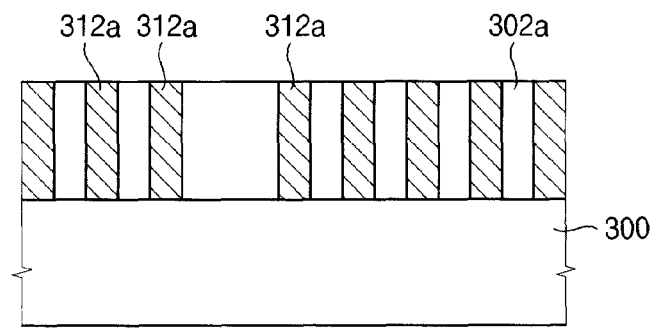

Referring to FIGS. 11F and 12F, a filling layer (not illustrated) may be formed on the substrate 300 having the target pattern 302a to a sufficient thickness to fill up the recess 310. Then, the filling layer may be planarized by a planarization process until an upper surface of the target pattern 302a may be exposed, and thus the filling layer may remain merely in the recess 310 of the target pattern 302a. Then, the spacer lines 308 and the hard mask pattern 304a may be removed from the substrate 300 and thus the pattern structure may be formed along the recess 310 of the target pattern 302a on the substrate 300.

The pattern structure in FIGS. 11F and 12F may include first, second and third lines 312a, 312b, 312c. The first line 312a may include the cut-off portion C and a pair of the second lines 312b may be positioned at both sides of the pair of the first lines 312a, respectively. A plurality of the third lines 312c may be arranged outside the second lines 312b.

In the present exemplary embodiment, a pair of the first lines 312a may be arranged in the first region of the substrate 300. One of the first lines 312a may be shorter than the other of the first lines 312a and thus the size of the cut-off portion C may be varied according to the length of each of the first lines 312a.

In addition, the right second line 312b1, positioned at the right side of the pair of the first lines 312a, may include an line body L3 and a protrusion portion L4. The line body L3 may extend along the first direction in parallel with the first line 312a. The protrusion portion L4 may protrude from the line body L3 around the cut-off portion C and may be directed to the first line 312a. In contrast, the left second line 312b2, positioned at the left side of the pair of the first lines 312a, may be shaped into a line extending along the first direction in parallel with the first line 312a.

The third lines 114c of FIG. 1 may be similarly applied to present exemplary embodiment and be spaced apart by the same gap distance and thus the line-shape pattern 114c and the gap space between the neighboring the lines 114c may be alternately arranged in a second direction perpendicular to the first direction. That is, the third lines 114c may be arranged on the substrate 300 in a line-and-space configuration.

FIGS. 13A to 13D are plan views illustrating processing steps for a method of forming a first modification of the second exemplary embodiment of the pattern structure.

The processing steps described with reference to FIGS. 13A to 13D may be substantially the same steps as described in detail with reference to FIGS. 11A to 12F, except that the hard mask pattern may be positioned at a right portion of the first sacrificial mask pattern 306a. Thus, the pattern structure that may be formed through the processing steps in FIGS. 13A to 13D may be vertically symmetrical with respect to the pattern structure shown in FIGS. 11F and 12F. With regard to FIGS. 13A to 13D, the same reference numerals denote the same elements in FIGS. 11A to 12F and the detailed descriptions of the same reference elements will be omitted.

Figure 13A:
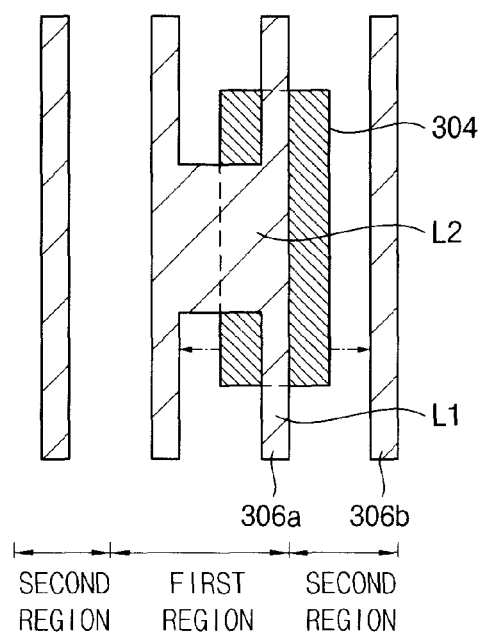
FIGS. 13A, 13B, 13C and 13D are plan views illustrating processing steps for a method of forming a first modification of the second exemplary embodiment of the pattern structure.

Referring to FIG. 13A, the target layer 302 may be formed on the substrate 300 and the preliminary hard mask pattern 304 may be formed on the target layer 302. The preliminary hard mask pattern 304 may have an etching selectivity with respect to the target layer 302. For example, the preliminary hard mask pattern 304 may comprise silicon nitride, silicon oxynitride or polysilicon.

In the present exemplary embodiment, the preliminary hard mask pattern 304 may be positioned at an area of the substrate 300 corresponding to the cut-off portion C of the first lines 312a and may have a width of 4F when the first, a second and the third lines 312a, 312b', 312c may have a width of F, respectively.

The first and the second sacrificial mask patterns 306a, 306b may be formed on the target layer 302 having the preliminary hard mask pattern 304 in the same process as described in detail with reference to FIGS. 11B and 12B. Thus, the first and the second sacrificial mask patterns 306a, 306b may have the same structures as those of FIGS. 11B and 12B. That is, the first sacrificial mask pattern 306a may be formed in the first region of the substrate 300 and may function as an etching mask for forming the first lines 312a discontinuously extending in a first direction and the second line 312b' adjacent to the first lines 312a. The second sacrificial mask pattern 306b may be formed in the second region of the substrate 300 and may function as an etching mask for forming the third lines 312c that may continuously extend in the first direction. Particularly, the first sacrificial mask pattern 306a may include a sacrificial pattern body L1 that may be shaped into a pair of lines extending in the first direction and a connection portion L2 that may be shaped into a linear pad extending in a second direction substantially perpendicular to the first direction and connected to the sacrificial pattern body L1. The sacrificial pattern body L1 of the first sacrificial mask pattern 306a may have a line width of F and the pair of the lines of the sacrificial pattern body L1 may be spaced apart by a gap distance of 3F.

In contrast with FIGS. 11B and 12B, the right side line of the sacrificial pattern body L1 may be aligned with a central line of the preliminary hard mask pattern 304. Thus, the correct alignment of the first sacrificial mask pattern 306a may be shifted from the left portion to the right portion of the first sacrificial mask pattern 306a. However, since the first sacrificial mask pattern 306a may still have an alignment margin of 1.5F leftwards or rightwards from the position of the correct alignment despite of the shift of the correct alignment, the cut-off portion C of the pattern structure may be correctly formed at desired positions on the substrate 300 although the first sacrificial mask pattern 306a may be positioned off from the correct alignment position leftwards or rightwards as long as the off-position may be within the alignment margin of 1.5F.

Figure 13B:
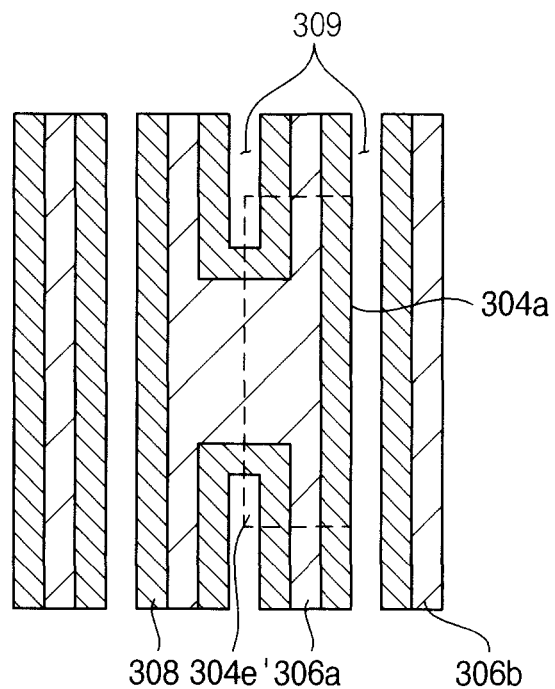

Referring to FIG. 13B, the spacer lines 308 may be formed on each sidewall of the first and the second sacrificial mask patterns 306a, 306b by the same process as described in detail with reference to FIGS. 11C and 12C. Thus, the gap spaces between the first and the second sacrificial mask patterns 306a, 306b may be reduced to spacer spaces 309 in such a manner that the size of the spacer space 309 may be substantially the same as the width of the spacer line 308. As a result, a left corner portion 304e' of the preliminary hard mask pattern 304 may be exposed through the spacer spaces 309. Then, the exposed left corner portion 304e' of the preliminary hard mask pattern 304 may be removed from the substrate 300 by an etching process using the spacer lines 308 as an etching mask, thereby forming a hard mask pattern 304a' underlying the first and the second sacrificial mask patterns 306a, 306b and the spacer lines 308.

Figure 13C:
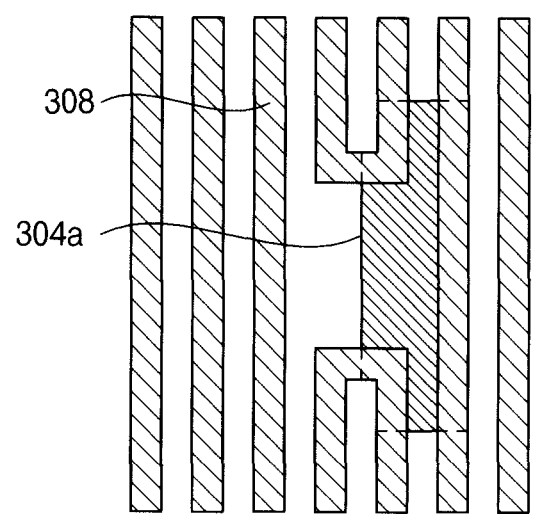

Referring to FIG. 13C, the first and the second sacrificial mask patterns 306a, 306b may be removed from the substrate 300. Accordingly, the spacer lines 308 and the hard mask pattern 304a partially underlying the spacer lines 308 may still remain on the substrate 300 having the target layer 302. Thus, the target layer 302 may be exposed through the spacer lines 308 and the hard mask pattern 304a and the exposed portion of the target layer 302 may be etched off in a subsequent process.

Thereafter, the same process as described in detail with reference to FIGS. 11E, 12E, 11F and 12F may be performed on the substrate 300 from which the first and the second sacrificial mask patterns 306a, 306b may be removed, to thereby form the pattern structure in FIG. 13D.

Figure 13D:
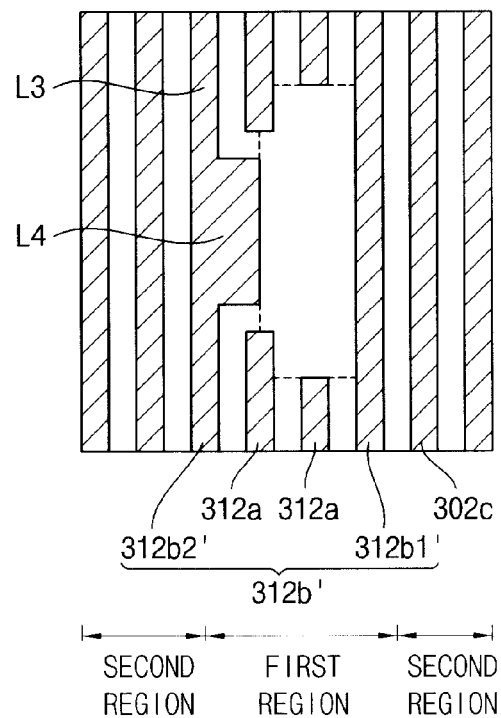

Referring to FIG. 13D, the pattern structure may include the first, the second and the third lines 312a, 312b', 312c. The first and the third lines 312a, 312c may have the same structures as those of the pattern structure in FIGS. 11F and 12F, and thus any further detailed descriptions will be omitted. A pair of the second lines 312b' may be positioned at both sides of the pair of the first lines 312a, respectively. Particularly, the second lines 312b' may be arranged vertically symmetrical to that of the pattern structure in FIGS. 11F and 12F. The left second line 312b', positioned at the left side of the pair of the first lines 312a, may include an line body L3 and a protrusion portion L4 and the right second line 312b1', positioned at the right side of the pair of the first lines 312a, may be shaped into a line extending along the first direction in parallel with the first line 312a. The line body L3 and the protrusion portion L4 of the second line 312b' may have substantially the same structure as those of the second line 312b in FIGS. 11F and 12F, and thus any further detailed descriptions on the line body L3 and the protrusion portion L4 will be omitted.

FIGS. 14A to 14D are plan views illustrating processing steps for a method of forming a second modification of the second exemplary embodiment of the pattern structure.

The pattern structure of the present exemplary embodiment includes a single cut-off portion and an arrow mark in FIGS. 14A to 14D denotes a position at which a first line is arranged on a substrate.

Figure 14A:
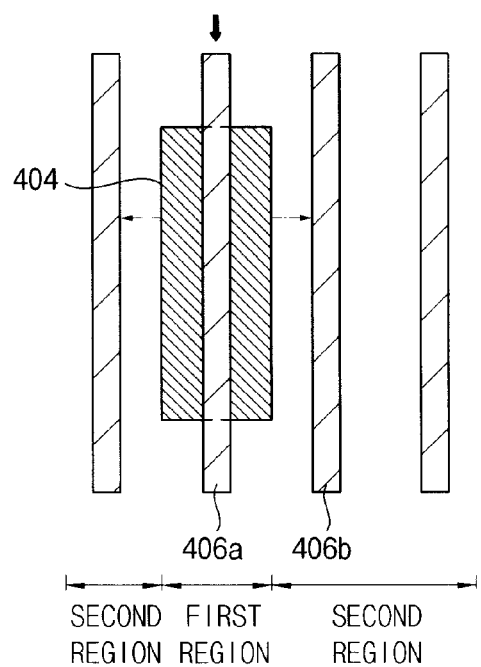
FIGS. 14A, 14B, 14C and 14D are plan views illustrating processing steps for a method of forming a second modification of the second exemplary embodiment of the pattern structure.

Referring to FIG. 14A, a substrate may be prepared and a first region and a second region may be defined on the substrate. A first line 412a in FIG. 14D having a cut-off portion C and a pair of second lines 412b in FIG. 14D adjacent to the first line 412a may be arranged in the first region of the substrate and a plurality of third lines 412c in FIG. 14D may be arranged in a line-and-space structure in the second region of the substrate in accordance with the following processing steps. A target layer 402 may be formed on the substrate and a preliminary hard mask pattern 404 may be formed on the target layer 402. The first to the third lines 412a, 412b, 412c may have a width of F and the preliminary hard mask pattern 404 may have a width of 4F.

First and second sacrificial mask patterns 406a, 406b may be formed on the target layer 402 on which the preliminary hard mask pattern 404 may be positioned. The first sacrificial mask pattern 406a may be arranged in the first region of the substrate and may function as an etching mask for forming the first and the second lines 412a, 412b. The second sacrificial mask pattern 406b may be arranged in the second region of the substrate and may function as an etching mask for forming the third line 412c that may continuously extend in the first direction. In the present exemplary embodiment, each of the first and the second sacrificial mask patterns 406a, 406b may be shaped into a continuous line extending in the first direction and may have a width of F. The first and the second sacrificial mask patterns 406a, 406b may be spaced apart by a gap distance of 3F and thus a gap space having a width of 3F may be provided between the first and the second sacrificial mask patterns 406a, 406b. Particularly, the first sacrificial mask pattern 406a may be arranged on or over the preliminary hard mask pattern 404.

In the present exemplary embodiment, the first sacrificial mask pattern 406a may be aligned with a central line of the preliminary hard mask pattern 404, which is referred to as correct alignment of the first sacrificial mask pattern 406a with respect to the preliminary hard mask pattern 404. Particularly, the first sacrificial mask pattern 406a may have an alignment margin of 1.5F leftwards or rightwards from the position of the correct alignment, and thus the cut-off portion C of the pattern structure may be correctly formed at desired positions on the substrate although the first sacrificial mask pattern 406a may be positioned off from the correct alignment position leftwards or rightwards as long as the off-position may be within the alignment margin of 1.5F.

Figure 14B:
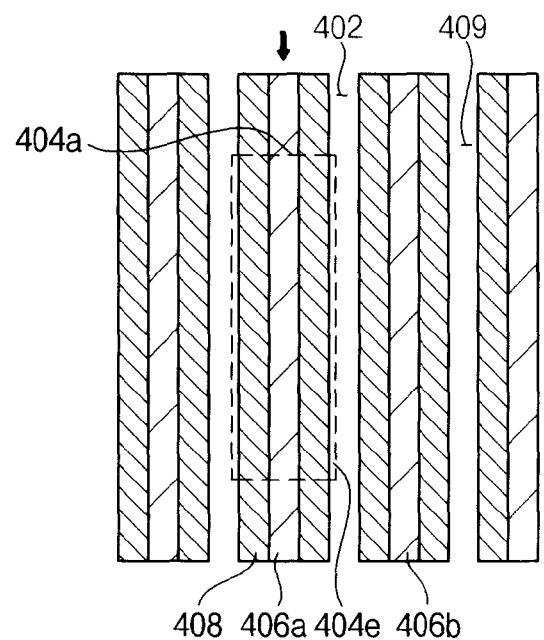

Referring to FIG. 14B, the spacer lines 408 may be formed on each sidewall of the first and the second sacrificial mask patterns 406a, 406b by the same process as described in detail with reference to FIGS. 11C and 12C. Thus, the gap spaces between the first and the second sacrificial mask patterns 406a, 406b may be reduced to spacer spaces 409 in such a manner that the size of the spacer space 409 may be substantially the same as the width of the spacer line 408. As a result, both side portions of 404e of the preliminary hard mask pattern 404 may be exposed through the spacer spaces 409. The exposed side portion 404e of the preliminary hard mask pattern 404 may have an exposure width of 0.5F. Then, the exposed side portions 404e of the preliminary hard mask pattern 404 may be removed from the substrate by an etching process using the spacer lines 408 as an etching mask, thereby forming a hard mask pattern 404a underlying the first and the second sacrificial mask patterns 406a, 406b and the spacer lines 408.

Therefore, the hard mask pattern 404a may be self-aligned with the first sacrificial mask pattern 406a by the spacer line 408, thereby compensating for the misalignment of the first sacrificial mask pattern 406a with respect to the preliminary hard mask pattern 404. That is, although the first sacrificial mask pattern 406a may be misaligned with the preliminary hard mask pattern 404, the hard mask pattern 404a may be sufficiently aligned with the first sacrificial mask pattern 406a due to the spacer lines 408, thereby increasing the alignment margin of the first sacrificial mask pattern 406a.

Figure 14C:
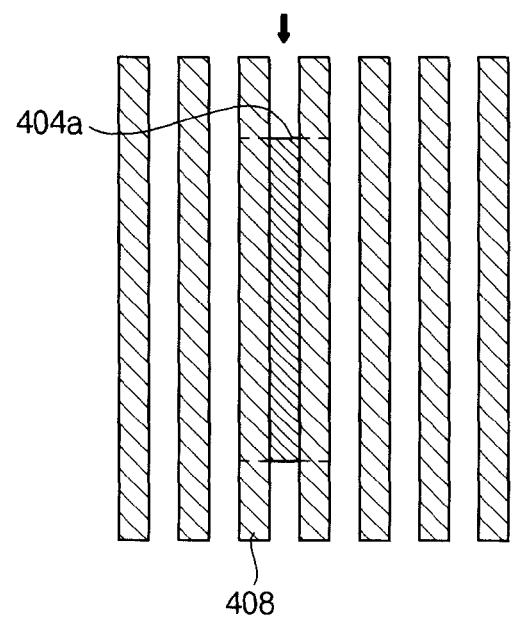

Referring to FIG. 14C, the first and the second sacrificial mask patterns 406a, 406b may be removed from the substrate by the same process as describe in detail with reference to FIGS. 11D and 12D. Accordingly, the spacer lines 408 and the hard mask pattern 404a partially underlying the spacer lines 408 may still remain on the substrate having the target layer 402. Thus, the target layer 402 may be exposed through the spacer lines 408 and the hard mask pattern 404a and the exposed portion of the target layer 402 may be etched off in a subsequent process.

Thereafter, the same process as described in detail with reference to FIGS. 11E, 12E, 11F and 12F may be performed on the substrate from which the first and the second sacrificial mask patterns 406a, 406b may be removed, to thereby form the pattern structure in FIG. 14D.

Figure 14D:
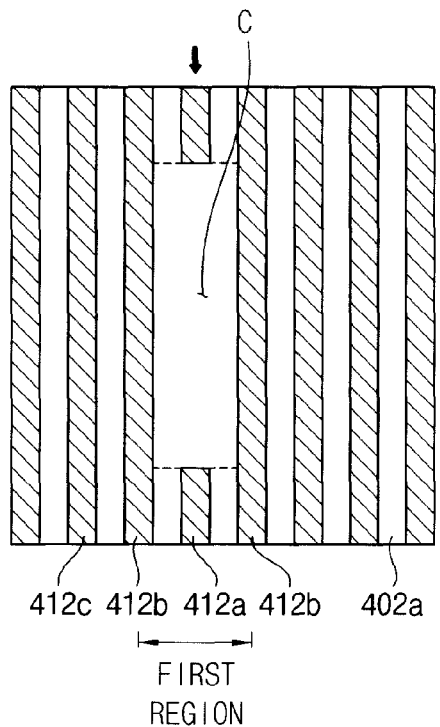

Referring to FIG. 14D, the pattern structure may include the first, the second and the third lines 412a, 412b', 412c. The first lines 412a may be shaped into a line having the cut-off portion C and extending in the first direction. A pair of the second lines 412b may be positioned at both sides of the first lines 412a, respectively, and each of the second lines 412b may be shaped into a continuous line having no cut-off portion and extending in the first direction in parallel with the first line 412a. A plurality of the third lines patterns 412c may be arranged outside of the second lines 412b in a line-and-space configuration. In the present exemplary embodiment, the second and the third lines 412b, 412c may be formed into the same line shape.

FIGS. 15A to 15D are plan views illustrating processing steps for a method of forming a third modification of the second exemplary embodiment of the pattern structure.

The pattern structure of the present exemplary embodiment includes a single cut-off portion and an arrow mark in FIGS. 15A to 15D denotes a position at which a first line is arranged on a substrate.

Figure 15A:
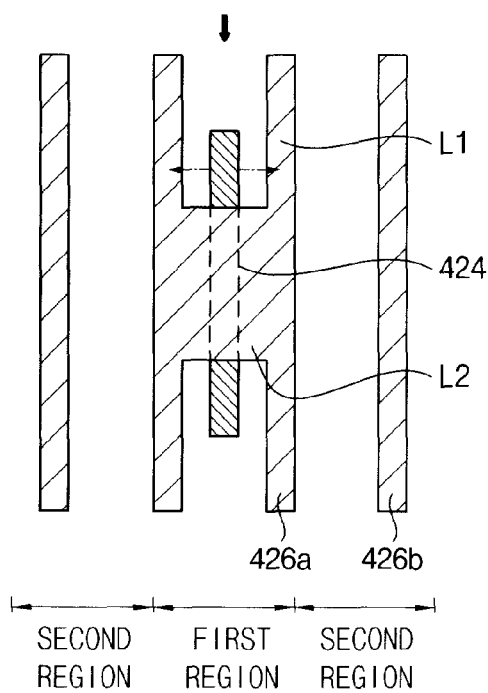
FIGS. 15A, 15B, 15C and 15D are plan views illustrating processing steps for a method of forming a third modification of the second exemplary embodiment of the pattern structure.

Referring to FIG. 15A, a substrate may be prepared and a first region and a second region may be defined on the substrate. A first line 432a in FIG. 15D having a cut-off portion C and a pair of second lines 432b in FIG. 15D adjacent to the first line 432a may be arranged in the first region of the substrate and a plurality of third lines 432c in FIG. 15D may be arranged in a line-and-space structure in the second region of the substrate in accordance with the following processing steps. A target layer 422 may be formed on the substrate and a preliminary hard mask pattern 424 may be formed on the target layer 402. The first to the third lines 432a, 432b, 432c may have a width of F and the preliminary hard mask pattern 424 may also have a width of F.

First and second sacrificial mask patterns 426a, 426b may be formed on the target layer 422 on which the preliminary hard mask pattern 424 may be positioned. The first sacrificial mask pattern 426a may be arranged in the first region of the substrate and may function as an etching mask for forming the first and the second lines 432a, 432b. The second sacrificial mask pattern 426b may be arranged in the second region of the substrate and may function as an etching mask for forming the third line 432c that may continuously extend in the first direction. The first sacrificial mask pattern 426a may have the same configurations as the first sacrificial mask pattern 306a of the pattern structure as described in detail with reference to FIGS. 11B and 12B. Particularly, the first sacrificial mask pattern 426a may include a sacrificial pattern body L1 that may be shaped into a pair of lines extending in the first direction and a connection portion L2 that may be shaped into a linear pad extending in a second direction substantially perpendicular to the first direction and connected to the sacrificial pattern body L1. The pair of the lines of the sacrificial pattern body L1 may be vertically symmetrical with each other and may extend in the first direction. The connection portion L2 may be interposed between the pair of the lines and may be connected to the both of the lines of the sacrificial pattern body L1 along the second direction. Thus, the first sacrificial mask pattern 426a may be shaped into the capital letter 'H' together with the line-shaped sacrificial pattern body L1 and the line-shaped connection portion L2. The sacrificial pattern body L1 of the first sacrificial mask pattern 426a may have a line width of F and the pair of the lines of the sacrificial pattern body L1 may be spaced apart by a gap distance of 3F.

In the present exemplary embodiment, the preliminary hard mask pattern 424 may be aligned with a central line of the first H-shaped sacrificial mask pattern 426a. That is, the preliminary mask pattern 424 may be positioned below the central portion of the connection portion L2 and may extend in the first direction, and thus the preliminary hard mask pattern 424 may be spaced apart from each of the lines of the sacrificial pattern body L1 by a gap distance of F. Particularly, the first sacrificial mask pattern 426a may have an alignment margin of 1.5F leftwards or rightwards from the position of the correct alignment, and thus the cut-off portion C of the pattern structure may be correctly formed at desired positions on the substrate although the first sacrificial mask pattern 426a may be positioned off from the correct alignment position leftwards or rightwards as long as the off-position may be within the alignment margin of 1.5F.

A plurality of the second sacrificial mask patterns 426b may be shaped into lines extending in the first direction in parallel with the line of the sacrificial pattern body L1 of the first sacrificial mask pattern 426a and having a width of F. In addition, the second sacrificial mask patterns 426b may be spaced apart by a gap distance of 3F, thus the second sacrificial mask patterns 426b may be arranged in a line-and-space structure on the substrate.

Figure 15B:
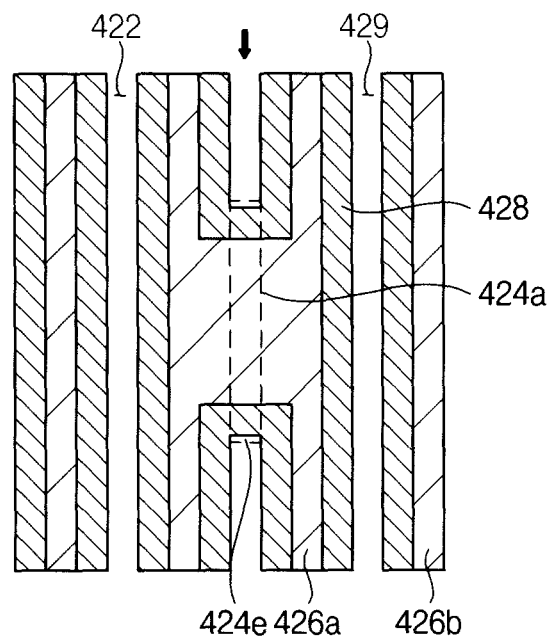

Referring to FIG. 15B, the spacer lines 428 may be formed on each sidewall of the first and the second sacrificial mask patterns 426a, 426b by the same process as described in detail with reference to FIGS. 11C and 12C. Thus, the gap spaces between the first and the second sacrificial mask patterns 426a, 426b may be reduced to spacer spaces 429 in such a manner that the size of the spacer space 429 may be substantially the same as the width of the spacer line 428. As a result, both side portions of 424e of the preliminary hard mask pattern 424 may be exposed through the spacer spaces 429. Then, the exposed side portions 424e of the preliminary hard mask pattern 424 may be removed from the substrate by an etching process using the spacer lines 428 as an etching mask, thereby forming a hard mask pattern 424a underlying the first sacrificial mask patterns 426a and the spacer lines 428.

Figure 15C:
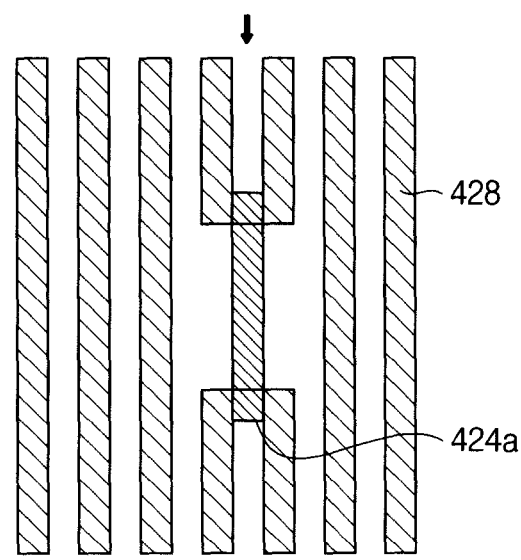

Referring to FIG. 15C, the first and the second sacrificial mask patterns 426a, 426b may be removed from the substrate by the same process as describe in detail with reference to FIGS. 11D and 12D. Accordingly, the spacer lines 428 and the hard mask pattern 424a may still remain on the substrate having the target layer 422. Thus, the target layer 422 may be exposed through the spacer lines 428 and the hard mask pattern 424a and the exposed portion of the target layer 422 may be etched off in a subsequent process.

Thereafter, the same process as described in detail with reference to FIGS. 11E, 12E, 11F and 12F may be performed on the substrate from which the first and the second sacrificial mask patterns 426a, 426b may be removed, to thereby form the pattern structure in FIG. 15D. Therefore, the first to third lines 432a, 432b, 432c of the pattern structure may be formed according to the shape of the spacer lines 428 and the hard mask pattern 424a and the target pattern 422a may be arranged between the first to third lines 432a, 432b, 432c of the pattern structure on the substrate.

Figure 15D:
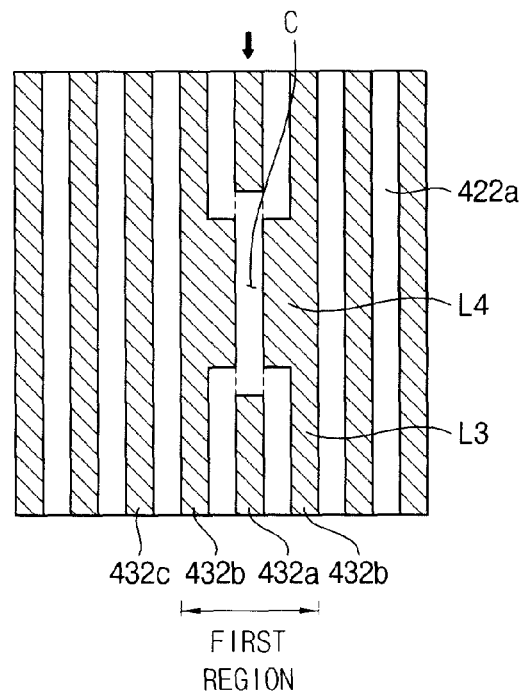

Referring to FIG. 15D, the pattern structure may include the first, the second and the third lines 432a, 432b, 432c. The first lines 432a may be shaped into a line having the cut-off portion C and extending in the first direction similar to that of the pattern structure in FIG. 14D. A pair of the second lines 432b may be positioned at both sides of the first lines 432a, respectively, and each of the second lines 432b may include a line body L3 and a protrusion portion L4. The line body L3 may extend along the first direction in parallel with the first line 432a. The protrusion portion L4 may protrude from the line body L3 around the cut-off portion C and may be directed to the first line 432a, particularly toward the cut-off portion C of the adjacent first line 432a. In case that the hard mask pattern 424a may be correctly aligned with the first sacrificial mask pattern 426a, the pair of the second lines 432b may be vertically symmetrical with respect to the first line 42a and thus a pair of the protrusion portions L4 facing each other may have the same protrusion length in the second direction. The third lines 432c may be arranged in the line-and-space structure on the substrate similar to the third lines 412c of the pattern structure in FIG. 14D.

FIGS. 16A to 16D are plan views illustrating processing steps for a method of forming a fourth modification of the second exemplary embodiment of the pattern structure.

The pattern structure of the present exemplary embodiment includes three cut-off portions and arrow marks in FIGS. 16A to 16D denote positions at which a triple of first lines are arranged on a substrate.

Figure 16A:
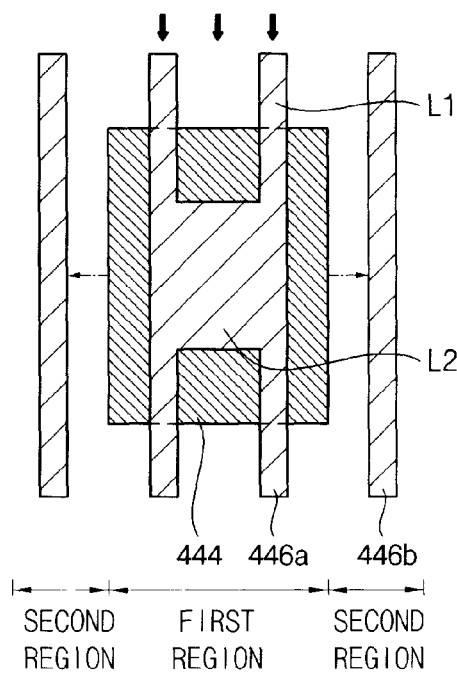
FIGS. 16A, 16B, 16C and 16D are plan views illustrating processing steps for a method of forming a fourth modification of the second exemplary embodiment of the pattern structure.

Referring to FIG. 16A, a substrate may be prepared and a first region and a second region may be defined on the substrate. First lines 452a in FIG. 16D having three cut-off portions C and a pair of second lines 452b in FIG. 16D adjacent to a group of the first lines 452a may be arranged in the first region of the substrate and a plurality of third lines 452c in FIG. 16D may be arranged in a line-and-space structure in the second region of the substrate in accordance with the following processing steps. A target layer 442 may be formed on the substrate and a preliminary hard mask pattern 444 may be formed on the target layer 442. The first to the third lines 452a, 452b, 452c may have a width of F and the preliminary hard mask pattern 444 may also have a width of 8F.

First and second sacrificial mask patterns 446a, 446b may be formed on the target layer 442 on which the preliminary hard mask pattern 444 may be positioned. The first sacrificial mask pattern 446a may be arranged in the first region of the substrate and may function as an etching mask for forming the first and the second lines 452a, 452b. The second sacrificial mask pattern 446b may be arranged in the second region of the substrate and may function as an etching mask for forming the third line 452c that may continuously extend in the first direction.

The first sacrificial mask pattern 446a may have the same configurations as the first sacrificial mask pattern 306a of the pattern structure as described in detail with reference to FIGS. 11B and 12B. Particularly, the first sacrificial mask pattern 446a may include a sacrificial pattern body L1 that may be shaped into a pair of lines extending in the first direction and a connection portion L2 that may be shaped into a linear pad extending in a second direction substantially perpendicular to the first direction and connected to the sacrificial pattern body L1. The pair of the lines of the sacrificial pattern body L1 may be vertically symmetrical with each other and may extend in the first direction. The connection portion L2 may be interposed between the pair of the lines and may be connected to the both of the lines of the sacrificial pattern body L1 along the second direction. Thus, the first sacrificial mask pattern 446a may be shaped into the capital letter 'H' together with the line-shaped sacrificial pattern body L1 and the line-shaped connection portion L2. The sacrificial pattern body L1 of the first sacrificial mask pattern 446a may have a line width of F and the pair of the lines of the sacrificial pattern body L1 may be spaced apart by a gap distance of 3F.

In the present exemplary embodiment, the preliminary hard mask pattern 444 and the first H-shaped sacrificial mask pattern 446a may be correctly aligned with each other in such a manner that a central line of the preliminary hard mask pattern 444 may be collinear with that of the first sacrificial mask pattern 446a in the first direction. Particularly, the side portion of the preliminary hard mask pattern 444 may be spaced apart from the sidewall of the sacrificial pattern body L1 by a gap distance of 1.5F. That is, the first sacrificial mask pattern 446a may have an alignment margin of 1.5F leftwards or rightwards from the position of the correct alignment, and the cut-off portion C of the pattern structure may be correctly formed at desired positions on the substrate although the first sacrificial mask pattern 446a may be positioned off from the correct alignment position leftwards or rightwards as long as the off-position may be within the alignment margin of 1.5F.

A plurality of the second sacrificial mask patterns 446b may be shaped into lines extending in the first direction in parallel with the line of the sacrificial pattern body L1 of the first sacrificial mask pattern 446a and having a width of F. Particularly, the second sacrificial mask pattern 446b may be spaced apart from the sacrificial pattern body L1 by a gap distance of 3F and be arranged in a line-and-space structure on the substrate.

Figure 16B:
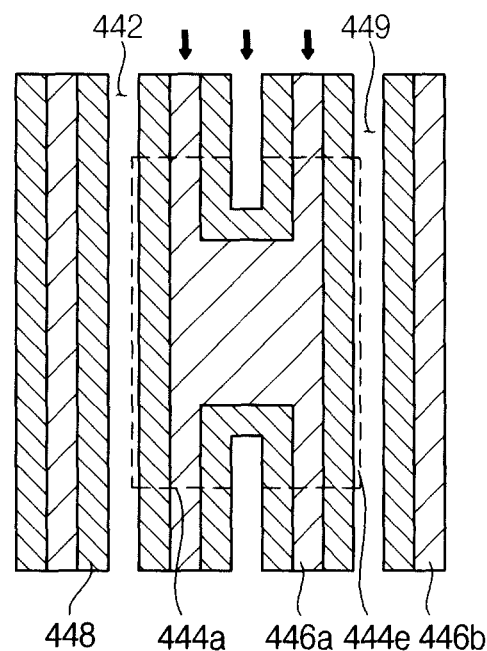

Referring to FIG. 16B, the spacer lines 448 may be formed on each sidewall of the first and the second sacrificial mask patterns 446a, 446b by the same process as described in detail with reference to FIGS. 11C and 12C. Thus, the gap spaces between the first and the second sacrificial mask patterns 446a, 446b may be reduced to spacer spaces 449 in such a manner that the size of the spacer space 449 may be substantially the same as the width of the spacer line 448. As a result, both side portions of 444e of the preliminary hard mask pattern 444 may be exposed through the spacer spaces 449. Then, the exposed side portions 444e of the preliminary hard mask pattern 444 may be removed from the substrate by an etching process using the spacer lines 448 as an etching mask, thereby forming a hard mask pattern 444a underlying the first sacrificial mask patterns 446a and the spacer lines 448.

Figure 16C:
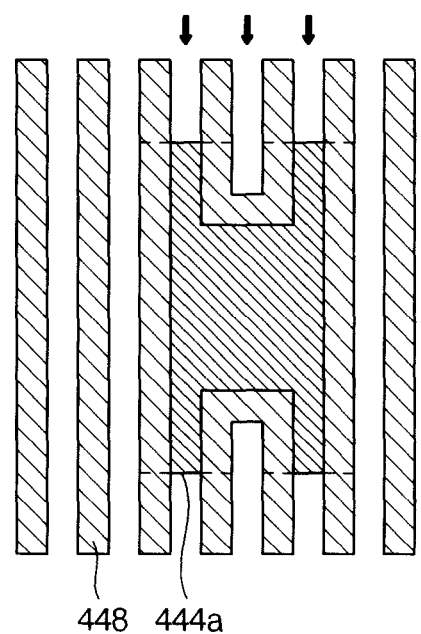

Referring to FIG. 16C, the first and the second sacrificial mask patterns 446a, 446b may be removed from the substrate by the same process as describe in detail with reference to FIGS. 11D and 12D. Accordingly, the spacer lines 448 and the hard mask pattern 444a may still remain on the substrate having the target layer 442. Thus, the target layer 442 may be exposed through the spacer lines 448 and the hard mask pattern 444a. The exposed portion of the target layer 442 may be etched off in a subsequent process.

Thereafter, the same process as described in detail with reference to FIGS. 11E, 12E, 11F and 12F may be performed on the substrate from which the first and the second sacrificial mask patterns 446a, 446b may be removed, to thereby form the pattern structure in FIG. 16D. Therefore, the first to third lines 452a, 452b, 452c of the pattern structure may be formed according to the shape of the spacer lines 448 and the hard mask pattern 444a and the target pattern 442a may be arranged between the first to third lines 452a, 452b, 452c of the pattern structure on the substrate.

Figure 16D:
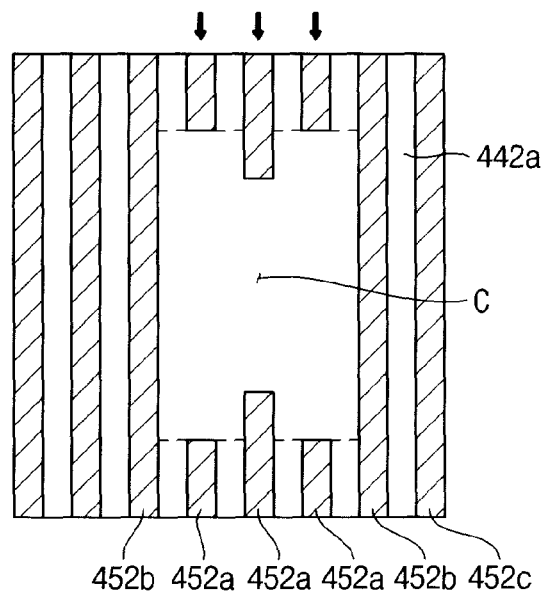

Referring to FIG. 16D, the pattern structure may include the first, the second and the third lines 452a, 452b, 452c. Each of the first lines 452a may be shaped into a discontinuous line having the cut-off portion C in accordance with the hard mask pattern 444a and the spacer line 448. The size and shape of the cut-off portion C may be the same or different from one another.

A pair of the second lines 452b may be positioned at both sides of the group of the first lines 432a, respectively, and may be shaped into continuous lines extending in the first direction without any cut-off portions. The third lines 452c may be arranged in the line-and-space structure on the substrate, and thus the second and the third lines 452b, 452c may be formed into the same shape. A target pattern 442a may be arranged between the first, the second and the third lines of the pattern structure.

FIGS. 17A to 17D are plan views illustrating processing steps for a method of forming a fifth modification of the second exemplary embodiment of the pattern structure.

The pattern structure of the present exemplary embodiment includes three cut-off portions and arrow marks in FIGS. 17A to 17D denote positions at which a triple of first lines are arranged on a substrate.

Figure 17A:
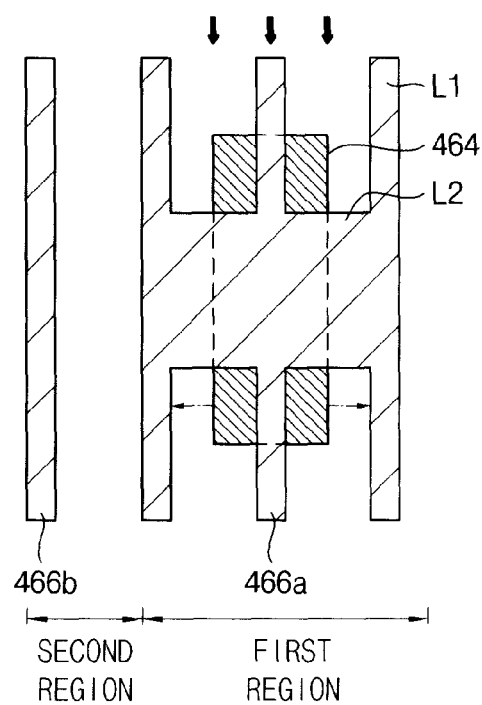
FIGS. 17A, 17B, 17C and 17D are plan views illustrating processing steps for a method of forming a fifth modification of the second exemplary embodiment of the pattern structure.

Referring to FIG. 17A, a substrate may be prepared and a first region and a second region may be defined on the substrate. First lines 472a in FIG. 17D having three cut-off portions C and a pair of second lines 472b in FIG. 17D adjacent to a group of the first lines 472a may be arranged in the first region of the substrate and a plurality of third lines 472c in FIG. 17D may be arranged in a line-and-space structure in the second region of the substrate in accordance with the following processing steps. A target layer 462 may be formed on the substrate and a preliminary hard mask pattern 464 may be formed on the target layer 462. The first to the third lines 472a, 472b, 472c may have a width of F and the preliminary hard mask pattern 464 may also have a width of 4F.

First and second sacrificial mask patterns 466a, 466b may be formed on the target layer 462 on which the preliminary hard mask pattern 464 may be positioned. The first sacrificial mask pattern 466a may be arranged in the first region of the substrate and may function as an etching mask for forming the first and the second lines 472a, 472b. The second sacrificial mask pattern 466b may be arranged in the second region of the substrate and may function as an etching mask for forming the third line 472c that may continuously extend in the first direction.

In the present exemplary embodiment, the first sacrificial mask pattern 466a may have the same configurations as the first sacrificial mask pattern 264a of the pattern structure as described in detail with reference to FIG. 10B. Particularly, the first sacrificial mask pattern 466a may include a sacrificial pattern body L1 that may be shaped into a three-forked lines extending in the first direction and a connection portion L2 that may be shaped into a linear pad connected to the three forked lines of the sacrificial pattern body L1 and extending in a second direction substantially perpendicular to the first direction. The three-forked lines of the sacrificial pattern body L1 may be spaced apart from each other by a gap distance of 3F and the connection portion L2 may be positioned at a middle portion of the first sacrificial mask pattern 466a in such a manner that all of the lines of the sacrificial pattern body L1 may be connected with one another by the connection portion L2. Thus, the first sacrificial mask pattern 466a may be shaped into a double capital letter 'H' together with the line-shaped sacrificial pattern body L1 and the pad-shaped connection portion L2.

A plurality of the second sacrificial mask patterns 264b may be shaped into lines extending in the first direction in parallel with the sacrificial pattern body L1 of the first sacrificial mask pattern 264a. The second sacrificial mask patterns 264b may be arranged in a line-and-space structure on the substrate, as described in the above exemplary embodiments of the present inventive concept.

In the present exemplary embodiment, the preliminary hard mask pattern 464 and the first double H-shaped sacrificial mask pattern 466a may be correctly aligned with each other in such a manner that a central line of the preliminary hard mask pattern 464 may be collinear with that of the first sacrificial mask pattern 466a in the first direction. The central line of the three-forked lines of the pattern body L1 may be aligned with the central line of the preliminary mask pattern 464 and thus the side portion of the preliminary hard mask pattern 464 may be spaced apart from the sidewall of the lateral lines of the three-forked lines of the sacrificial pattern body L1 by a gap distance of 1.5F. That is, the first sacrificial mask pattern 466a may have an alignment margin of 1.5F leftwards or rightwards from the position of the correct alignment, and the cut-off portion C of the pattern structure may be correctly formed at desired positions on the substrate although the first sacrificial mask pattern 466a may be positioned off from the correct alignment position leftwards or rightwards as long as the off-position may be within the alignment margin of 1.5F.

A plurality of the second sacrificial mask patterns 466b may be shaped into lines extending in the first direction in parallel with the line of the sacrificial pattern body L1 of the first sacrificial mask pattern 466a and having a width of F. Particularly, the second sacrificial mask pattern 466b may be spaced apart from the sacrificial pattern body L1 by a gap distance of 3F and be arranged in a line-and-space structure on the substrate.

Figure 17B:
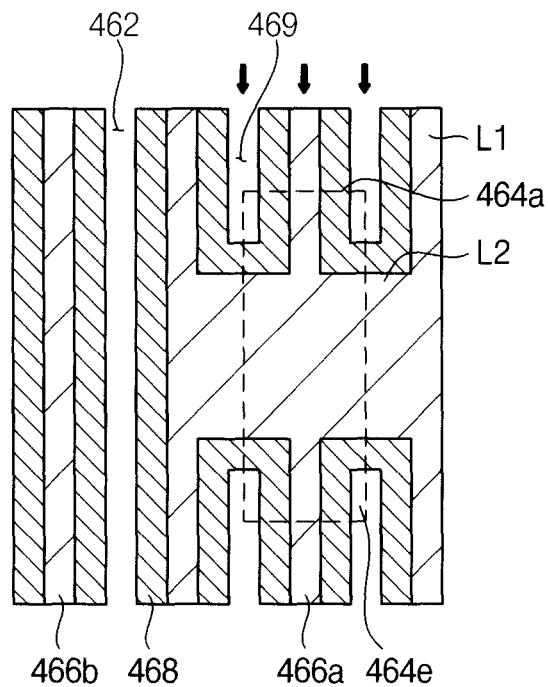

Referring to FIG. 17B, the spacer lines 468 may be formed on each sidewall of the first and the second sacrificial mask patterns 466a, 466b by the same process as described in detail with reference to FIGS. 11C and 12C. Thus, the gap spaces between the first and the second sacrificial mask patterns 466a, 466b may be reduced to spacer spaces 469 in such a manner that the size of the spacer space 469 may be substantially the same as the width of the spacer line 468. As a result, the corner portions 464e of the preliminary hard mask pattern 466 may be exposed through the spacer spaces 469. Then, the exposed corner portions 464e of the preliminary hard mask pattern 466 may be removed from the substrate by an etching process using the spacer lines 468 as an etching mask, thereby forming a hard mask pattern 464a underlying the first sacrificial mask patterns 466a and the spacer lines 468.

Figure 17C:
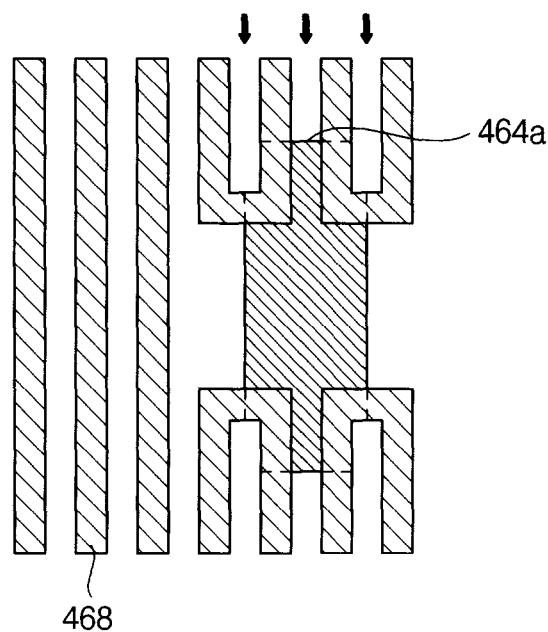

Referring to FIG. 17C, the first and the second sacrificial mask patterns 466a, 466b may be removed from the substrate by the same process as describe in detail with reference to FIGS. 11D and 12D. Accordingly, the spacer lines 468 and the hard mask pattern 464a may still remain on the substrate having the target layer 462. Thus, the target layer 462 may be exposed through the spacer lines 468 and the hard mask pattern 464a. The exposed portion of the target layer 462 may be etched off in a subsequent process.

Thereafter, the same process as described in detail with reference to FIGS. 11E, 12E, 11F and 12F may be performed on the substrate from which the first and the second sacrificial mask patterns 466a, 466b may be removed, to thereby form the pattern structure in FIG. 17D. Therefore, the first to third lines 472a, 472b, 472c of the pattern structure may be formed according to the shape of the spacer lines 468 and the hard mask pattern 464a and the target pattern 462a may be arranged between the first to third lines 472a, 472b, 472c of the pattern structure on the substrate.

Figure 17D:
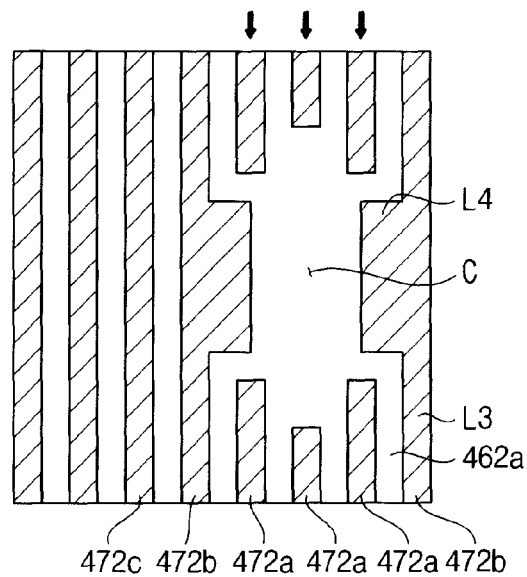

Referring to FIG. 17D, the pattern structure may include the first, the second and the third lines 472a, 472b, 472c. Each of the first lines 472a may be shaped into a discontinuous line having the cut-off portion C in accordance with the hard mask pattern 464a and the spacer line 468. Particularly, side lines of the three discontinuous lines of the first lines 472a may be arranged at an area corresponding to the spacer space 469 between the lateral line of the three-forked lines of the sacrificial pattern body L1 of the first sacrificial mask pattern 466a and a central line of the three discontinuous lines of the first lines 472a may be arranged at an area corresponding to the central line of the three-forked lines of the sacrificial pattern body L1 of the first sacrificial mask pattern 466a. The size and shape of the cut-off portion C may be the same or different from one another and thus the positions of end portions of the discontinuous lines of the first lines 472a may be the same or different from one another.

The second line 472b may include a line body L3 and a protrusion portion L4. The line body L3 may extend along the first direction in parallel with the first line 472a. The protrusion portion L4 may protrude from the line body L3 around the cut-off portion C and may be directed to the first line 472a, particularly toward the cut-off portion C of the adjacent first line 472a.

In case that the mask pattern 464a may be correctly aligned with the first sacrificial mask pattern 466a, the pair of the second lines 472b may be vertically symmetrical with respect to the first line 472a and thus a pair of the protrusion portions L4 facing each other may have the same protrusion length in the second direction. In contrast, in case that the mask pattern 464a may be misaligned with the first sacrificial mask pattern 466a within the alignment margin of 1.5F, the pair of the protrusion portions L4 may have different protrusion lengths.

The third lines 472c may be shaped into a line extending in the first direction according to the shape of the second sacrificial mask pattern 466b. Thus, the third lines 472c may be spaced apart by the same gap distance in the second region of the substrate and thus the line-shaped pattern and the gap space between the neighboring line-shaped patterns and may be alternately arranged on the substrate. That is, the third lines 472c may be arranged in a line-and-space structure on the substrate.

As a result, the target layer 462 may be patterned into the target pattern 462a that may be interposed between the first to third patterns 472a, 472b, 472c. The shape, size and position of the cut-off portion C of the first lines 472a may be varied by the amount of the misalignment of the mask pattern 464a with respect to the first sacrificial mask patterns 466a, as would be known to one of the ordinary skill in the art.

According to the exemplary embodiments, a plurality of lines may be formed into a line-and-space configuration on a substrate while at least one cut-off portion may be provided to at least one line of the line patterns.

Hereinafter, the processing steps for forming a cell pattern structure and a peripheral line structure or a peripheral linear pad simultaneously with each other will be described in detail. The cell line structure may be formed at a cell area of a substrate and the peripheral line structure may be formed at a peripheral area of the semiconductor substrate simultaneously with the cell line structure. The cell line structure may be formed by one of the above-mentioned embodiments for forming the pattern structure.

Embodiment III

Figure 18A:
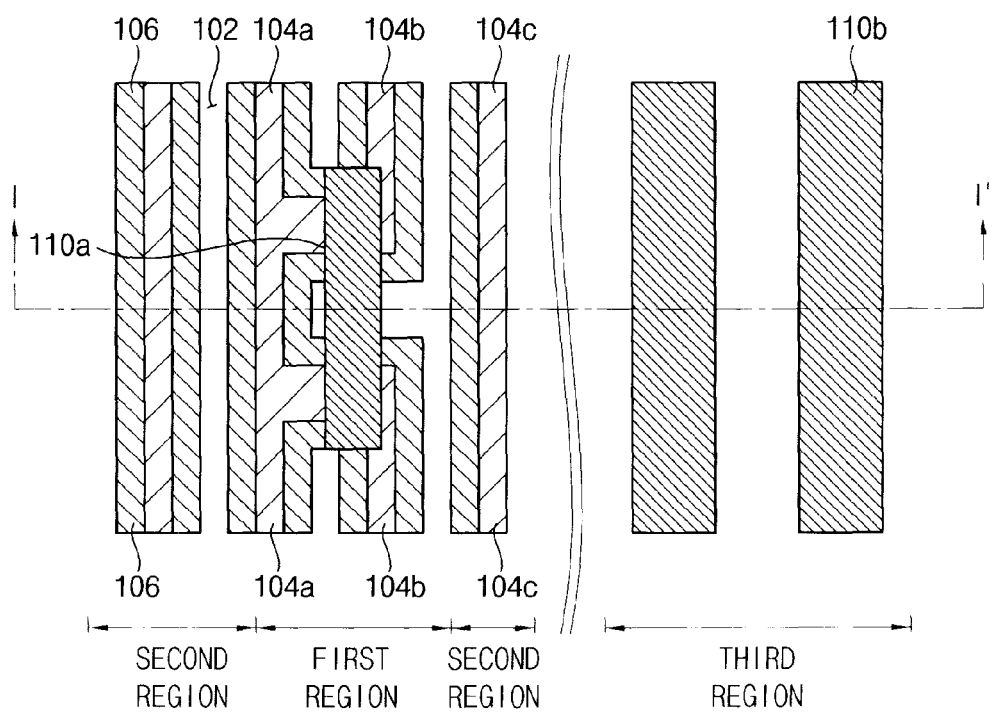
FIGS. 18A, 18B and 18C are plan views illustrating processing steps for a method of the line structure in accordance with a third exemplary embodiment of the present inventive concept.
Figure 18B:
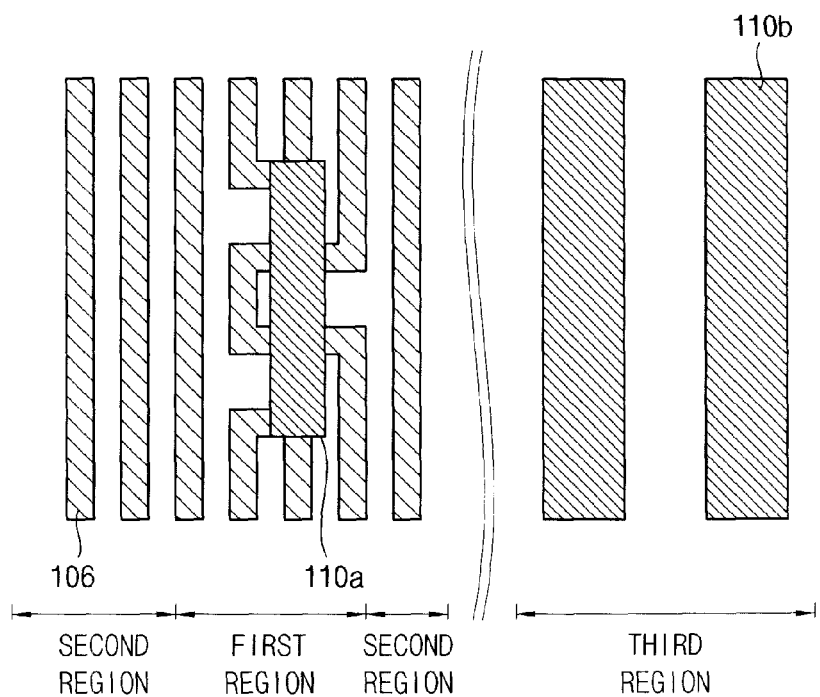
Figure 18C:
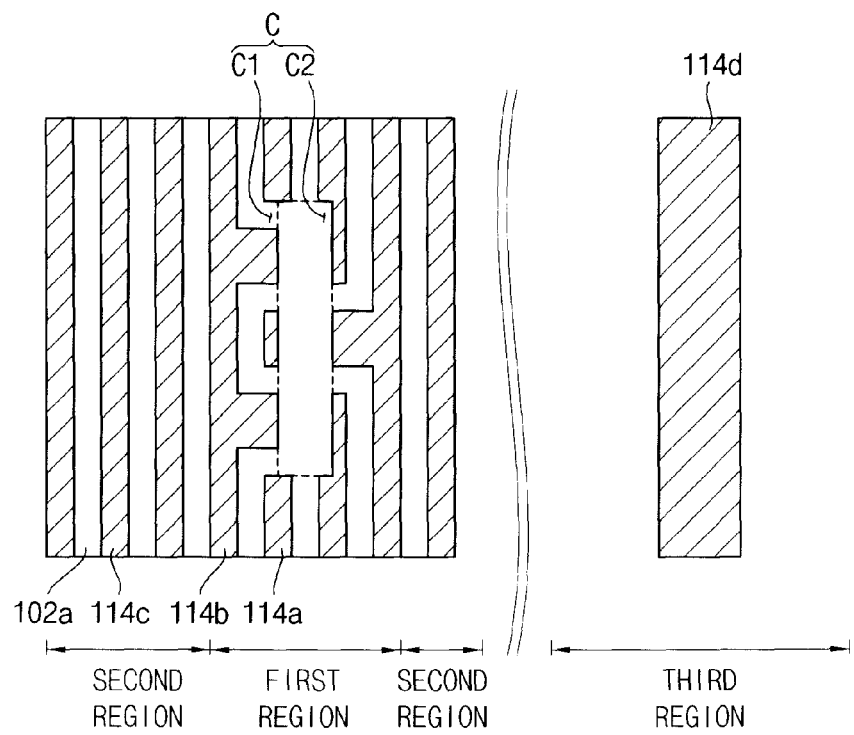
Figure 19A:
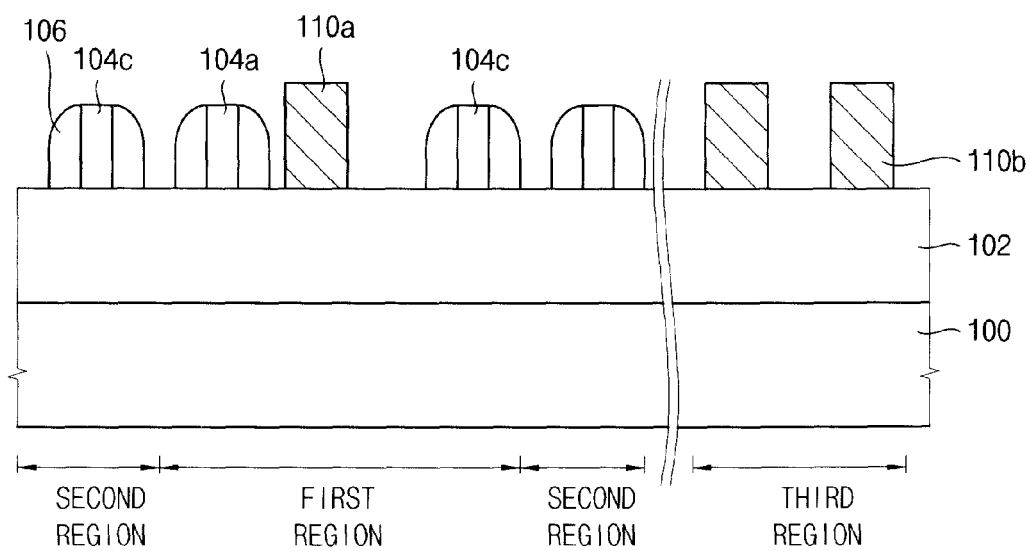
FIGS. 19A, 19B and 19C are cross-sectional views illustrating the processing steps corresponding to the FIGS. 18A, 18B and 18C, respectively.
Figure 19B:
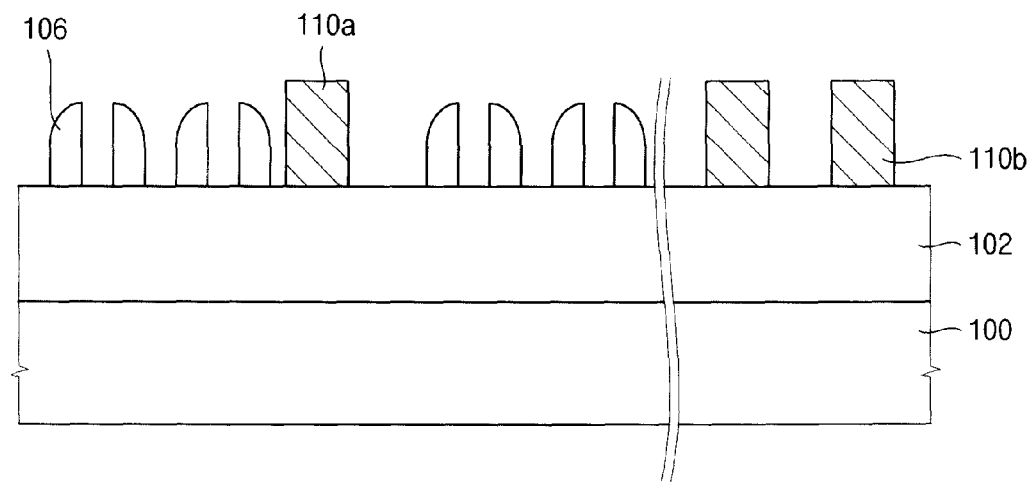
Figure 19C:
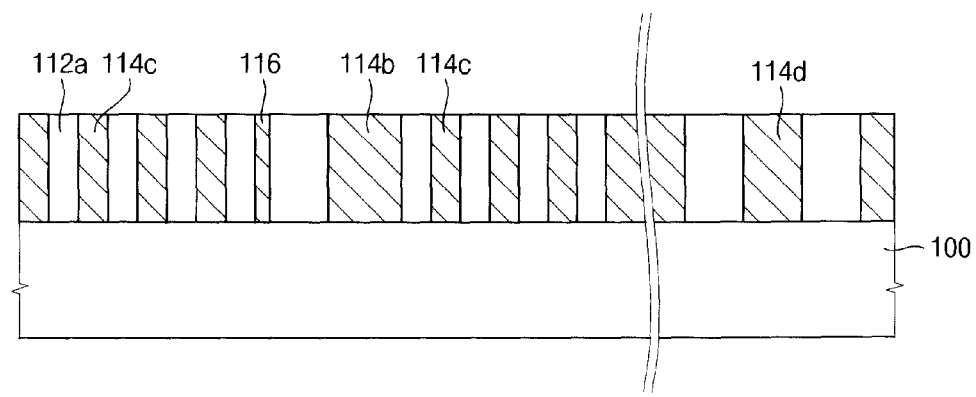

FIGS. 18A to 18C are plan views illustrating processing steps for a method of the line structure in accordance with a third exemplary embodiment of the present inventive concept and FIGS. 19A to 19C are cross-sectional views illustrating the processing steps corresponding to the FIGS. 18A to 18C, respectively.

The pattern structure in FIG. 18C may include a pair of cut-off portions and may be formed by the same processing steps as described in detail with reference to FIGS. 2A to 2F, except that a peripheral line pattern structure or a peripheral linear pad may be formed at the peripheral area of the substrate simultaneously with the cell line structure. In FIGS. 18A to 19C, the same reference numerals denote the same elements in FIGS. 2A to 2E and the detailed descriptions on the same elements will be omitted.

Referring to FIGS. 18A and 19A, the substrate 100 may be prepared and the first region, the second region and a third region may be defined on the substrate. For example, the first and the second regions of the substrate 100 may correspond to a cell area of a semiconductor device and the third region of the substrate 100 may correspond to a peripheral area of the semiconductor device. The first lines 114a in FIG. 18C having a cut-off portion C and a pair of second lines 114b in FIG. 18C adjacent to a pair of the first lines 114a may be arranged in the first region of the substrate 100 and a plurality of the third lines 114c in FIG. 18C may be arranged in a line-and-space structure in the second region of the substrate 100 in accordance with the following processing steps.

The target layer 102 may be formed on the substrate 100 and the first to third sacrificial mask patterns 104a, 104b, 104c may be formed on the target layer 102 at the cell area of the substrate 100. The space patterns 106 may be formed on the sidewalls of the first to third sacrificial mask patterns 104a, 104b, 104c. The first to third sacrificial mask patterns 104a, 104b, 104c and the space patterns 106 may be formed by the same processing steps as described in detail with reference to FIGS. 2A to 2B. In contrast, no sacrificial mask patterns may be formed on the target layer 102 at the peripheral area of the substrate 100.

A mask layer (not illustrated) may be formed on the target layer 102 to thereby cover the space patterns 106 and the first to third sacrificial mask patterns 104a, 104b, 104c. For example, the mask layer may be formed on the target layer 102 by a spin coating process.

The mask layer may be patterned by a photolithography process to thereby form the first mask pattern 110a and a second mask pattern 110b at the cell area and the peripheral area of the substrate 100, respectively. The first mask pattern 110a may function as an etching mask for forming the first and the second lines 114a, 114b for the cell line structure and the second mask pattern 110b may function as an etching mask for forming the peripheral line structure.

In the present exemplary embodiment, the first mask pattern 110a may be substantially the same as the mask pattern illustrated in FIG. 2C and the peripheral line structure or the peripheral linear pad may be engraved into the second mask pattern 110b.

Referring to FIGS. 18B and 19B, the first to third sacrificial mask patterns 104a, 104b, 104c may be removed from the target layer 102 without any removal of the first and the second mask patterns 110a, 110b. Thus, the first mask pattern 110a may remain in the first region of the cell area and the second mask pattern 110b may remain on the peripheral area of the substrate 100. The sacrificial mask patterns 104a, 104b, 104c under the first mask pattern 110a may still remain on the target layer 102 due to the coverage of the first mask pattern 110a at the cell area of the substrate 100.

Thereafter, the processing steps described in detail with reference to FIGS. 2E and 2F may be performed on the substrate 100 on which the spacer lines 106 and the first and the second mask patterns 110a, 110b may be arranged, to thereby form a pattern structure including the cell line structure at the cell area and the peripheral line structure at the peripheral area as illustrated in FIG. 18C.

Referring to FIGS. 18C and 19C, the first to third lines 114a, 114b, 114c may be formed on the cell area of the substrate 100 as the cell line structure and a peripheral line or a peripheral linear pad 114d may be formed on the peripheral area of the substrate 100. The peripheral line 114d may have a width larger than those of the first to third lines 114a, 114b, 114c of the cell line structure.

According to the present exemplary embodiment, the peripheral line pattern structure having a relatively large width may be formed on the peripheral area simultaneously with the cell line structure having a relatively small width in the same process.

Particularly, the first mask pattern 110a and the second mask pattern 110b may be simultaneously formed on the cell area and the peripheral area of the substrate 100, respectively, and thus the peripheral line pattern structure 114d and the cell line structure including the first to third lines 114a, 114b, 114c may be formed on the substrate 100 simultaneously with one another. The processing steps disclosed in the above second to fifth embodiments may also be applied to the present simultaneous formation of the cell line structure and the peripheral line structure.

Figure 20A:
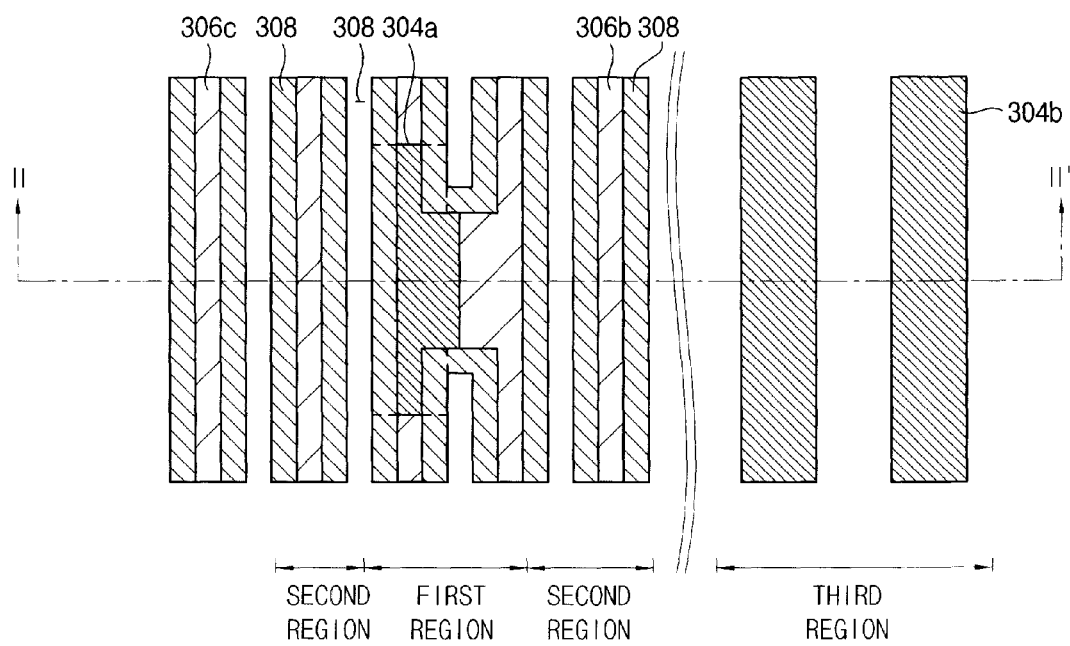
FIGS. 20A, 20B and 20C are plan views illustrating another processing steps for a method of the line structure in accordance with the third exemplary embodiment of the present inventive concept.
Figure 20B:
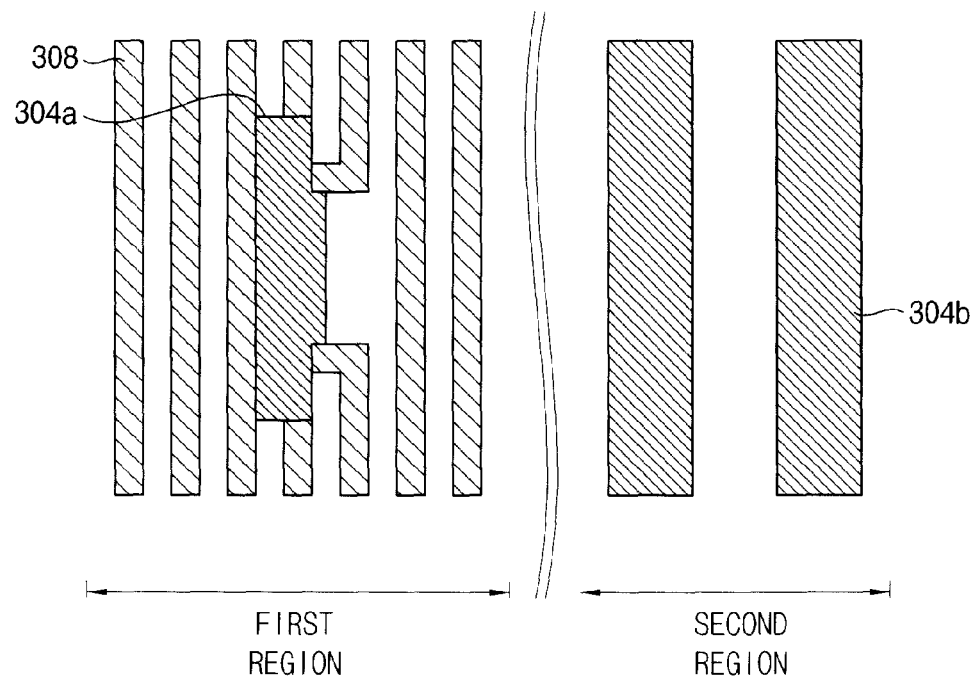
Figure 20C:
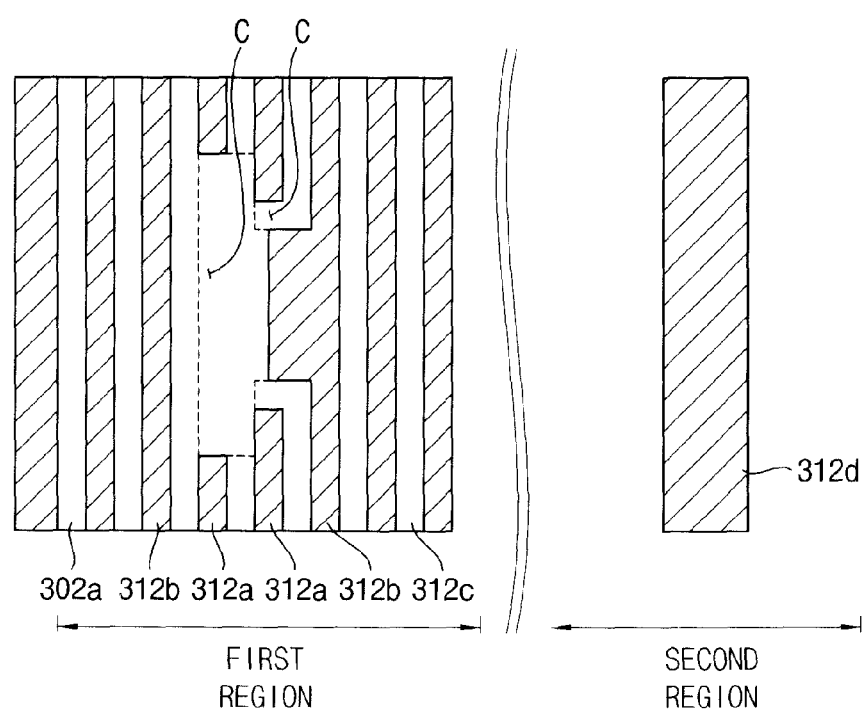
Figure 21A:
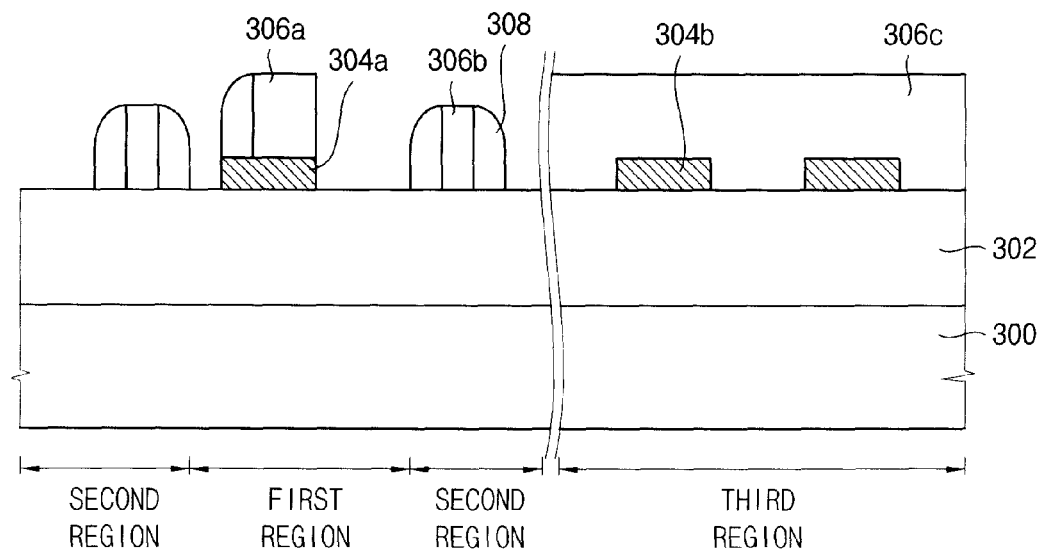
FIGS. 21A, 21B and 21C are cross-sectional views illustrating the processing steps corresponding to the FIGS. 20A, 20B and 20C, respectively.
Figure 21B:
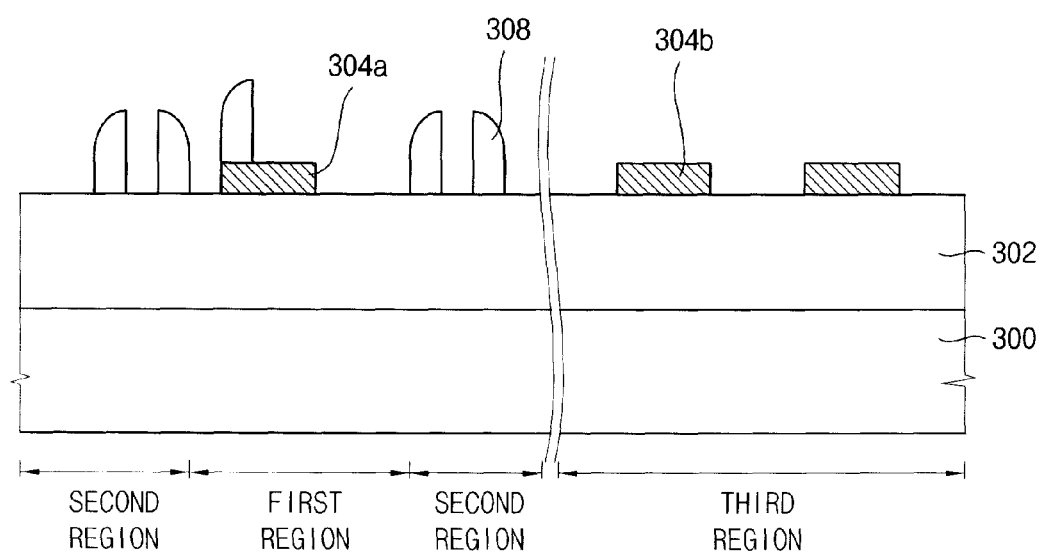
Figure 21C:
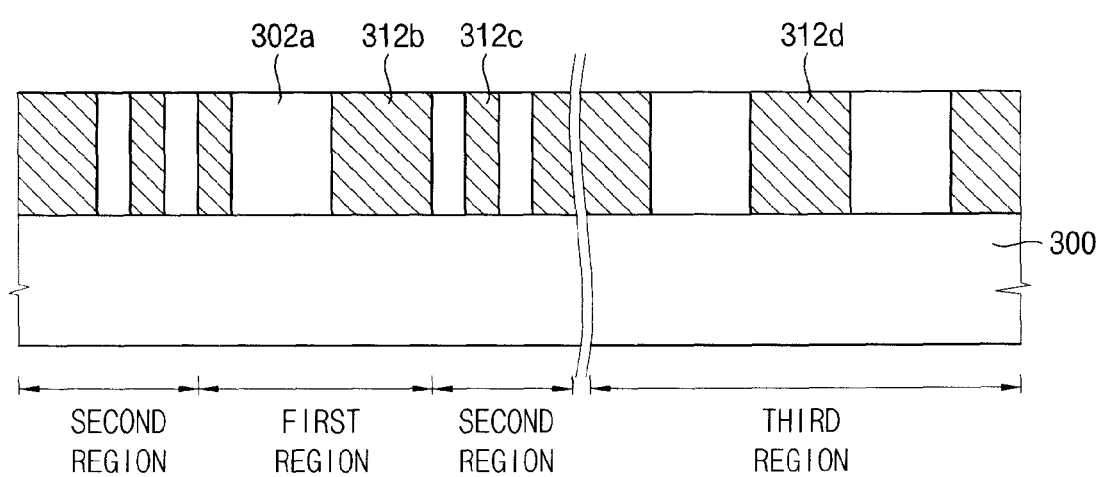

FIGS. 20A to 20C are plan views illustrating exemplary processing steps for a method of the line structure in accordance with the third exemplary embodiment of the present inventive concept and FIGS. 21A to 21C are cross-sectional views illustrating the processing steps corresponding to the FIGS. 20A to 20C, respectively. FIGS. 21A to 21C are cross-sectional views taken along a line II-II' of FIG. 20A.

The pattern structure in FIG. 20C may include a pair of cut-off portions and may be formed by the same processing steps as described in detail with reference to FIGS. 11A to 11F, except that a peripheral line pattern structure or a peripheral linear pad may be formed at the peripheral area of the substrate simultaneously with the cell line structure. In FIGS. 20A to 21C, the same reference numerals denote the same elements in FIGS. 11A to 11F and the detailed descriptions on the same elements will be omitted.

Referring to FIGS. 20A and 21A, the substrate 300 may be prepared and the first region, the second region and a third region may be defined on the substrate 300. For example, the first and the second regions of the substrate 300 may correspond to a cell area of a semiconductor device and the third region of the substrate 300 may correspond to a peripheral area of the semiconductor device. The first lines 312a in FIG. 20C having cut-off portions C and a pair of the second lines 312b in FIG. 20C adjacent to the first lines 312a may be arranged in the first region of the substrate 300 and a plurality of the third lines 312c in FIG. 20C may be arranged in a line-and-space structure in the second region of the substrate 300 in accordance with the following processing steps. The peripheral line structure 312d in FIG. 20C may be arranged on the peripheral area of the substrate 300.

The target layer 302 may be formed on the substrate 300. A first preliminary hard mask pattern (not illustrated) may be formed on the target layer 302 at the cell area of the substrate 300 by the same process as described in detail with reference to FIG. 11A. A second hard mask pattern 304b may be formed on the target layer 302 at the peripheral area of the substrate 300 in such a manner that the peripheral line structure may be engraved into the second hard mask pattern 304b. That is, the second hard mask pattern 304b may be formed at a portion of the peripheral area on which the peripheral line structure may not be arranged.

A sacrificial mask layer (not illustrated) may be formed on the whole target layer 102 to cover the first preliminary hard mask pattern and the second hard mask pattern 304b. Then, the sacrificial mask layer may be patterned by a photolithography process to thereby form the first and the second sacrificial mask patterns 306a, 306b at the cell area of the substrate 300 and to form a third sacrificial mask pattern 306c covering a whole surface of the peripheral area of the substrate 300. The first and the second sacrificial mask patterns 306a, 306b may be formed on the target layer 302 at the cell area by the same process as described with reference to FIG. 11B.

A spacer layer (not illustrated) may be formed on the first to third sacrificial mask patterns 306a, 306b, 306c and the target layer 302 and then an anisotropic etching process may be performed on the spacer layer, thereby form the spacer lines 308 on the sidewalls of the first and the second sacrificial mask patterns 306a, 306b. Therefore, the first preliminary hard mask pattern may be exposed through the spacer lines 308 at the cell area of the substrate 300. In contrast, the spacer layer on the peripheral area of the substrate 300 may be sufficiently removed from the substrate 300 by the anisotropic etching process, and the second hard mask pattern 304b may be exposed to surroundings.

Thereafter, the first preliminary hard mask pattern exposed through the spacer lines 308 may be removed from the substrate 300, to thereby form the first hard mask pattern 304a.

Referring to FIGS. 20B and 21B, the first to third sacrificial mask patterns 306a to 306c may be removed from the target layer 302. Thus, the first mask pattern 304a and the spacer lines 308 may remain in the first region of the cell area and the second mask pattern 304b may remain on the peripheral area of the substrate 300.

Thereafter, the processing steps described in detail with reference to FIGS. 11E and 11F may be performed on the substrate 300 on which the spacer lines 308 and the first and the second mask patterns 304a, 304b may be arranged, to thereby form a pattern structure including the cell line structure 312a, 312b, 312c at the cell area and the peripheral line structure 312d at the peripheral area as illustrated in FIG. 20C.

Referring to FIGS. 20C and 21C, the first to third lines 312a, 312b, 312c may be formed on the cell area of the substrate 300 as the cell line structure and a peripheral line or a peripheral linear pad 312d may be formed on the peripheral area of the substrate 300. The peripheral line 312d may have a width larger than those of the first to third lines 312a to 312c of the cell line structure.

According to the present exemplary embodiment, the peripheral line structure 312d having a relatively large width may be formed on the peripheral area simultaneously with the cell line structure 312a, 312b, 312c having a relatively small width in the same process.

Particularly, the first mask pattern 304a and the second mask pattern 304b may be simultaneously formed on the cell area and the peripheral area of the substrate 300, respectively, and thus the peripheral line pattern structure 312d and the cell line structure including the first to third lines 312a, 312b, 312c may be formed on the substrate 300 simultaneously with one another. The processing steps disclosed in the above seventh to ninth embodiments may also be applied to the present simultaneous formation of the cell line structure and the peripheral line structure.

The pattern structure disclosed in the above exemplary embodiments may be applied to a wiring line and a device isolation pattern for a semiconductor device. Particularly, the exemplary embodiments of the pattern structures may be used for bit line for a flash memory device. In such a case, the first line having the cut-off portion C may be used as a bit line that may be extended to a page buffer of the flash memory. Hereinafter, the processing steps for a method of manufacturing the flash memory device will be described in more detail.

Embodiment IV

Figure 22:
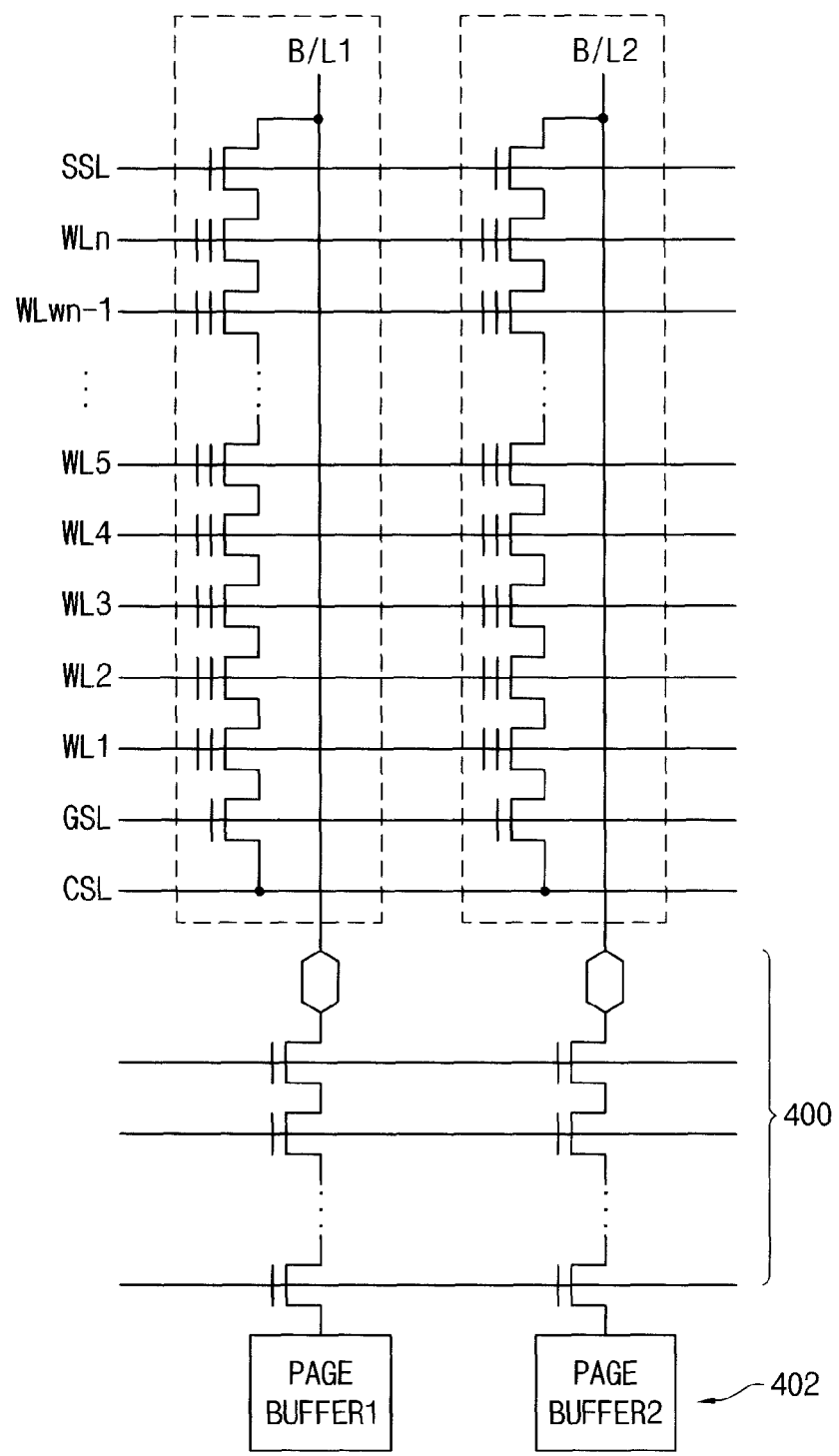
FIG. 22 is a circuit diagram of a flash memory device including the line having the cut-off portion in accordance with a fourth exemplary embodiment of the present inventive concept.
Figure 23:
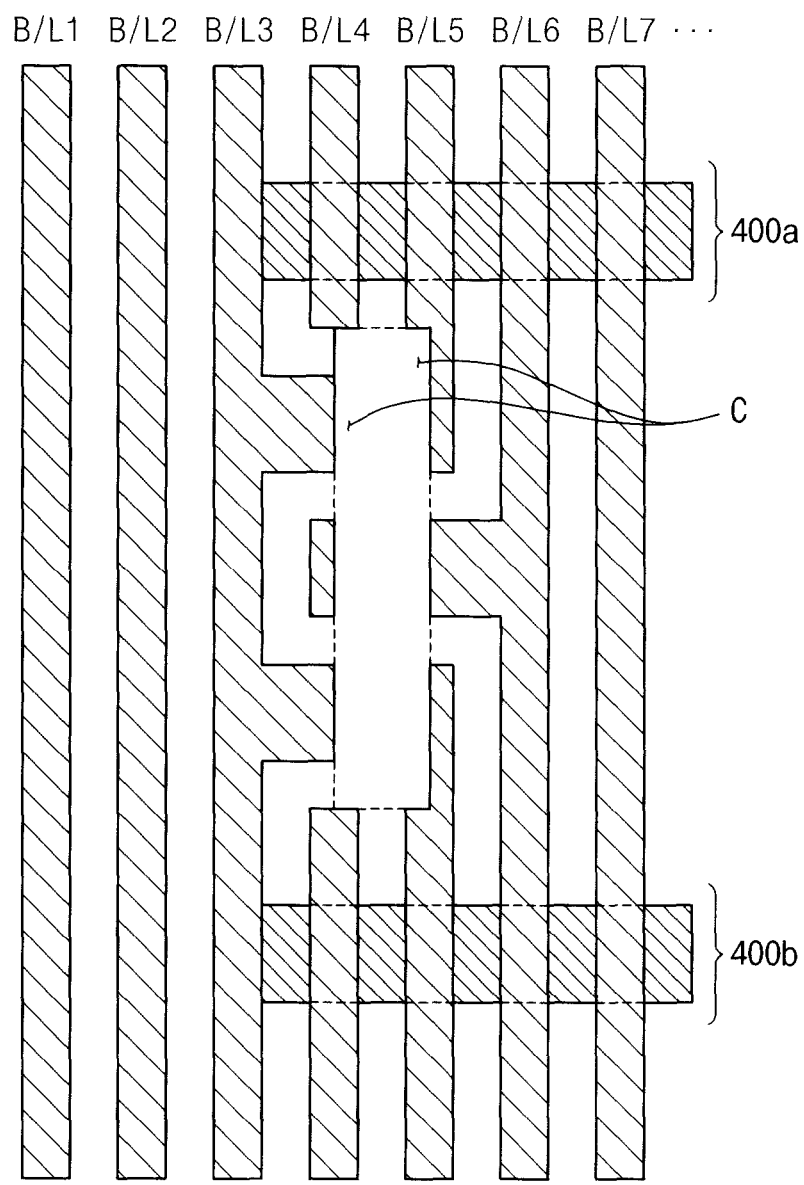
FIG. 23 is a layout of an end portion of a bit line in the flash memory device illustrated in FIG. 22.

FIG. 22 is a circuit diagram of a flash memory device including the line having the cut-off portion in accordance with a fourth exemplary embodiment of the present inventive concept. FIG. 23 is a layout of an end portion of a bit line in the flash memory device illustrated in FIG. 22. FIGS. 24A to 24E are cross-sectional views illustrating processing steps for a method of manufacturing the flash memory device illustrated in FIG. 22.

Referring to FIGS. 22 and 23, the flash memory device according to the present exemplary embodiment may include a semiconductor substrate 500 having at least one cell area and at least one peripheral circuit area. Further, the substrate may be divided into an active region on which at least a conductive structure may be arranged and a field region defining the active region. In the present exemplary embodiment, the active region may extend in a first direction and the field regions and the active regions may be alternately arranged in a second direction substantially perpendicular to the first direction. A plurality of transistors on each active region may be electrically connected with one another in series along the second direction, to thereby form a cell string in the flash memory device. Particularly, the cell string may include a single string selection transistor (SST), a single ground selection transistor (GST) and a plurality of cell transistors interposed between the SST and the GST. A plurality of the cell strings may be arranged in the first direction, to thereby form a memory block of the flash memory device. The flash memory device may further include a plurality of word lines WL1, . . . , WLn and a plurality of bit lines B/L1, B/L2, . . . , B/Ln that may be electrically connected to the transistors, a string selection line (SSL) electrically connected to the SST, a ground selection line (GSL) electrically connected to the GST and a common source line (CSL). In the present exemplary embodiment, the word lines may be substantially perpendicular to the bit lines.

Each of the bit lines may be connected to a respective page buffer 402 through a voltage controller 400 and may include at least a cut-off portion in the voltage controller 400. Particularly, each of the bit lines may be shaped into a line and thus the bit lines may be arranged in the line-and-space configuration. That is, the bit lines may be arranged on the substrate in such a manner that the line-shaped patterns may be spaced apart by the same gap distance. The bit lines may have the cut-off portion C around high voltage transistors 400a and 400b of the voltage controller 400. The bit line B/L1, . . . , B/Ln may be connected to impurity regions of the high voltage transistors 400a, 400b at the voltage controller 400 and then may extend to the respective page buffer 402. The cut-off portions C may be arranged at different positions at every bit line with different shapes.

A peripheral line structure (not illustrated) may be arranged on the peripheral circuit area of the substrate.

As shown in FIG. 23, fourth and fifth bit lines B/L4, B/L5 may have the cut-off portion C and the other bit lines B/L1, . . . , B/Ln may have no cut-off portions, and thus the fourth and fifth bit lines B/L4, B/L5 may have the same shape as the first line in Embodiment I. In addition, the third and the sixth bit lines B/L3, B/L6 may include the same line body and protrusion portion as the second line in Embodiment I. The rest of the bit lines may be shaped into a continuous line without the cut-off portion and may have the same structure as the third line in Embodiment I.

Hereinafter, the processing processes for a method of manufacturing the flash memory device shown in FIG. 22 will be described in more detail with reference to FIGS. 24A to 24E.

FIGS. 24A to 24E are cross-sectional views illustrating the processing steps for a method of manufacturing the flash memory device shown in FIG. 22.

Figure 24A:
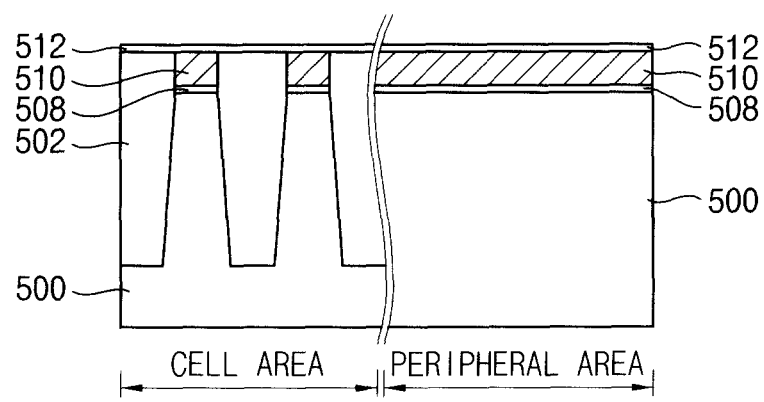
FIGS. 24A, 24B, 24C, 24D and 24E are cross-sectional views illustrating the processing steps for a method of manufacturing the flash memory device shown in FIG. 22.

Referring to FIG. 24A, a device isolation pattern 502 may be formed on the field region of the substrate 500 by a device isolation process such as a shallow trench isolation (STI) process. The device isolation pattern 502 may be formed into a line extending in the first direction and a plurality of the line-shaped device isolation patterns 502 may be repeatedly formed on the substrate 500 in the second direction perpendicular to the first direction.

A tunnel insulation layer 508, an electron holder pattern 510 and a blocking dielectric layer 512 may be formed on the substrate 500. For example, the tunnel insulation layer 508 may comprise silicon oxide, silicon oxynitride and metal oxide, etc. These may be used alone or in combinations thereof. Electron charges may be trapped in or floated from the electron holder pattern 510. The electron holder pattern 510 may comprise an insulation material having high trap density of the electrons. Examples of the insulation material for the electron holder pattern 510 may include silicon nitride, silicon oxide, hafnium oxide, zirconium oxide, tantalum oxide, hafnium aluminum oxide, hafnium silicon oxide, lanthanum hafnium oxide, lanthanum aluminum oxide, hafnium oxynitride, zirconium oxynitride, hafnium silicon oxynitride, hafnium aluminum oxynitride, etc. These may be used alone or in combinations thereof. Alternatively, the electron holder pattern 510 may comprise an insulation material such as nano-crystal and quantum dot. Otherwise, the electron holder pattern 510 may comprise polysilicon.

The blocking dielectric layer 512 may comprise a material having high dielectric constant such as aluminum oxide, lanthanium hafnium oxide, lanthanum aluminum oxide and dysprosium scandium oxide. Alternatively, the blocking dialectic layer 512 may include a multilayer in which an oxide layer, a nitride layer and an oxide layer may be sequentially stacked.

Figure 24B:
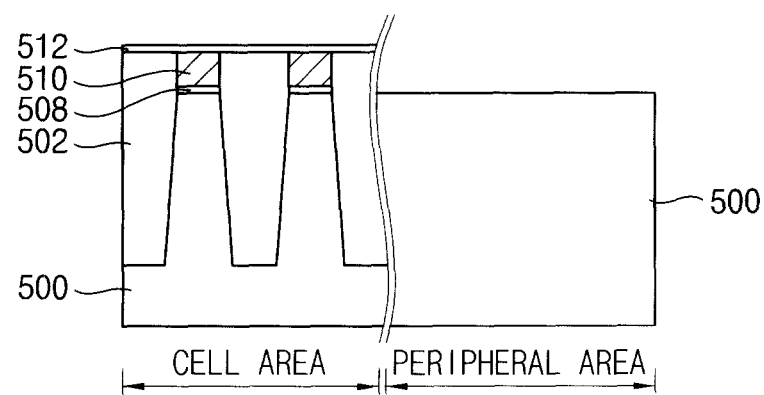

Referring to FIG. 24B, a first mask layer (not illustrated) may be formed of the substrate 500 in such a manner that the cell area of the substrate 500 may be covered with the first mask layer and the peripheral area of the substrate 500 may be exposed. Thus, the blocking dielectric layer 512, the electron holding pattern 510 and the tunnel insulation layer 508 may be removed from the peripheral area of the substrate 500 while still remaining on the cell area of the substrate 500 due to the coverage of the first mask layer.

Figure 24C:
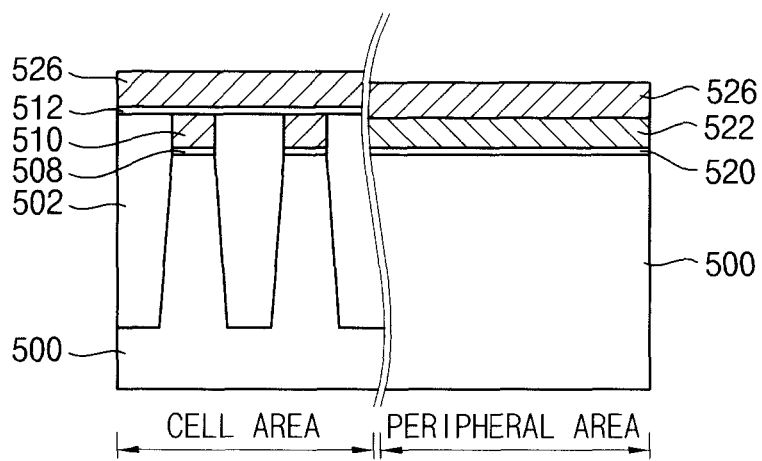

Referring to FIG. 24C, a gate insulation layer 520 and a first conductive layer 522 may be formed on the substrate 500 across the cell area and the peripheral area. Then, the gate insulation layer 520 and the first conductive layer 522 may be removed from the cell area of the substrate 500 and thus may remain merely on the peripheral area of the substrate 500.

A second conductive layer 526 may be formed on the substrate 500 across the cell area and the peripheral area, and thus the second conductive layer 526 may be formed on the blocking dielectric layer 512 at the cell area and may be formed on the first conductive layer 522 at the peripheral area.

Figure 24D:
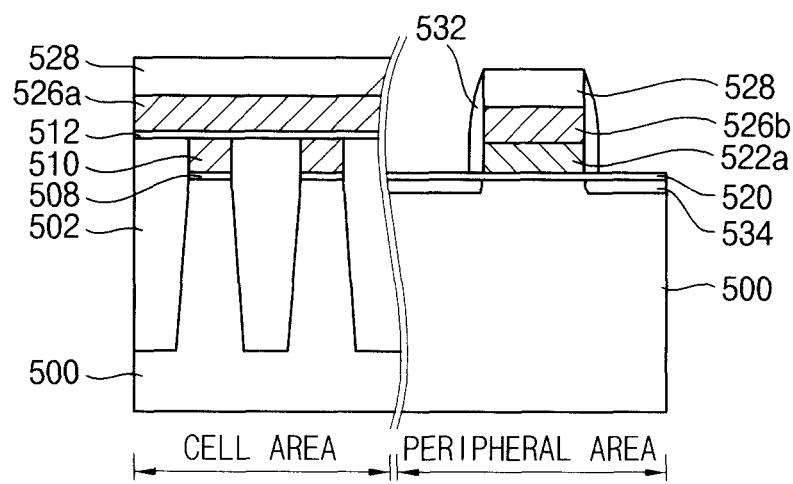

Referring to FIG. 24D, a second mask pattern 528 may be formed on the second conductive layer 526. The second mask pattern 528 may be formed into a line extending in a second direction substantially perpendicular to the first direction.

The second conductive layer 526 may be patterned by an etching process using the second mask pattern 528 as an etching mask, thereby forming a second cell conducive pattern 526a and a second peripheral conductive pattern 526b at the cell area and the peripheral area of the substrate 500, respectively. Particularly, the first conductive layer 522 may be formed into a first peripheral conductive pattern 522a underlying the second peripheral conductive pattern 526b at the peripheral area of the substrate 500. Then, a spacer 532 may be formed on sidewalls of the first and the second peripheral conductive patterns 522a, 526b at the peripheral areas of the substrate 500. Impurities may be implanted onto surface portions of the peripheral area of substrate 500 by an ion implantation process using the spacer 532 as an ion implantation mask, to thereby form source and drain regions 534 around the stack structure of the first and the second peripheral conductive patterns 522a, 526b.

As a result, the tunnel insulation layer 508, the electron holding pattern 510, the blocking dielectric layer 512 and the second cell conductive pattern 526a may be stacked on the cell area of the substrate 500, thereby forming a unit cell gate structure of the flash memory. In contrast, the gate insulation layer 520, the first peripheral conductive pattern 522a and the second peripheral conductive pattern 526b may be stacked on the peripheral area of the substrate 500, thereby forming a peripheral gate structure of the flash memory device.

Figure 24E:
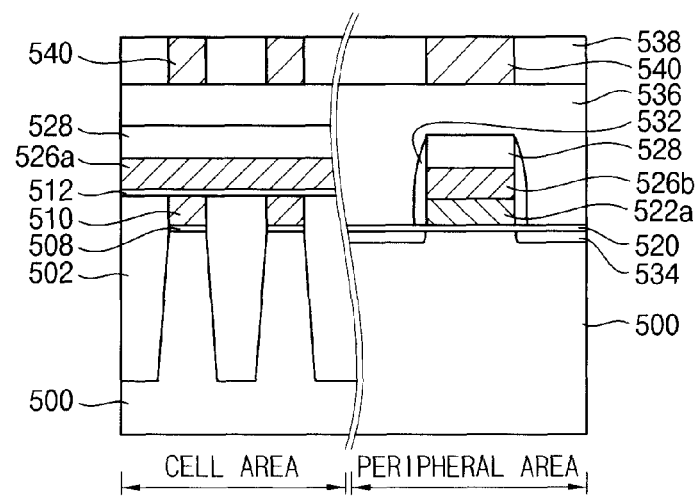

Referring to FIG. 24E, a first insulation interlayer 536 may be formed on the substrate 500 across the cell area and the peripheral area, and thus the unit cell gate structure and the peripheral gate structure may be covered with the first insulation interlayer 536. The second mask pattern 528 may be optionally removed from or remain on the second conductive pattern 526a, 526b. The first insulation interlayer 536 may be partially removed from the substrate 500, thereby forming a contact hole through which the active region of the substrate 500 may be exposed. Conductive materials may be filled into the contact hole to thereby form a contact plug in the contact hole.

A second insulation interlayer 538 may be formed on the first insulation interlayer 536 having the contact plug. In the present exemplary embodiment, the second insulation interlayer 538 may function as the target layer in Embodiment I to Embodiment XII.

Thereafter, the cell line structure including the first to third lines and the peripheral line structure may be formed on the cell and peripheral areas of the substrate 500, respectively, to thereby form the pattern structure 540 for the flash memory device. The pattern structure 540 may comprise a conductive material such as copper (Cu). That is, a plurality of line shaped trench may be formed on the second insulation interlayer 538, which may function as the target layer in the above exemplary embodiments, and the trench may be filled up with the conductive material, thus interconnections may be formed through the second insulation interlayer 538 in the flash memory device.

Figure 25:
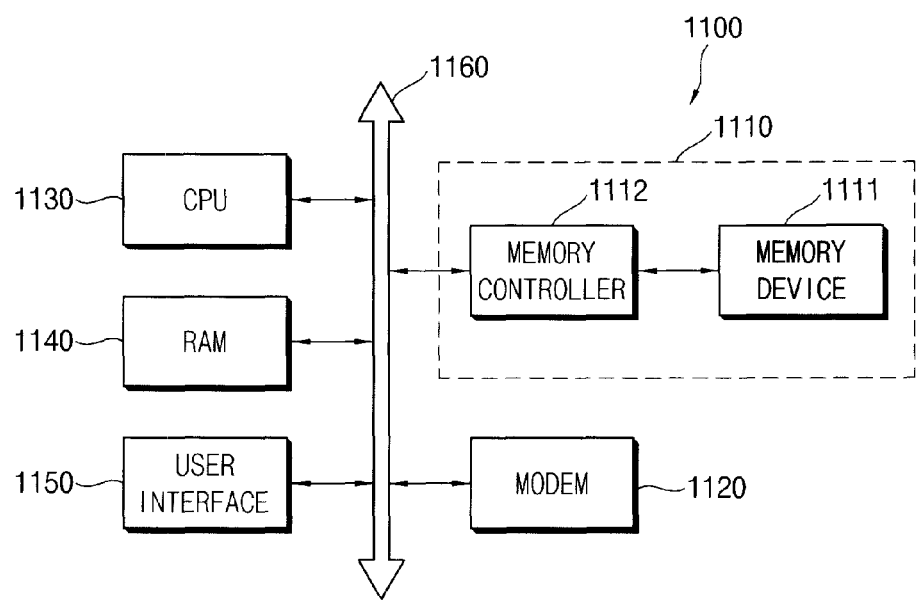
FIG. 25 is a block diagram showing an information processing system in accordance with an exemplary embodiment of the present inventive concept.

FIG. 25 is a block diagram showing an information processing system in accordance with an exemplary embodiment of the present inventive concept.

Referring to FIG. 25, the information processing system 1100 in accordance with an exemplary embodiment of the present inventive concept may include a memory device 1111 having the pattern structure that may be disclosed in Embodiments I to VII. The memory device 1111 may be formed into a main memory system 1110 together with a memory controller 1112 in the information processing system 1100. For example, the memory device 1111 may include the flash memory device shown in FIGS. 22 and 23.

For example, the information processing system 1100 may include the main memory system 1110, a MODEM 1120 electrically connected to a system bus line 1160, a central processing unit (CPU) 1130, a subsidiary memory unit 1140 such as a RAM and a user interface system 1150. Processed data processed by the CPU and input data transferred from external devices may be stored into the main memory system 1110. In case that a solid state disk (SSD) may be used as the main memory system 1110, a large amount of the data may be stored into the main memory system 1110, to thereby facilitating the process of the large amount of data such as a large volume data stream in the main memory system 1110. The pattern structure having the cut-off portion may sufficiently increase operation reliability of the main memory system 1110 and thus the main memory system 1110 may require no additional elements or parts for correcting operational errors, which may sufficiently reduce the maintenance cost of the information processing system 1100.

Although not shown in figures, the information processing system may further include various application chipsets, camera image processors (CIS), mobile DRAMs and input/output devices.

According to the exemplary embodiments of the present inventive concept, the pattern structure may include at least a discontinuous line having a cut-off portion. The pattern structure may be used as signal line such as a bit line and a word line for a semiconductor device. In addition, the pattern structure may also be used as a device isolation pattern for a semiconductor device. Thus, the semiconductor device using the pattern structure may improve the operation reliability with high integration degree.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the present invention. Accordingly, the exemplary embodiments described herein, and other exemplary embodiments, and all such modifications to the exemplary embodiments are intended to be included within the scope of the present invention as defined in the following claims.

What is claimed is:

1. A method of forming a pattern structure for a semiconductor device, comprising:

forming a sacrificial mask pattern on a target layer formed on a substrate, the sacrificial mask pattern including a first line-shaped pattern extending in a first direction, a second pattern having a sacrificial pattern body spaced apart from and parallel with the first line-shaped pattern and at least a connection portion connected to the first line-shaped pattern in a second direction and a third pattern spaced apart from and parallel with the first line-shaped pattern and the second pattern;

forming a spacer line on sidewalls of the first line-shaped pattern, the second pattern and the third pattern to provide spacer spaces that extend in the first direction between the spacer lines and through which the target layer is partially exposed;

forming a mask pattern covering at least a portion of the connection portion of the second pattern;

removing the sacrificial mask pattern from the target layer, such that the spacer lines and the mask pattern remain on the target layer;

partially etching the target layer using the spacer line and the mask pattern as an etching mask to form a first line-shaped opening that continuously extends in the first direction and a second line-shaped opening that is separated discontinuous in the second direction; and forming a first line and a second line by filling the first line-shaped opening and the second line-shaped opening, the first line extending discontinuously in the first direction and having at least a cut-off portion and the second line extending continuously in the first direction adjacent to the first line and having at least a protrusion portion directed to the cut-off portion.

2. The method of claim 1, wherein the sacrificial pattern body extends discontinuously in the first direction to have a pair of end portions, and the connection portion is formed into a pair of horizontal bars connecting the end portions with the first pattern, respectively, such that the first pattern and the second pattern are connected to each other as a shape of Greek letter 'π.'

3. The method of claim 2, wherein the spacer spaces includes a first spacer space between the first pattern and the second pattern, a second spacer space between the second pattern and the third pattern and a third spacer space between the first pattern and the third pattern, and the first spacer space is separated by the connection portion of the second pattern and forms a separated space defined by the first pattern and the pair of the horizontal bars and connected to the second spacer space.

4. The method of claim 3, wherein the mask pattern is formed into a line extending in the first direction such that the connection portion and the mask pattern cross each other.

5. The method of claim 4, wherein the line-shaped mask pattern has a width of 2F, F being a minimal marginal resolution of photolithography process, and covers the spacer of the first spacer space such that the mask pattern is located at a position extending from a first position to a second position, the mask pattern being aligned with the first pattern to cover the first pattern at the first position and being aligned with the second pattern to cover the second pattern at the second position.

6. The method of claim 5, wherein the sacrificial mask pattern, the spacer lines and the spacer spaces have a width of F, and the mask pattern is formed with an alignment margin of 1.5F.

7. The method of claim 5, wherein the first line is formed into a pair of separated lines corresponding to the separated first spacer space and the sacrificial pattern body, respectively, and the second line is formed into a pair of continuous lines at a left side and a right side of the first line, respectively.

8. The method of claim 7, wherein the second line is formed on the substrate such that one of the pair of the continuous lines includes a first line body extending in the first direction and a pair of first protrusion portions protruding from the first line body toward the cut-off portion of the first line according to the pair of the horizontal bars and a rest of the pair of the continuous lines includes a second line body extending in the first direction and a second protrusion portion protruding from the second line body toward the cut-off portion of the first line according to the separated space when the mask pattern is located between the first position and the second position.

9. The method of claim 7, wherein one of the pair of the continuous lines extends in the first direction without the protrusion portion and a rest of the pair of the continuous lines is formed to have a line body extending in the first direction and a protrusion portion that protrudes from the line body toward the cut-off portion of the first line corresponding to the separated space, and one of the separated lines is bent over toward the cut-off portion of a rest of the pair of the separated lines to form a bending portion extending in the second direction and parallel with the protrusion portion when the mask pattern is located at the first position.

10. The method of claim 1, wherein the sacrificial pattern body is formed into a line continuously extending in the first direction and the connection portion is formed into a single horizontal bar connected to the first pattern along the second direction, such that the first pattern and the second pattern are shaped into a capital letter 'H.'

11. The method of claim 10, wherein the spacer spaces include a first spacer space between the first pattern and the second pattern, a second spacer space between the second pattern and the third pattern and a third spacer space between the first pattern and the third pattern, and the mask pattern is formed into a line having a width of 1F and extending in the first direction such that the mask pattern partially covers the spacer in the first spacer and crosses the connection portion of the second pattern.

12. The method of claim 11, wherein the sacrificial mask pattern, the spacer lines and the spacer spaces have a width of F, and the mask pattern is formed with an alignment margin of 1.0F.

13. The method of claim 12, wherein the first line is formed into a single separated line corresponding to the first spacer space that is separated by the connection portion and the second line is formed into a pair of continuous lines at the left side and the right side of the first line, each of the continuous lines including a line body extending in the first direction and a protrusion portion protruding from the line body toward the cut-off portion of the first line corresponding to the connection portion.

14. The method of claim 10, wherein the second pattern further includes a supplementary pattern symmetrical to the first pattern with respect to the sacrificial pattern body and a supplementary horizontal bar symmetrical to the horizontal bar with respect to the sacrificial pattern body and is connected with the sacrificial pattern body and the supplementary pattern, such that the first and the second patterns are shaped into a double capital letter 'H' in which two capital letters 'H' are contact with each other.

15. The method of claim 14, wherein the spacer spaces includes a first spacer space between the first and the sacrificial pattern body, a supplementary spacer space between the sacrificial pattern body and the supplementary pattern, a second spacer space between the second pattern and the third pattern and a third spacer space between the first pattern and the third pattern, and the mask pattern is formed into a line having a width of 4F such that the mask pattern covers the sacrificial pattern body and crosses at least one of the horizontal bar and the supplementary horizontal bar.

16. The method of claim 15, wherein the first line is formed into triple lines each of which corresponds to the first spacer space separated by the horizontal bar, the supplementary space separated by the supplementary horizontal bar and the sacrificial pattern body separated by the mask pattern, respectively, and the second line is formed into a pair of continuously lines at left and right sides of the first line, the continuous line including a line body extending in the first direction and a protrusion portion that selectively protrudes from the line body corresponding to one of the horizontal bar and the supplementary horizontal bar in accordance with the position of the mask pattern and extends toward the cut-off portion of the first line.

17. A method of forming a pattern structure for a semiconductor device, comprising:

forming a sacrificial mask pattern on a target layer formed on a substrate, the sacrificial mask pattern including at least a first line-shaped pattern discontinuously extending in a first direction to have a discontinuous portion therein and a plurality of second line-shaped patterns in parallel with the first line-shaped pattern and continuously extending in the first direction;

forming a spacer line on sidewalls of the first line-shaped pattern and the second pattern to provide spacer spaces that extend in the first direction between the spacer lines and through which the target layer is partially exposed, and a connection spacer interfacing with the spacer spaces around the first line-shaped pattern;

forming a mask pattern covering at least a portion of the connection space;

removing the sacrificial mask pattern from the target layer, such that the spacer lines and the mask pattern remain on the target layer;

partially etching the target layer using the spacer line and the mask pattern as an etching mask, thereby forming a first line-shaped opening that continuously extends in the first direction and a second line-shaped opening that is separated discontinuous in the second direction; and forming a first line and a second line by filling the first and second openings, the first line extending discontinuously in the first direction and having at least a cut-off portion and the second line extending continuously in the first direction adjacent to the first line and having at least a protrusion portion directed toward the cut-off portion.

18. The method of claim 17, wherein:
the spacer spaces includes:
   a first spacer space that is provided between the first line-shaped pattern and the second pattern and interfacing with the connection space, and
   a plurality second spacer spaces between the second patterns, and
the mask pattern is formed into a line having a width of 1F such that the mask pattern crosses the connection space along the first direction with an alignment margin of 1.0F.

19. A method of forming a pattern structure for a semiconductor device, comprising:
forming a preliminary mask pattern on a target layer on a substrate;
forming a sacrificial mask pattern on the target layer and the preliminary mask pattern, the sacrificial mask pattern including a pair of sacrificial pattern bodies spaced apart from each other and shaped into a line extending in a first direction and a connection portion connecting the sacrificial pattern bodies therebetween in a second direction and crossing the preliminary mask pattern;

simultaneously forming spacer lines on sidewalls of a first pattern and a second pattern corresponding to the pair of sacrificial pattern bodies and a mask pattern under the first pattern by a self-aligned process to provide spacer spaces that extend in the first direction between the spacer lines and through which the target layer is partially exposed;

removing the sacrificial mask pattern from the target layer and the mask pattern, such that the target layer and the mask pattern are partially exposed through the spacer spaces between the spacer lines;

partially etching the target layer using the spacer lines and the mask pattern as an etching mask to form a first line-shaped opening that extends in the first direction and a second line-shaped opening that extends in the second direction; and forming a first line and a second line by filling the first line-shaped opening and the second line-shaped opening, the first line extending in the first direction and having at least a cut-off portion and the second line extending in the first direction adjacent to the first line and having at least a protrusion portion directed toward the cut-off portion.

20. A method of forming the pattern structure for a semiconductor device line having a cut-off portion, the method comprising:
defining a first line and a second line to be formed on a substrate, the first line having a cut-off portion;
forming first and the second sacrificial mask patterns as respective molds for the first line and the second line, the first and second sacrificial mask patterns being connected by a bridge connection portion; and
forming a mask pattern and positioning the mask pattern across the bridge connection portion such that the cut-off portion corresponds with the position and shape of the mask pattern.

* * * * *